(12) United States Patent
Suzuki et al.

(10) Patent No.: US 7,956,462 B2
(45) Date of Patent: Jun. 7, 2011

(54) SEMICONDUCTOR DEVICE AND MANUFACTURING METHOD THEREOF

(75) Inventors: Takashi Suzuki, Kawasaki (JP); Kiyoshi Ozawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 559 days.

(21) Appl. No.: 12/031,836

(22) Filed: Feb. 15, 2008

(65) Prior Publication Data

US 2008/0169542 A1 Jul. 17, 2008

Related U.S. Application Data

(63) Continuation of application No. PCT/JP2005/014999, filed on Aug. 17, 2005.

(51) Int. Cl.
*H01L 23/532* (2006.01)

(52) U.S. Cl. ........ 257/750; 257/774; 257/736; 257/762; 257/684; 257/E23.167

(58) Field of Classification Search ............ 257/750, 257/774, 736, 762, 684, E23.167, 758, 781
See application file for complete search history.

(56) References Cited

U.S. PATENT DOCUMENTS

| 6,486,557 B1 | 11/2002 | Davis et al. |
| 6,958,542 B2 | 10/2005 | Hasunuma et al. |
| 2002/0009888 A1 | 1/2002 | Mizumura |
| 2002/0013046 A1 | 1/2002 | Koganei |
| 2003/0109128 A1 | 6/2003 | Koganei |
| 2004/0113238 A1* | 6/2004 | Hasunuma et al. ........... 257/636 |
| 2005/0054188 A1 | 3/2005 | Matsuura et al. |

FOREIGN PATENT DOCUMENTS

| CN | 1595621 A | 3/2005 |
| JP | 2001-67963 A | 3/2001 |
| JP | 2001-284454 A | 10/2001 |
| JP | 2002-9152 A | 1/2002 |
| JP | 2002-30249 A | 1/2002 |
| JP | 2002-33318 A | 1/2002 |
| JP | 2004-119969 A | 4/2004 |
| JP | 2005-85939 A | 3/2005 |

OTHER PUBLICATIONS

International Search Report of PCT/JP2005/014999, date of mailing Nov. 15, 2005.

* cited by examiner

*Primary Examiner* — Cuong Q Nguyen
*Assistant Examiner* — Trang Q Tran
(74) *Attorney, Agent, or Firm* — Westerman, Hattori, Daniels & Adrian, LLP

(57) ABSTRACT

A semiconductor device having a multilayer wiring structure and a manufacturing method thereof are provided. A semiconductor device and a manufacturing method thereof are provided in which the reliability and the manufacturing yield are high and the design constraint is small. Wirings are formed on a substrate. Low dielectric constant films are formed around the wirings. Reinforcement insulating films are formed in a dielectric material of a larger elastic modulus than that of a formation material of the low dielectric constant films and are arranged to overlap with the wirings when viewed perpendicularly to a substrate surface. Reinforcement insulating films are arranged to intersect with the wirings.

10 Claims, 53 Drawing Sheets

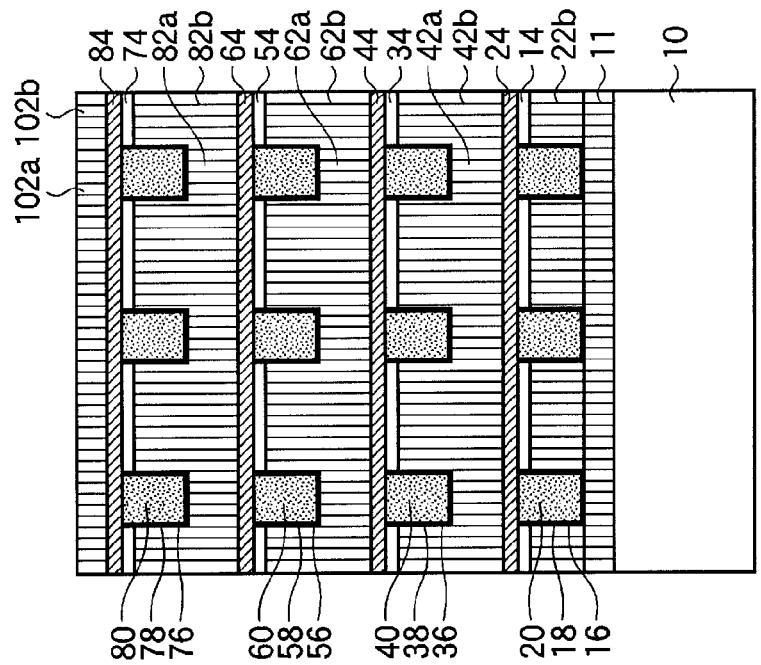
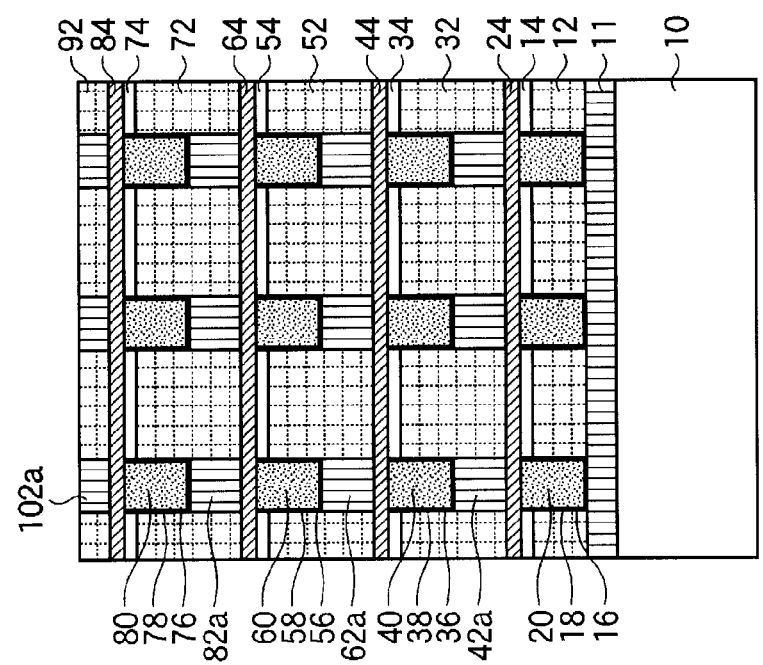

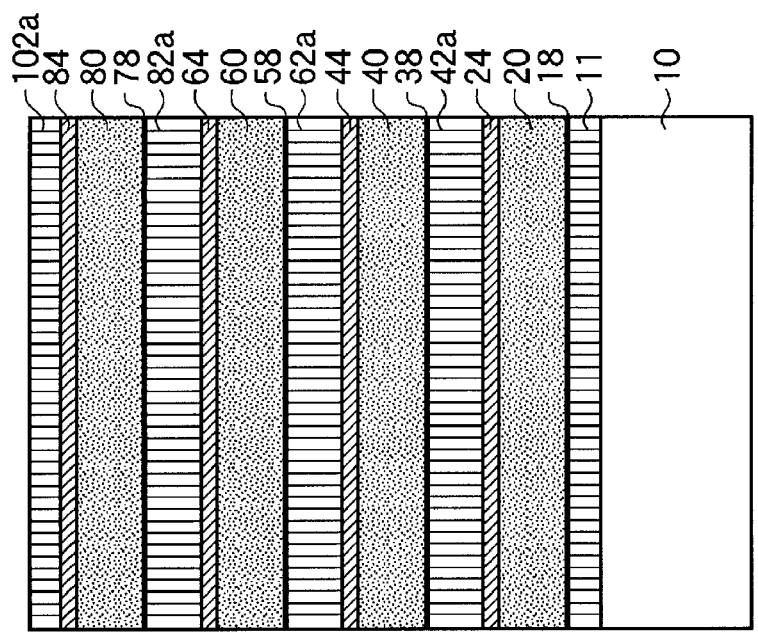
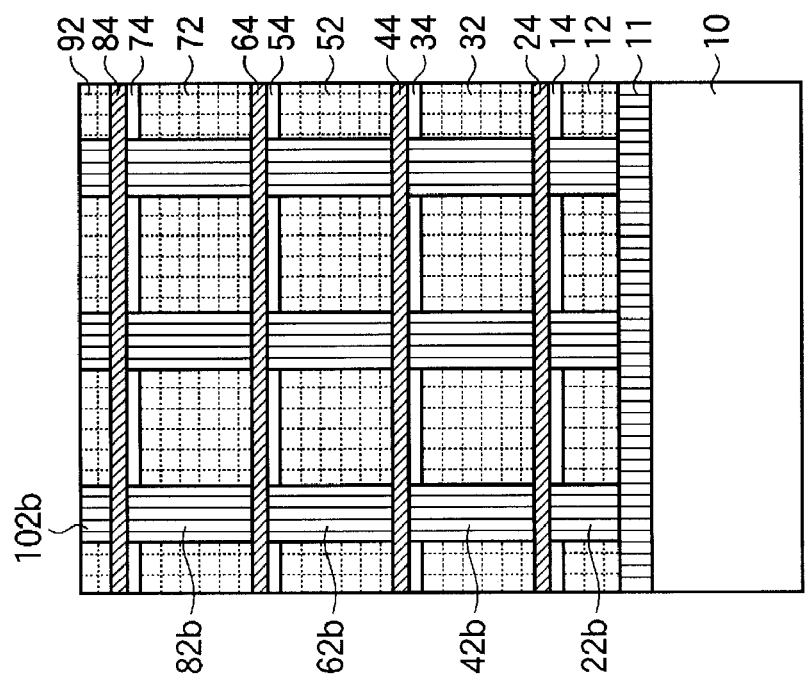

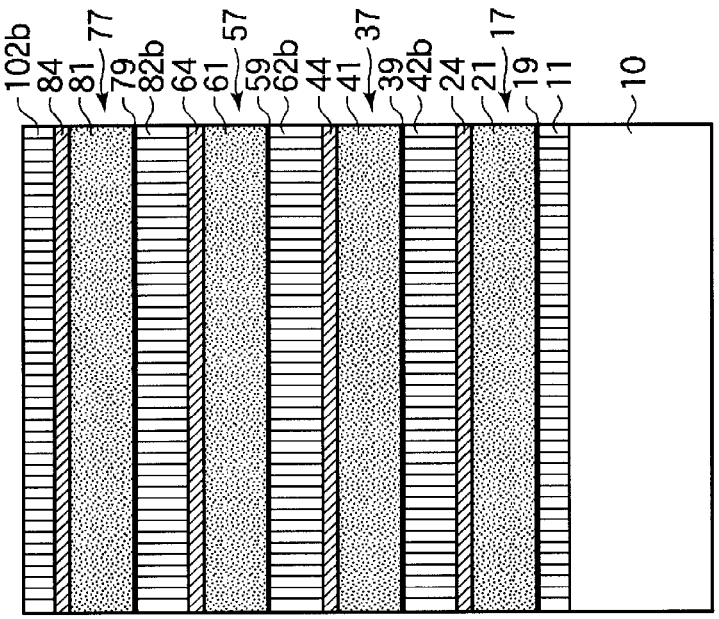
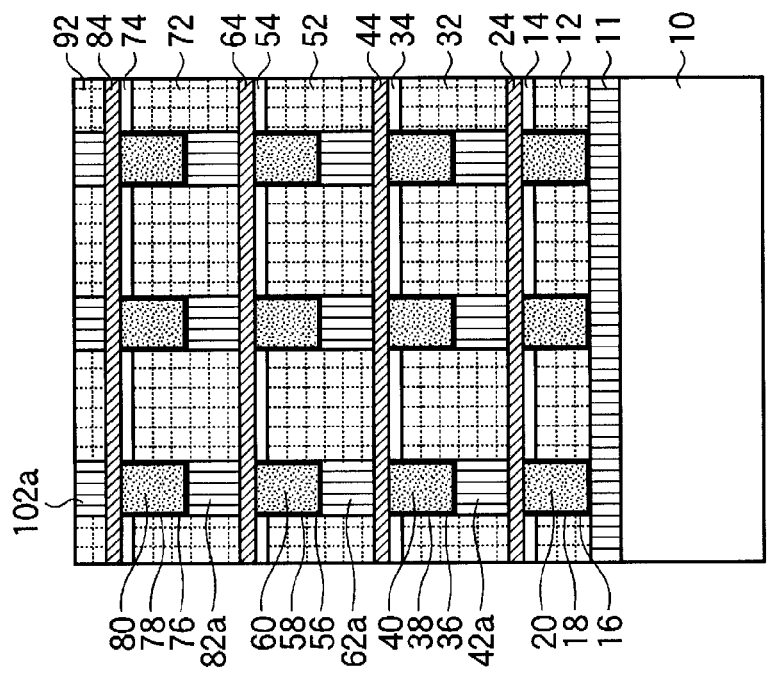

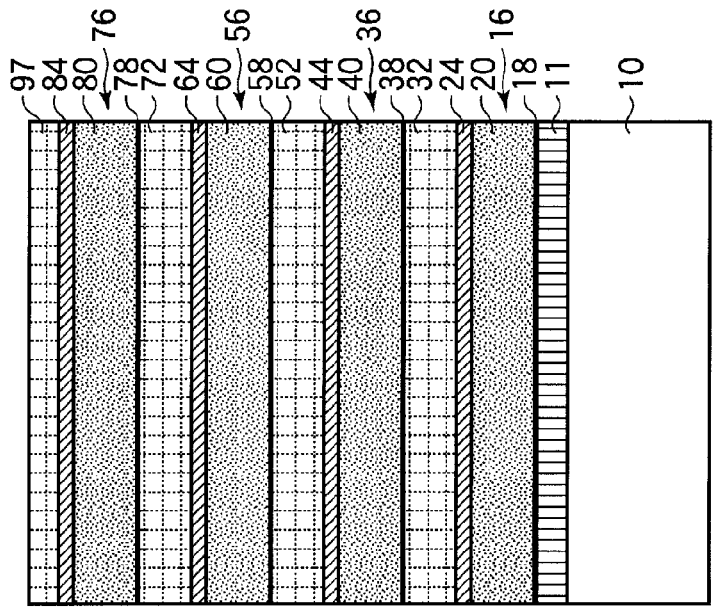
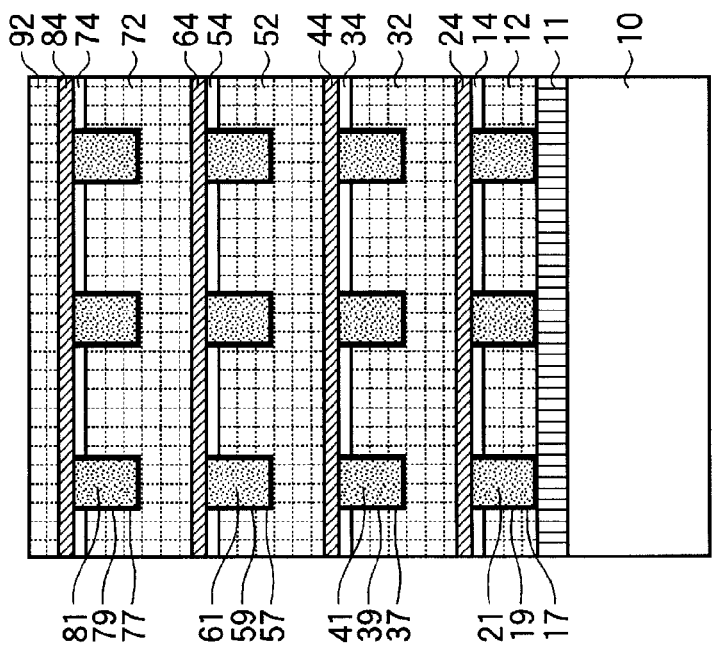

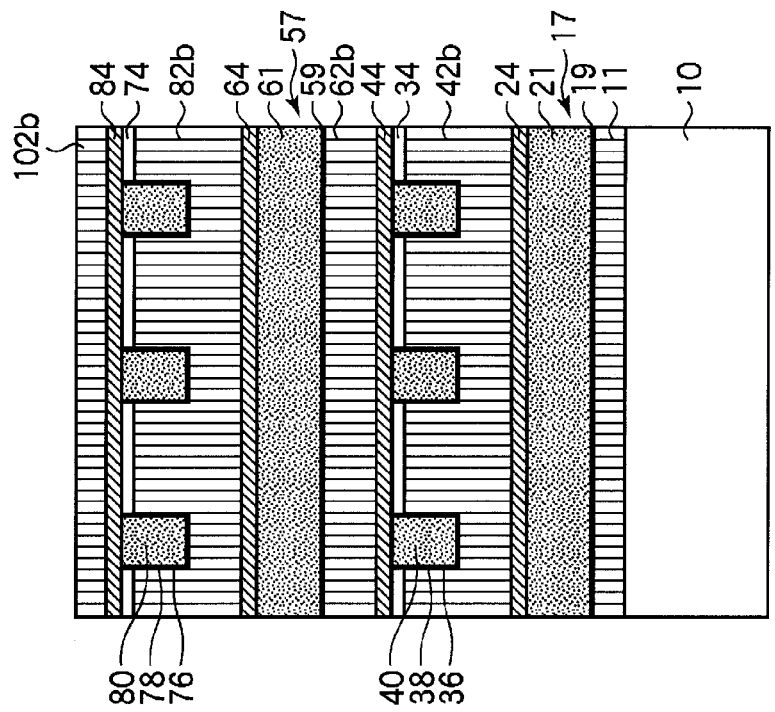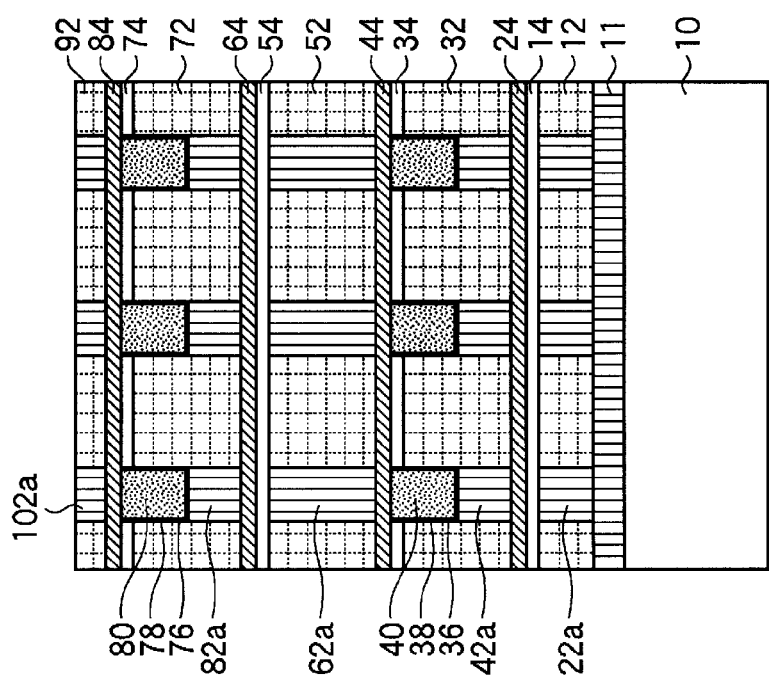

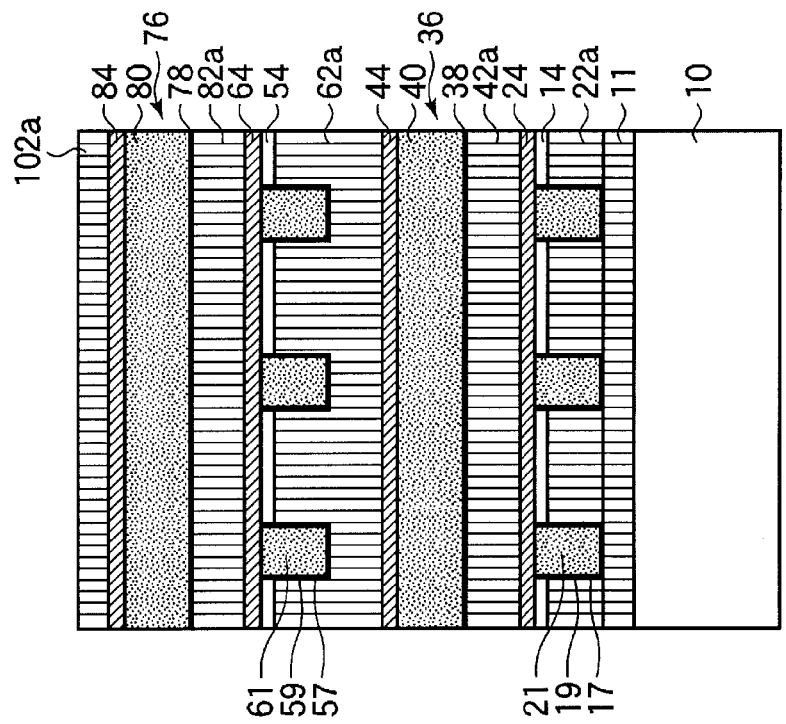
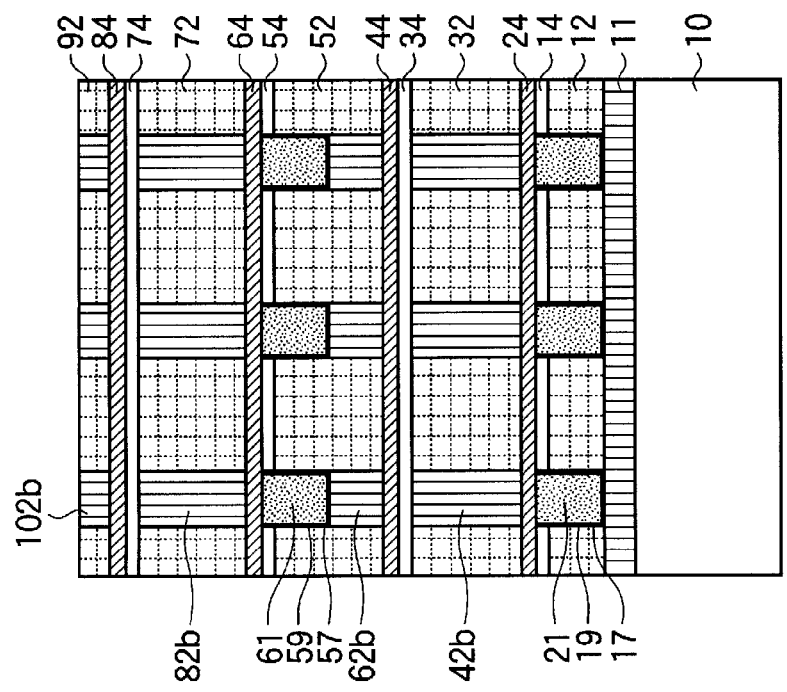

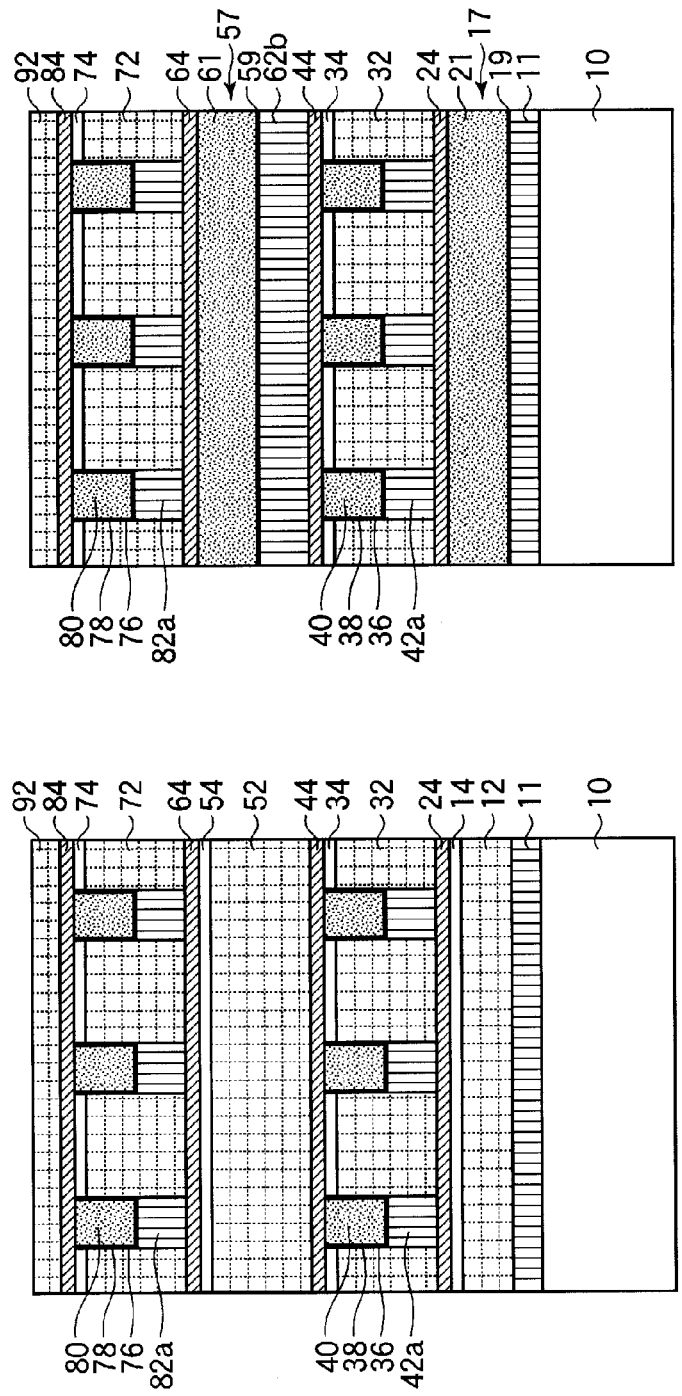

SEMICONDUCTOR DEVICE AND MANUFACTURING METHOD THEREOF

This application is a continuation of International Application No. PCT/JP2005/014999, filed Aug. 17, 2005.

BACKGROUND OF THE INVENTION

1. Field of the Invention

The present invention relates to a semiconductor device and a manufacturing method thereof, and more particularly to a semiconductor device having a multilayer wiring structure and a manufacturing method thereof.

2. Description of the Related Art

The high integration of a CMOS-LSI device and the miniaturization of a transistor device are progressing on a generation basis according to International Technology Roadmap for Semiconductors (ITRS). Accordingly, the miniaturization of a wiring inside a device and the multilayered wiring are progressing. At present, a wiring included inside a highest-performance IC chip is lengthened such that its total length reaches several to 10 km. Simultaneously, the wiring interval is narrowed and also the inter-wiring capacitance is increased. For this reason, particularly, a signal delay (or wiring delay) occurring in the wirings of a logic device serves as one of factors obstructing the speed-up of the processing rate of the CMOS-LSI device.

The wiring delay is determined on the basis of a product of the wiring resistance and the inter-wiring capacitance. For this reason, the reduction of wiring metal resistance and the reduction of inter-wiring capacitance are important to reduce the wiring delay. For the reduction of wiring metal resistance, there has been established a technique of using copper (Cu) of a lower specific resistance as the wiring metal in place of the conventionally used aluminum (Al). Semiconductor devices using Cu as the metal wiring are already being mass-produced. On the other hand, for the reduction of inter-wiring capacitance, there has been studied a low dielectric constant film (or low-k film) formed using a material of a lower specific dielectric constant as an inter-layer insulating film in place of the conventional used silicon oxide film ($SiO_2$), which is already being put into practical use in part. The low dielectric constant film material uses an organic material of an allyl ether system, a fluorocarbon system, and the like. The specific dielectric constants of these materials are about 3, which are significantly lower than $SiO_2$ (of the specific dielectric constant of 4). However, it is difficult to realize the dielectric constant reduction required for the next generation and future generations by only improving the material of the inter-layer insulating film. A method of introducing holes (porous) into these materials is being dominant and the development is progressing on a large scale to realize the further dielectric constant reduction. In general, a low dielectric constant film into which the holes are introduced is called a porous low-k film.

Patent Document 1: JP-A-2004-119969
Patent Document 2: JP-A-2002-30249
Patent Document 3: JP-A-2001-67963

In general, it is known that the low dielectric constant film including the porous low-k film has the property that the lower the specific dielectric constant is, the lower the mechanical strength is. FIG. 59 is a graph showing the relationship of a specific dielectric constant and an elastic modulus (or Young modulus) of various low dielectric constant films and $SiO_2$ films using a chemical vapor deposition (CVD) method and a spin on deposition (SOD) method represented as a method of film-forming low dielectric constant films. The horizontal axis of the graph represents the specific dielectric constant and the vertical axis represents the elastic modulus (GPa) in a logarithm. As shown in FIG. 59, values of the specific dielectric constant and the elastic modulus of the low dielectric constant film, the $SiO_2$ film, and the like are measurably varied, but the logarithms of the specific dielectric constant and the elastic modulus are mostly in the proportional relationship. That is, it turns out that the lower the specific dielectric constant of the insulating film is, the lower the mechanical strength is.

As LSI fabrication processes, there are a process in which a stress is generated in a direction perpendicular to a substrate surface as in a bonding process and a process in which a stress is generated in a substrate in-plane direction as in a polishing process using a chemical mechanical polishing (CMP) method. Moreover, in a dicing process for cutting an IC chip and a package state subsequent thereto, a complex stress including a shear stress is generated inside a device. In the semiconductor device using a low dielectric constant film for reducing the inter-wiring capacitance, it is difficult to secure a sufficient mechanical strength to these stresses. Therefore, there is a problem in that the reliability and the manufacturing yield are lowered since the deformation, the wiring disconnection, and the like are apt to occur in the semiconductor device using the low dielectric constant film. This problem should be addressed to realize next generation CMOS-LSI devices.

It is known that not only the mechanical strength is low, but also the thermal conductivity is low since the density of the porous low-k film is low in general. When the thermal conductivity of the insulating film arranged around the wiring is low, it is difficult to discharge the heat from the wiring outside the substrate and chip. For this reason, particularly, there is a problem in that a temperature is raised at the time of a chip operation in the semiconductor device using the porous low-k film.

Patent Document 1 discloses a technique for providing a mechanical reinforcement plug without a function of an electrical circuit. In association with this, there is disclosed a technique for providing a reinforcement wiring layer (or a reinforcement conductive layer or a sacrificial wiring). The reinforcement plug and the reinforcement wiring layer are formed using Cu or the like. Accordingly, the improvement of the mechanical strength of the entire chip and the adherence density in the interface is expected. However, in this case, a new parasitic capacitance is formed between the wiring-reinforcement plug and between the wiring-reinforcement wiring layer since the reinforcement plug and the reinforcement wiring layer are provided separately from the conventional wiring and via. That is, the performance of the semiconductor device is lowered by reinforcing the mechanical strength. Moreover, since these reinforcement portions should be arranged in advance in the design step, the design constraint is also large.

SUMMARY OF THE INVENTION

One possible object is to provide a semiconductor device and a manufacturing method thereof in which the reliability and the manufacturing yield are high and the design constraint is small.

According to one aspect of the present invention, there is provided a semiconductor device including: a wiring formed on a substrate; an insulating layer formed around the wiring; and a reinforcement portion of which at least a part is made of a dielectric material having a larger elastic modulus than a formation material of the insulating layer.

In the semiconductor device of the present invention as described above, the reinforcement portion includes a first reinforcement layer arranged to overlap with the wiring when viewed perpendicularly to a substrate surface. In the semiconductor device of the present invention as described above, the first reinforcement layer has the substantially same planar shape as the wiring. In the semiconductor device of the present invention as described above, the reinforcement portion includes a second reinforcement layer arranged without overlapping with the wiring when viewed perpendicularly to a substrate surface.

According to the present invention, a semiconductor device and a manufacturing method thereof can be realized in which the reliability and the manufacturing yield are high and the design constraint is small.

BRIEF DESCRIPTION OF THE DRAWINGS

FIGS. 2A and 2B are cross-sectional views showing the first basic configuration of the semiconductor device according to the embodiment of the present invention;

FIGS. 3A and 3B are cross-sectional views showing the first basic configuration of the semiconductor device according to the embodiment of the present invention;

FIGS. 15A and 15B are cross-sectional views showing the second basic configuration of the semiconductor device according to the embodiment of the present invention;

FIGS. 19A and 19B are cross-sectional views showing the configuration of the semiconductor device of the comparative example 3;

FIGS. 22A and 22B are cross-sectional views showing the third basic configuration of the semiconductor device according to the embodiment of the present invention;

FIGS. 23A and 23B are cross-sectional views showing the third basic configuration of the semiconductor device according to the embodiment of the present invention;

FIGS. 25A and 25B are cross-sectional views showing the fourth basic configuration of the semiconductor device according to the embodiment of the present invention;

DESCRIPTION OF THE PREFERRED EMBODIMENTS

Figure 1:
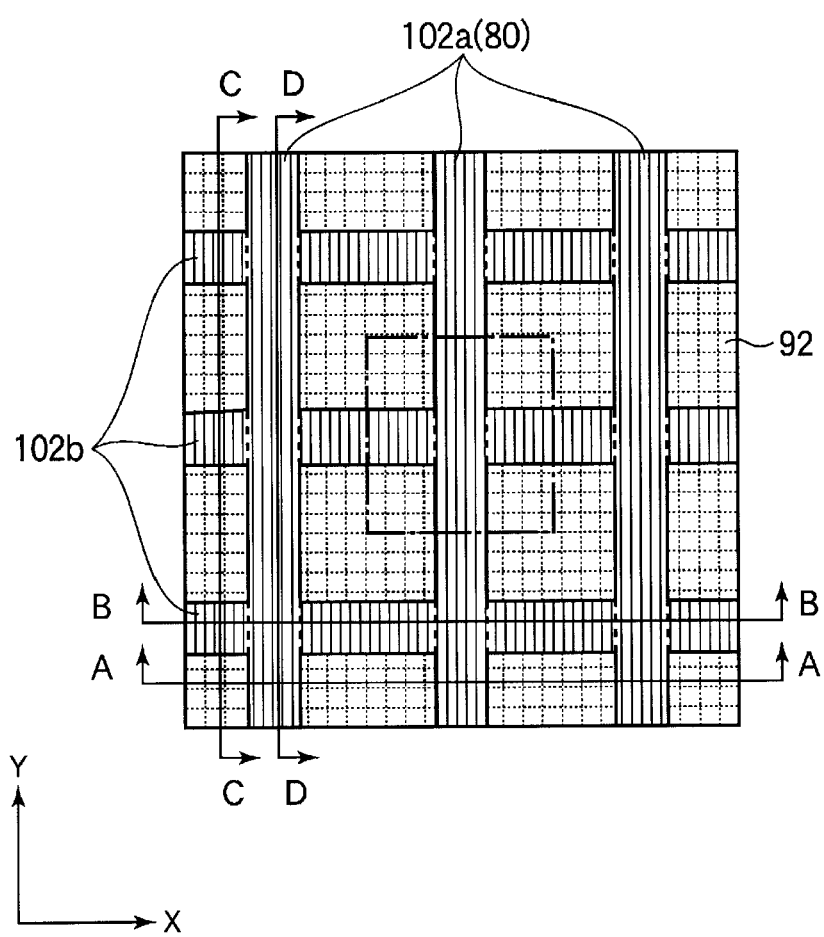
FIG. 1 is a view showing a first basic configuration of a semiconductor device according to an embodiment of the present invention.

A semiconductor device and a manufacturing method thereof will be described with reference to FIGS. 1 to 58. FIG. 1 shows a first basic configuration of a semiconductor device according to an embodiment of the present invention. FIG. 2A shows a cross-sectional configuration of the semiconductor device cut along the A-A line of FIG. 1. FIG. 2B shows a cross-sectional configuration of the semiconductor device cut along the B-B line of FIG. 1. FIG. 3A shows a cross-sectional configuration of the semiconductor device cut along the C-C line of FIG. 1. FIG. 3B shows a cross-sectional configuration of the semiconductor device cut along the D-D line of FIG. 1. Herein, the horizontal direction of FIG. 1 is set to the X axis and the right direction is set to the +X direction. Moreover, the perpendicular direction of FIG. 1 is set to the Y axis and the upward direction is set to the +Y direction. The A-A line and the B-B line are parallel with the X axis and the C-C line and the D-D line are parallel with the Y axis. That is, the section as shown in FIGS. 2A and 2B is perpendicular to the Y axis, and the section as shown in FIGS. 3A and 3B is perpendicular to the X axis. A wiring structure of this example is a most simplified multilayer wiring structure in which wirings of the same pattern are arranged to overlap in four layers.

As shown in FIGS. 1 to 3B, the semiconductor device has a silicon substrate 10 in which semiconductor elements of a MOS transistor and the like are formed. On the entire surface on the silicon substrate 10, a silicon oxide film (or $SiO_2$ film) 11 serving as an underlying insulating film is formed. On the $SiO_2$ film 11, for example, a plurality of reinforcement insulating films (or second reinforcement layers) 22b parallel with each other are formed to extend in substantially parallel with the X axis. As a formation material of the reinforcement insulating films 22b, for example, $SiO_2$, $SiO_xC_y$, $SiC_x$, $SiN_x$, or a combination thereof is used. In areas other than formation areas of the reinforcement insulating films 22b on the $SiO_2$ film 11, a low dielectric constant film 12 is formed using a material of a lower specific dielectric constant and a smaller elastic modulus (or Young modulus) than those of the formation material of the reinforcement insulating film 22b. For example, when $SiO_2$ is used as the formation material of the reinforcement insulating films 22b, SiOC of which the specific dielectric constant is lower than that of $SiO_2$ and the elastic modulus is smaller than that of $SiO_2$ or the like is used as the formation material of the low dielectric constant film 12. The reinforcement insulating film 22b and the low dielectric constant film 12 have the substantially same film thickness as each other. On the low dielectric constant film 12 and the reinforcement insulating film 22*b*, a hard mask film 14 is formed, for example, using SiC. In the hard mask film 14, the low dielectric constant film 12, and the reinforcement insulating film 22*b*, for example, a plurality of wiring grooves 16 parallel with each other are formed to extend in parallel with the Y axis. On inner wall surfaces of the plurality of wiring grooves 16, barrier metal layers 18 are respectively formed, for example, using tantalum (Ta). Within the wiring grooves 16 in which the barrier metal layers 18 are formed on the inner wall surfaces, for example, a Cu layer serving as a first layer wiring 20 is embedded. On the entire substrate surface on the hard mask film 14 and the wiring 20, a diffusion prevention film (or cap film) 24 of Cu is formed, for example, using SiC.

On the cap film 24, there are formed a plurality of reinforcement insulating films (or first reinforcement layers) 42*a* respectively overlapping with a plurality of wirings 20 when viewed perpendicularly to the substrate surface and extending in substantially parallel with the Y axis, and a plurality of reinforcement insulating films (or second reinforcement layers) 42*b* respectively overlapping with the plurality of reinforcement insulating films 22*b* when viewed perpendicularly to the substrate surface and extending in substantially parallel with the X axis. For example, the reinforcement insulating films 42*a*, 42*b* are formed using $SiO_2$ or the like and intersect with each other within the same surface. A lower layer portion of the reinforcement insulating film 42*b* is formed in the same layer as the reinforcement insulating film 42*a*. In an area other than formation areas of the reinforcement insulating films 42*a*, 42*b* on the cap film 24, for example, a low dielectric constant film 32 is formed using SiOC. The formation material of the reinforcement insulating films 42*a*, 42*b* has a higher specific dielectric constant and a larger elastic modulus than the formation material of the low dielectric constant film 32. On the low dielectric constant film 32 and the reinforcement insulating film 42*b*, for example, a hard mask film 34 is formed using SiC. Immediately above the reinforcement insulating films 42*a*, a plurality of wiring grooves 36 are respectively formed to overlap with the plurality of reinforcement insulating films 42*a* and extend in substantially parallel with the Y axis. On the inner wall surfaces of the plurality of wiring grooves 36, for example, barrier metal layers 38 are respectively formed using Ta. Within the wiring grooves 36 in which the barrier metal layers 38 are formed, for example, a Cu layer serving as a second layer wiring 40 is embedded. The wiring 40 is arranged to overlap with the reinforcement insulating film 42*a* when viewed perpendicularly to the substrate surface and has the substantially same planar shape as the reinforcement insulating film 42*a*. On the entire substrate surface on the hard mask film 34 and the wiring 40, for example, a cap film 44 is formed using SiC.

On the cap film 44, there are formed a plurality of reinforcement insulating films 62*a* respectively overlapping with a plurality of wirings 40 when viewed perpendicularly to the substrate surface and extending in substantially parallel with the Y axis, and a plurality of reinforcement insulating films 62*b* respectively overlapping with the plurality of reinforcement insulating films 42*b* when viewed perpendicularly to the substrate surface and extending in substantially parallel with the X axis. For example, the reinforcement insulating films 62*a*, 62*b* are formed using $SiO_2$ or the like and intersect with each other within the same surface. A lower layer portion of the reinforcement insulating film 62*b* is formed in the same layer as the reinforcement insulating film 62*a*. In an area other than formation areas of the reinforcement insulating films 62*a*, 62*b* on the cap film 44, for example, a low dielectric constant film 52 is formed using SiOC. The formation material of the reinforcement insulating films 62*a*, 62*b* has a higher specific dielectric constant and a larger elastic modulus than the formation material of the low dielectric constant film 52. On the low dielectric constant film 52 and the reinforcement insulating film 62*b*, for example, a hard mask film 54 is formed using SiC. Immediately above the reinforcement insulating films 62*a*, a plurality of wiring grooves 56 are respectively formed to overlap with the reinforcement insulating films 62*a* and extend in substantially parallel with the Y axis. On the inner wall surfaces of the plurality of wiring grooves 56, for example, barrier metal layers 58 are respectively formed using Ta. Within the wiring grooves 56 in which the barrier metal layers 58 are formed, for example, a Cu layer serving as a third layer wiring 60 is embedded. The wiring 60 is arranged to overlap with the reinforcement insulating film 62*a* when viewed perpendicularly to the substrate surface and has the substantially same planar shape as the reinforcement insulating film 62*a*. On the entire substrate surface on the hard mask film 54 and the wiring 60, for example, a cap film 64 is formed using SiC.

On the cap film 64, there are formed a plurality of reinforcement insulating films 82*a* respectively overlapping with a plurality of wirings 60 when viewed perpendicularly to the substrate surface and extending in substantially parallel with the Y axis, and a plurality of reinforcement insulating films 82*b* respectively overlapping with the plurality of reinforcement insulating films 62*b* when viewed perpendicularly to the substrate surface and extending in substantially parallel with the X axis. For example, the reinforcement insulating films 82*a*, 82*b* are formed using $SiO_2$ or the like and intersect with each other within the same surface. A lower layer portion of the reinforcement insulating film 82*b* is formed in the same layer as the reinforcement insulating film 82*a*. In an area other than formation areas of the reinforcement insulating films 82*a*, 82*b* on the cap film 64, for example, a low dielectric constant film 72 is formed using SiOC. The formation material of the reinforcement insulating films 82*a*, 82*b* has a higher specific dielectric constant and a larger elastic modulus than the formation material of the low dielectric constant film 72. On the low dielectric constant film 72 and the reinforcement insulating film 82*b*, for example, a hard mask film 74 is formed using SiC. Immediately above the reinforcement insulating film 82*a*, a plurality of wiring grooves 76 are respectively formed to overlap with the reinforcement insulating film 82*a* and extend in substantially parallel with the Y axis. On the inner wall surfaces of the plurality of wiring grooves 76, for example, barrier metal layers 78 are respectively formed using Ta. Within the wiring grooves 76 in which the barrier metal layers 78 are formed, for example, a Cu layer serving as a fourth layer wiring 80 is embedded. The wiring 80 is arranged to overlap with the reinforcement insulating film 82*a* when viewed perpendicularly to the substrate surface and has the substantially same planar shape as the reinforcement insulating film 82*a*. On the entire substrate surface on the hard mask film 74 and the wiring 80, for example, a cap film 84 is formed using SiC.

On the cap film 84, there are formed a plurality of reinforcement insulating films 102*a* respectively overlapping with the wiring 80 when viewed perpendicularly to the substrate surface and extending in substantially parallel with the Y axis, and a plurality of reinforcement insulating films 102*b* respectively overlapping with the reinforcement insulating film 82*b* when viewed perpendicularly to the substrate surface and extending in substantially parallel with the X axis. For example, the reinforcement insulating films 102*a*, 102*b* are formed using $SiO_2$ or the like and intersect with each other within the same surface. The reinforcement insulating films 102a, 102b are formed in the same layer. In an area other than formation areas of the reinforcement insulating films 102a, 102b on the cap film 84, for example, a low dielectric constant film 92 is formed.

The first basic configuration of this embodiment is characterized in that there are provided the low dielectric constant films 12, 32, 52, 72, 92 functioning as insulating layers, and the reinforcement insulating films 22b, 42a, 42b, 62a, 62b, 82a, 82b, 102a, 102b that are formed using a dielectric material of $SiO_2$ or the like having a higher specific dielectric constant and a larger elastic modulus than the formation material of the low dielectric constant films 12, 32, 52, 72, 92, function as insulating layers and function as reinforcement portions for reinforcing the mechanical strength of the semiconductor device. Immediately below or substantially immediately above the respective wirings 20, 40, 60, 80, the reinforcement insulating films 42a, 62a, 82a, 102a are formed to overlap with the wirings 20, 40, 60, 80 when viewed perpendicularly to the substrate surface. The reinforcement insulating films 22b, 42b, 62b, 82b, 102b are arranged to respectively intersect with the reinforcement insulating films 42a, 62a, 82a, 102a within the same surface without overlapping with the wirings 20, 40, 60, 80 when viewed perpendicularly to the substrate surface. The low dielectric constant films 12, 35, 52, 72, 92 are formed around the wirings 20, 40, 60, 80 other than the formation areas of the reinforcement insulating films 22b, 42a, 42b, 62a, 62b, 82a, 82b, 102a, 102b.

The reinforcement insulating films 42a, 62a, 82a, 102a layered by overlapping with one another and the wirings 20, 40, 60, 80 function as a plurality of first walls arranged at predetermined intervals (and FIG. 3B shows a section parallel with a wall surface of the first walls). The first wall includes a via portion for connecting a lower layer wiring and an upper layer wiring. According to the arrangement of the wirings 20, 40, 60, 80, the first walls may not include one or all of the wirings 20, 40, 60, 80.

On the other hand, the reinforcement insulating films 22b, 42b, 62b, 82b, 102b layered by overlapping with one another intersect with the first walls and function as second walls, substantially orthogonal to the first walls, arranged at predetermined intervals (and FIG. 2B shows a section parallel with a wall surface of the second walls). In place of the reinforcement insulating film 22b, a dummy wiring formed on the same layer as that of the wiring 20 can be arranged. Alternatively, dummy wirings formed in the same layers as those of the wirings 40, 60, 80 can be arranged on the reinforcement insulating films 42b, 62b, 82b. In this case, the dummy wirings function as the second walls along with the reinforcement insulating films 22b, 42b, 62b, 82b, 102b.

The first and second walls do not include the low dielectric constant films 12, 32, 52, 72, 92. $SiO_2$ or the like serving as the formation material of the reinforcement insulating films 22b, 42a, 42b, 62a, 62b, 82a, 82b, 102a, 102b configuring the first and second walls and Cu or the like serving as the formation material of the wirings 20, 40, 60, 80 have a lager elastic modulus as compared with SiOC or the like serving as the formation material of the low dielectric constant films 12, 32, 52, 72, 92. Therefore, the mechanical strength of the semiconductor device increases by providing the first and second walls substantially orthogonal to each other as a structure.

Since the mechanical strength of the semiconductor device is secured by the reinforcement insulating films 22b, 42a, 42b, 62a, 62b, 82a, 82b, 102a, 102b and the wirings 20, 40, 60, 80, the low dielectric constant films 12, 32, 52, 72, 92 do not need to have a high mechanical strength. Therefore, the low dielectric constant films 12, 32, 52, 72, 92 can use a material of a smaller elastic modulus and a lower specific dielectric constant. Moreover, the high mechanical strength can be achieved in a semiconductor device of a so-called air gap structure using an air layer (or gap) having a lower specific dielectric constant as an insulating layer in place of the low dielectric constant films 12, 32, 52, 72, 92.

Moreover, the material of $SiO_2$ or the like having a relatively large elastic modulus has a higher thermal conductivity than the low dielectric constant film in general. Therefore, the heat from the Cu wiring can be relatively easily transferred to an outside by providing the reinforcement insulating films 22b, 42a, 42b, 62a, 62b, 82a, 82b, 102a, 102b formed using $SiO_2$, such that a high heat diffusion effect can be achieved.

Herein, the wiring structure of the first basic configuration is compared with the wiring structures of two comparative examples as shown below to make the effect of this embodiment more clear.

Figure 4:
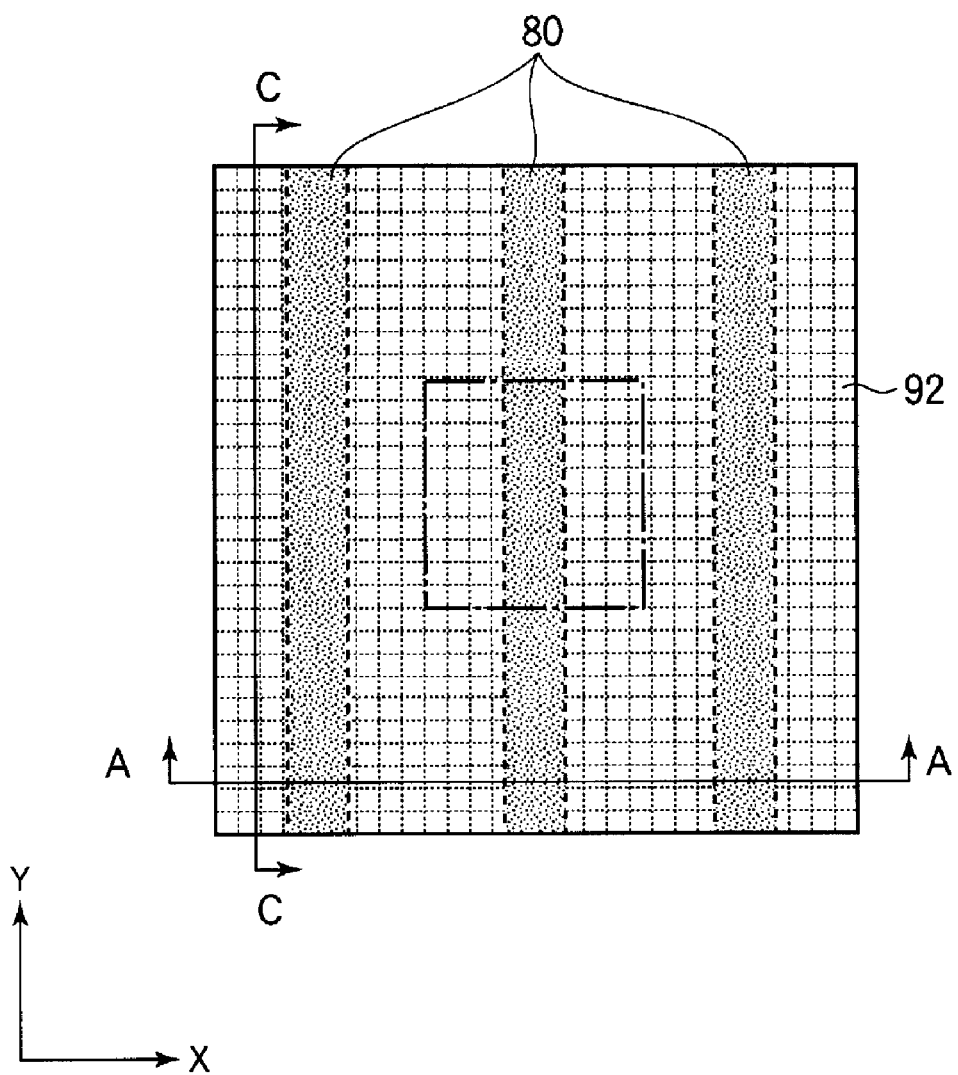
FIG. 4 is a view showing a configuration of a semiconductor device of a comparative example 1.
Figure 5:
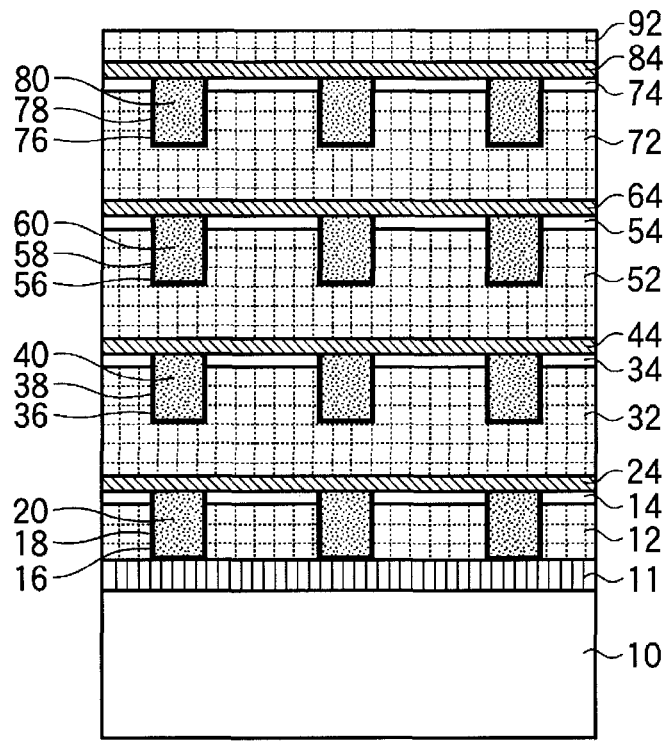
FIG. 5 is a cross-sectional view showing the configuration of the semiconductor device of the comparative example 1.
Figure 6:
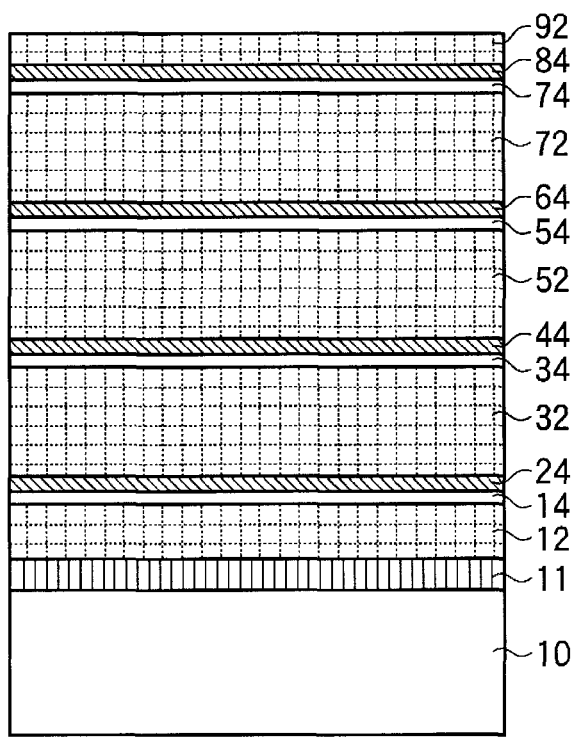
FIG. 6 is a cross-sectional view showing the configuration of the semiconductor device of the comparative example 1.

FIG. 4 shows a configuration of a conventional semiconductor device as a comparative example 1 to the first basic configuration. FIG. 5 shows a cross-sectional configuration of the semiconductor device cut along the A-A line of FIG. 4, and FIG. 6 shows a cross-sectional configuration of the semiconductor device cut along the C-C line of FIG. 4. In order to easily make a comparison with this embodiment, a wiring pattern of the comparative example 1 was the same as that of the first basic configuration shown in FIGS. 1 to 3B. As shown in FIGS. 4 to 6, the semiconductor device of the comparative example 1 is different from the first basic configuration in that an interlayer insulating film and an insulating film of an uppermost layer are configured with only the low dielectric constant films 12, 32, 52, 72, 92 without providing the reinforcement insulating films 22b, 42a, 42b, 62a, 62b, 82a, 82b, 102a, 102b.

Figure 7:
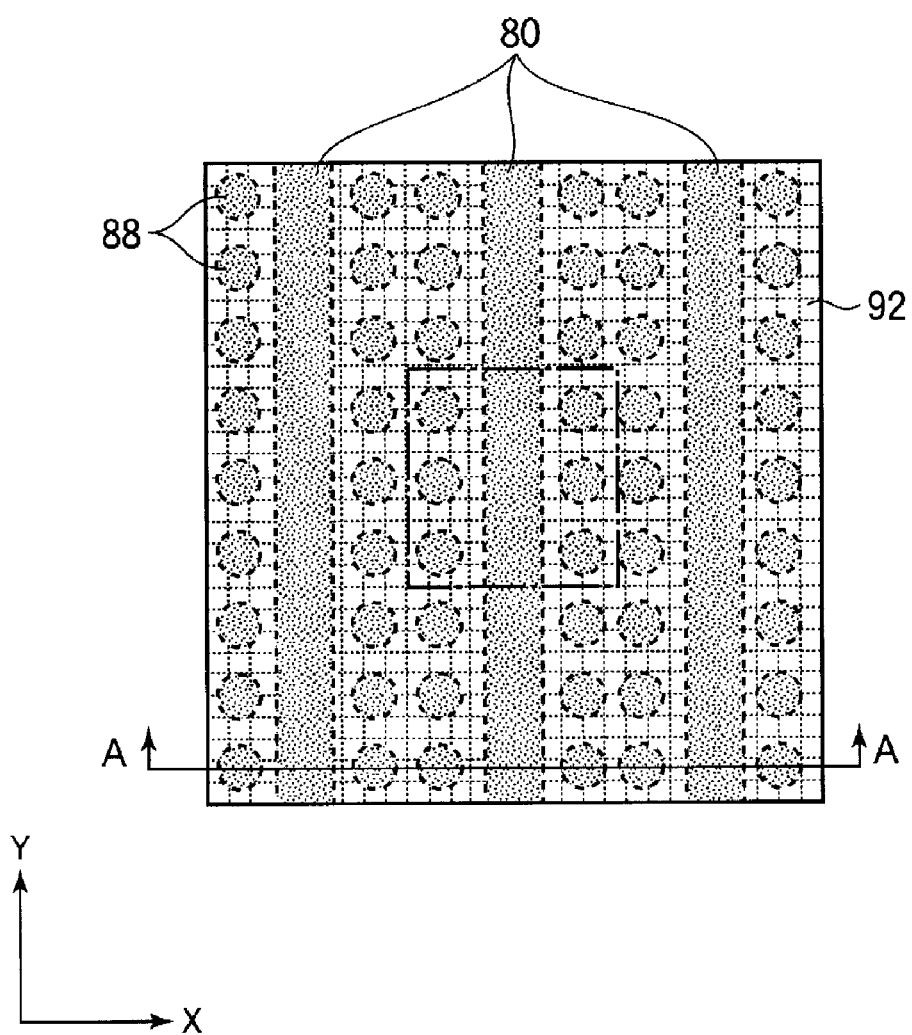
FIG. 7 is a view showing a configuration of a semiconductor device of a comparative example 2.
Figure 8:
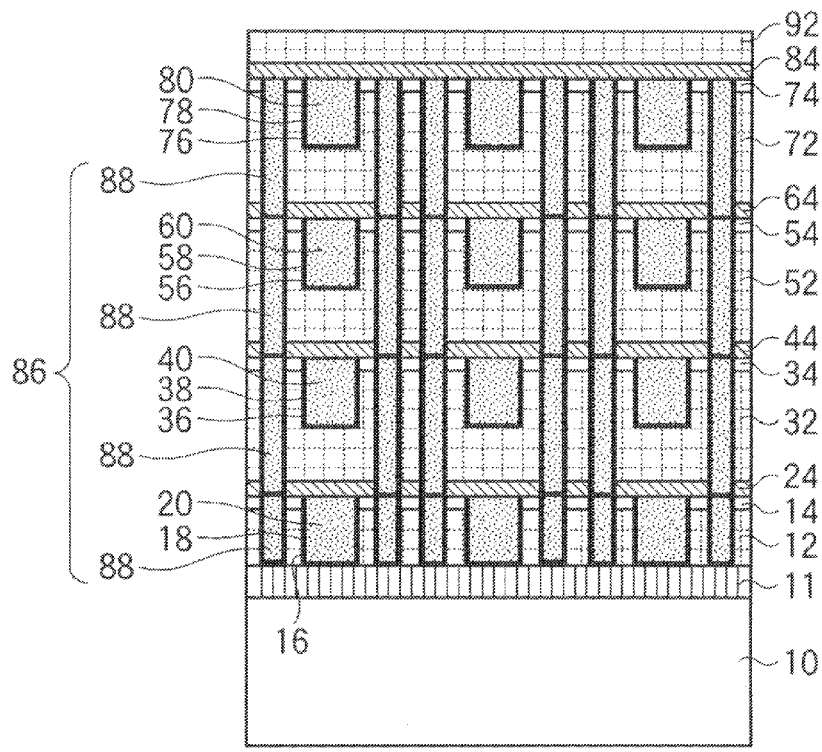
FIG. 8 is a cross-sectional view showing the configuration of the semiconductor device of the comparative example 2.

FIG. 7 shows a configuration of a semiconductor device proposed in a Japanese patent application (Patent Application No. 2003-47768: hereinafter, referred to as "patent application 1") by the applicant of the present application serving as a comparative example 2 to the first basic configuration. FIG. 8 shows a cross-sectional configuration of the semiconductor device cut along the A-A line of FIG. 7. A wiring pattern of the comparative example 2 was the same as that of the first basic configuration. Herein, the semiconductor device proposed in the patent application 1 has a structure in which a reinforcement dummy stack via is formed using, for example, Cu, so as to suppress the degradation of the mechanical strength associated with the introduction of the low dielectric constant film. In order to have a sufficient mechanical strength to a perpendicular stress in this structure, the dummy stack via needs to be placed at an area ratio equal to or greater than, for example, approximately 15%. For this reason, a design freedom degree is not necessarily high.

As shown in FIGS. 7 and 8, a plurality of dummy stack vias 86 in which four layer via portions 88 are overlapped are formed in the comparative example 2 in addition to the same configuration as that of the comparative example 1. Each layer via portion 88 is formed by embedding a Cu layer within a formed via hole of a barrier metal layer on an inner wall surface. The dummy stack vias 86 are provided to increase the mechanical strength of the semiconductor device. A sum of cross-sectional areas of the plurality of dummy stack vias 86 was substantially the same as a sum of cross-sectional areas of the second walls of the first basic configuration (or the reinforcement insulating films 22b, 42b, 62b, 82b, 102b).

In the first basic configuration of this embodiment and the comparative examples 1 and 2, a stress and a displacement amount occurring at the time of applying an external force were tested. The stress and the displacement were computed by numerical simulations using a finite element method. In the finite element method, a method of reducing a computational size by making a model boundary in the symmetric boundary condition is used. Consequently, a range surrounded by the dashed-dotted line of the center portion in a plan view (FIG. 1, FIG. 4, FIG. 7) of each structure can be only modeled and computed. A size of the computational model was set to 0.98 μm☐ (square) and widths of the wirings 20, 40, 60, 80 and the reinforcement insulating films 22b, 42a, 42b, 62a, 62b, 82a, 82b, 102a, 102b were set to 0.14 μm which is equal to a minimum wiring width, and a pitch was set to 0.98 μm. Herein, the pitch is a distance between central axes of adjacent wirings (or reinforcement insulating films). Moreover, heights of the wirings 20, 40, 60, 80 were set to 0.25 μm, and heights of the reinforcement insulating films 42a, 62a, 82a, 102a (or the via layers) were set to 0.3 μm. The elastic modulus of the formation material of the low dielectric constant films 12, 32, 52, 72, 92 was set to 2.25 Gpa and a Poisson ratio was set to 0.25. The values of the elastic modulus and the Poisson ratio are physical property values of a typical low dielectric constant film material commonly marketed. The elastic modulus of the formation material of the reinforcement insulating films 22b, 42a, 42b, 62a, 62b, 82a, 82b, 102a, 102b was set to 70 Gpa and the Poisson ratio was set to 0.17. The values of the elastic modulus and the Poisson ratio are general physical property values of $SiO_2$.

Figure 9:
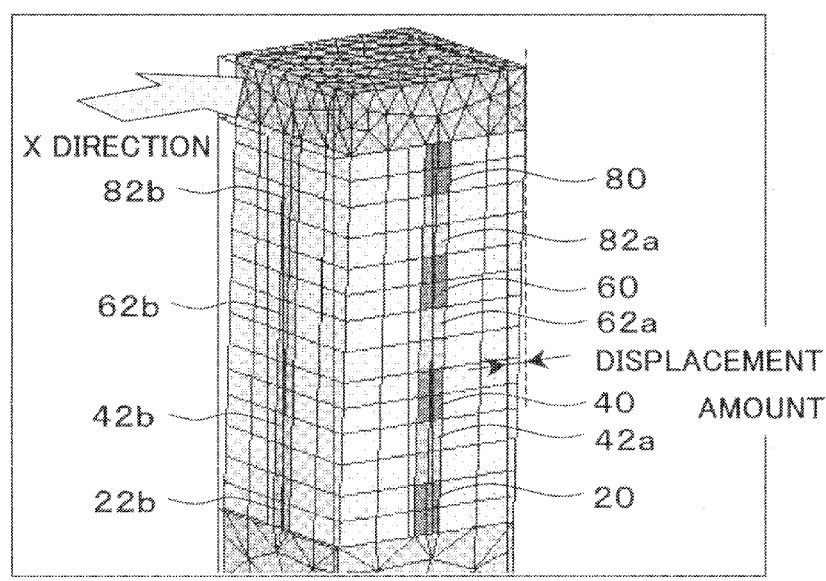
FIG. 9 is a view showing the condition of deformation of a computational model of the first basic configuration according to the embodiment of the present invention.
Figure 10:
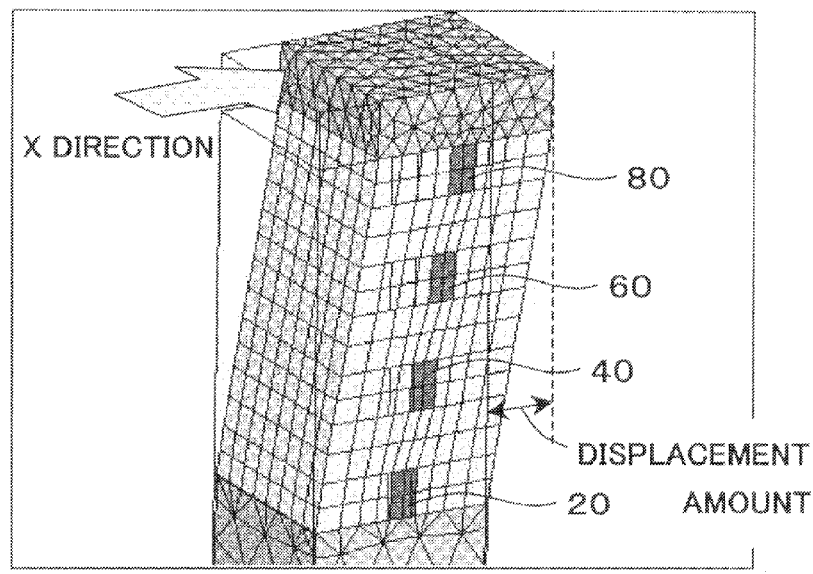
FIG. 10 is a view showing the condition of deformation of a computational model of the comparative example 1.
Figure 11:
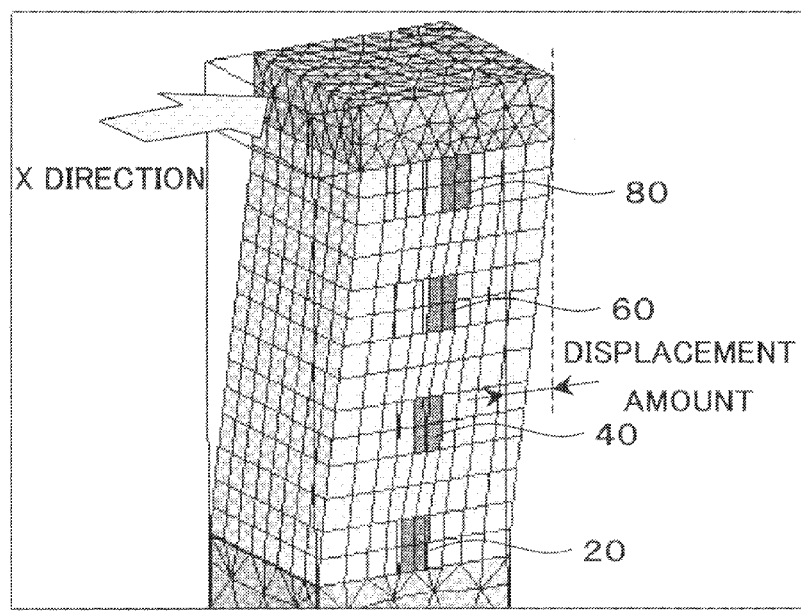
FIG. 11 is a view showing the condition of deformation of a computational model of the comparative example 2.
Figure 12:
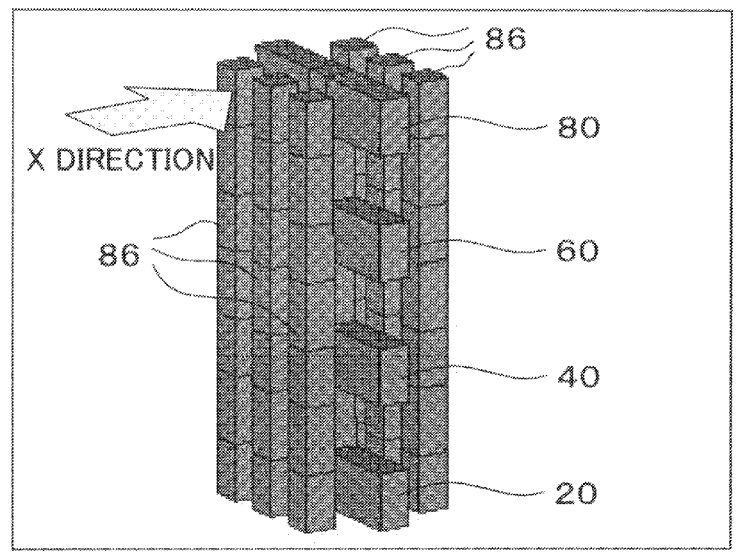
FIG. 12 is a view showing a computational model of the comparative example 2 from which a low dielectric constant film is removed.

When applying a unit load to the wiring structure in each of the +X direction and the +Y direction serving as the substrate in-plane directions and applying a unit load in the perpendicular direction, displacement amounts were computed. Herein, the load of the substrate in-plane direction was applied to an uppermost layer portion of the wiring structure under the assumption of a polishing process using a CMP method. FIGS. 9 to 11 show deformation conditions of computational models when the load is applied in the +X direction (as indicated by the thick arrow in the figures). FIG. 9 is a view showing the condition of deformation of a computational model of the first basic configuration of this embodiment. FIG. 10 shows the condition of deformation of a computational model of the comparative example 1, and FIG. 11 shows the condition of deformation of a computational model of the comparative example 2. For a better understanding in FIGS. 9 to 11, the deformation is enlarged by multiplying the displacement amounts by the same coefficient. FIG. 12 shows that the low dielectric constant film is removed such that the arrangement of the dummy stack vias 86 is easily understood in the computational model in a state in which a load is not applied.

When the displacement amounts of the uppermost layer portions are compared in the case where the unit load is applied in the +X direction, it can be clearly seen that the displacement amount of the computational model of the first basic configuration is smaller than the displacement amounts of the computational models of the comparative examples 1 and 2 as shown in FIGS. 9 to 12.

Herein, when assuming the case where a chip-shaped wafer attached to an IC package is warped by thermal expansion and thermal contraction, the load (or tensile or compressive load) of the substrate in-plane direction is applied to a side surface of the computational model. On the other hand, the thermal deformation of this wafer is not precisely analyzed in the above-described computation since the load of the substrate in-plane direction is applied to the uppermost layer portion of the wiring structure for simplification. However, since the direction in which the load is applied is the same substrate in-plane direction, it can be considered that the influence of the structure to the thermal deformation also shows the same pattern as in the above-described computational results. That is, the thermal deformation is considered to be more difficult in the first basic configuration of this embodiment as compared with the comparative examples 1 and 2.

Figure 13:
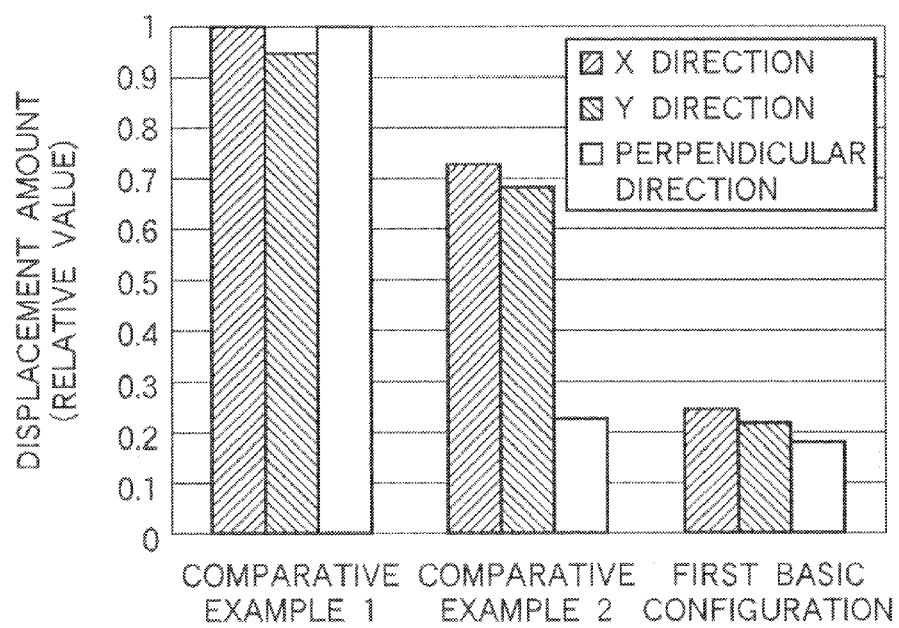
FIG. 13 is a graph showing computational results of displacement amounts when a unit load is applied in a +X direction, a +Y direction, and a perpendicular direction with respect to the respective computational models.

FIG. 13 is a graph showing computational results of displacement amounts when the unit load is applied to each of the computational models in the substrate in-plane directions (or the +X direction and the +Y direction) and the perpendicular direction. The vertical axis of the graph represents the relative value of the displacement amount, and the displacement amount of the substrate in-plane direction (or the +X direction) of the comparative example 1 and the displacement amount of the perpendicular direction are respectively set to 1. When the load is applied in the perpendicular direction as shown in FIG. 13, it can be seen that the displacement amount of the perpendicular direction of the first basic configuration is remarkably reduced in comparison with that of the comparative example 1. Moreover, the displacement amount of the perpendicular direction of the comparative example 2 is also reduced in the same degree as that of the first basic configuration. On the other hand, when the load is applied in the substrate in-plane direction, the displacement amount of the substrate in-plane direction of the first basic configuration is reduced up to about 20% of the comparative example 1, whereas the displacement amount of the substrate in-plane direction of the comparative example 2 is about 70% of the comparative example 1. In the configuration of the comparative example 2 as described above, the durability is high with respect to the load of the perpendicular direction, but the durability is not very high with respect to the load of the substrate in-plane direction. This is because the reinforcement in which the dummy stack vias 86 extends in the substrate in-plane direction is absent and the effect is less with respect to the load of the substrate in-plane direction. On the other hand, by providing the first and second walls respectively extending in the substrate in-plane direction and substantially perpendicularly intersecting with each other in the first basic configuration of this embodiment, not only the durability for the load of the perpendicular direction is high, but also the durability for the load of the substrate in-plane direction is high. As described above, it can be seen that a high mechanical strength is achieved irrespective of the load application direction in the first basic configuration of this embodiment.

Figure 14:
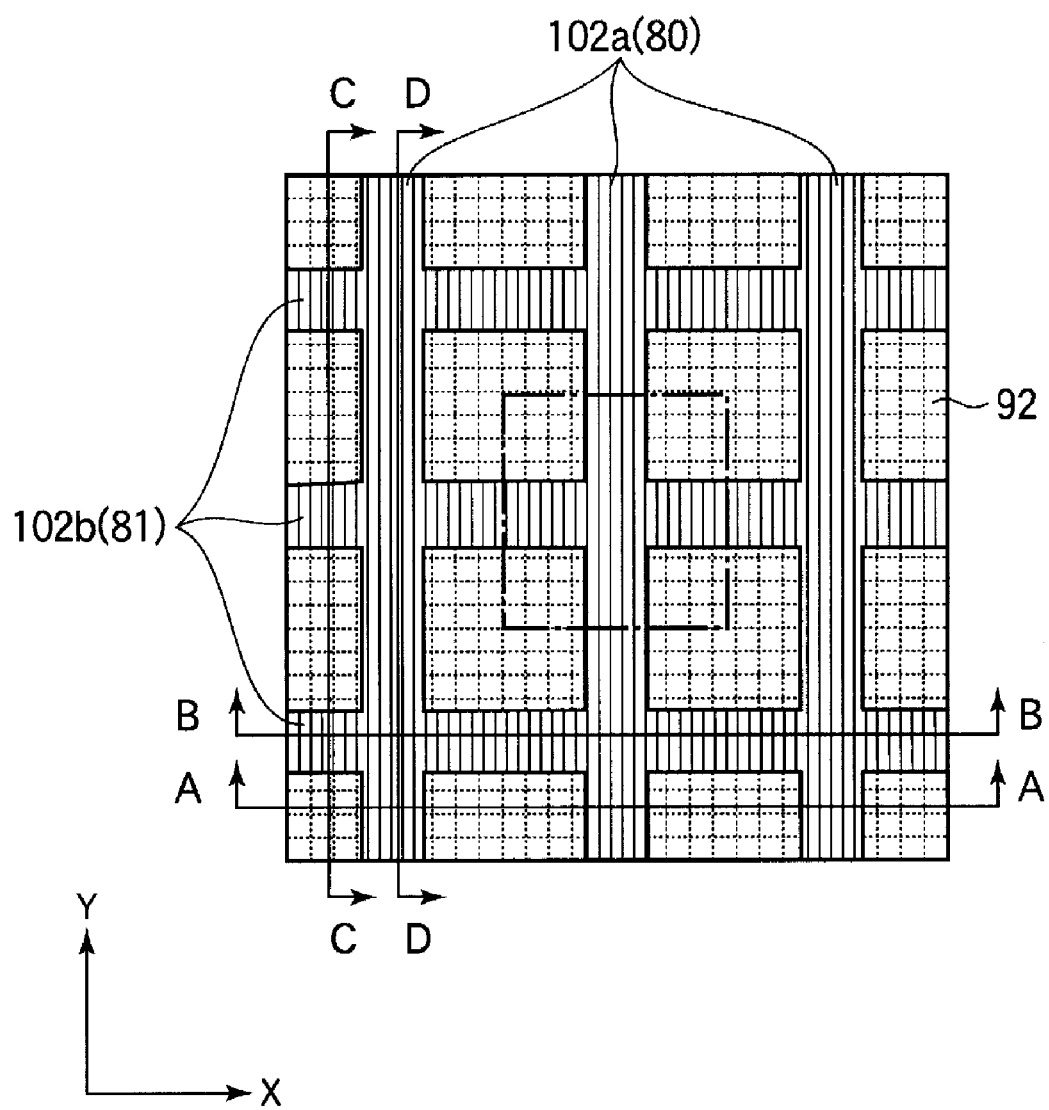
FIG. 14 is a view showing a second basic configuration of a semiconductor device according to an embodiment of the present invention.
Figure 16B:
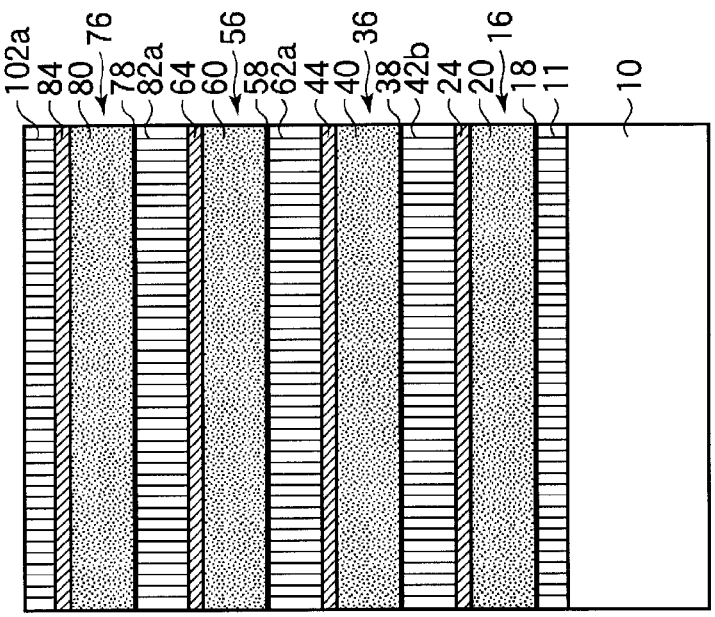
FIGS. 16A and 16B are cross-sectional views showing the second basic configuration of the semiconductor device according to the embodiment of the present invention.
Figure 16A:
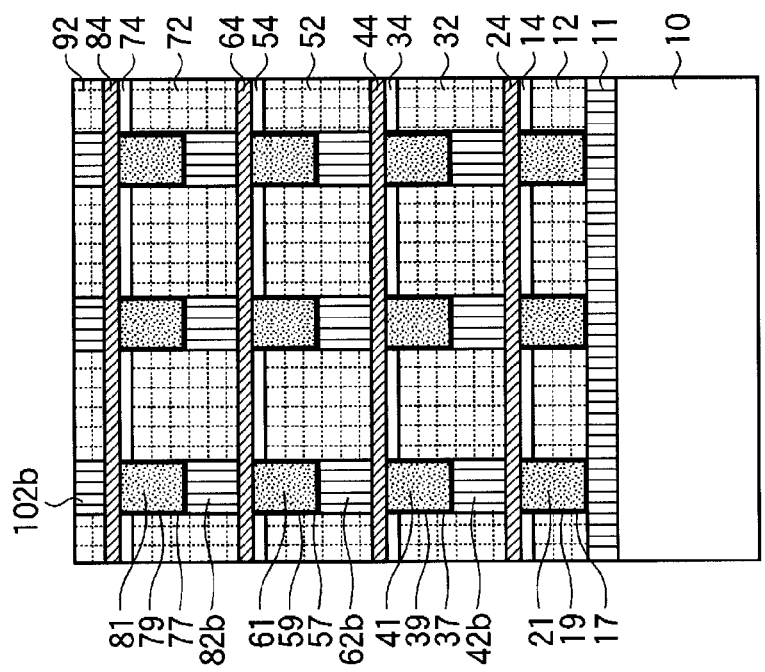

FIG. 14 is a view showing a second basic configuration of a semiconductor device according to an embodiment of the present invention. FIG. 15A shows a cross-sectional configuration of the semiconductor device cut along the A-A line of FIG. 14, and FIG. 15B shows a cross-sectional configuration of the semiconductor device cut along the B-B line of FIG. 14. FIG. 16A shows a cross-sectional configuration of the semiconductor device cut along the C-C line of FIG. 14, and FIG. 16B shows a cross-sectional configuration of the semiconductor device cut along the D-D line of FIG. 14. The second basic configuration has a wiring structure in which wirings extending substantially perpendicularly to each other intersect within the same surface.

As shown in FIGS. 14 to 16B, a $SiO_2$ film 11 is formed on the entire surface on a silicon substrate 10. On the $SiO_2$ film 11, for example, a low dielectric constant film 12 is formed using SiOC. On the low dielectric constant film 12, for example, a hard mask film 14 is formed using SiC. In the hard mask film 14 and the low dielectric constant film 12, a plurality of wiring grooves 16 parallel with each other are formed to extend in substantially parallel with the Y axis and a plurality of wiring grooves 17 parallel with each other are formed to extend in substantially parallel with the X axis. On inner wall surfaces of the plurality of wiring grooves 16, 17, for example, barrier metal layers 18, 19 are respectively formed using Ta. Within the wiring grooves 16 in which the barrier metal layers 18 are formed, for example, a Cu layer serving as a first layer wiring 20 is embedded. Similarly, within the wiring grooves 17 in which the barrier metal layers 19 are formed, for example, a Cu layer serving as a wiring 21 is embedded. The wirings 20, 21 intersect with each other within the same surface and configure a mesh-shaped wiring. On the entire substrate surface on the hard mask film 14 and the wirings 20, 21, for example, a cap film 24 is formed using SiC.

On the cap film 24, there are formed a plurality of reinforcement insulating films 42a respectively overlapping with the wiring 20 when viewed perpendicularly to the substrate surface and extending in substantially parallel with the Y axis, and a plurality of reinforcement insulating films 42b respectively overlapping with the wiring 21 when viewed perpendicularly to the substrate surface and extending in substantially parallel with the X axis. For example, the reinforcement insulating films 42a, 42b are formed using $SiO_2$ or the like and intersect with each other within the same surface. In an area other than formation areas of the reinforcement insulating films 42a, 42b on the cap film 24, for example, a low dielectric constant film 32 is formed using SiOC. The formation material of the reinforcement insulating films 42a, 42b has a higher specific dielectric constant and a larger elastic modulus than the formation material of the low dielectric constant film 32. On the low dielectric constant film 32, for example, a hard mask film 34 is formed using SiC. Immediately above the reinforcement insulating film 42a, a plurality of wiring grooves 36 are respectively formed to overlap with the reinforcement insulating film 42a and extend in substantially parallel with the Y axis. Immediately above the reinforcement insulating film 42b, a plurality of wiring grooves 37 are respectively formed to overlap with the reinforcement insulating film 42b and extend in substantially parallel with the X axis. On the inner wall surfaces of the plurality of wiring grooves 36, 37, for example, barrier metal layers 38, 39 are respectively formed using Ta. Within the wiring groove 36 in which the barrier metal layer 38 is formed, for example, a Cu layer serving as a second layer wiring 40 is embedded. Similarly, within the wiring groove 37 in which the barrier metal layer 39 is formed, for example, a Cu layer serving as a wiring 41 is embedded. The wiring 40 is arranged to overlap with the reinforcement insulating film 42a and the wiring 20 when viewed perpendicularly to the substrate surface and has the substantially same planar shape as the reinforcement insulating film 42a and the wiring 20. Moreover, the wiring 41 is arranged to overlap with the reinforcement insulating film 42b and the wiring 21 when viewed perpendicularly to the substrate surface and has the substantially same planar shape as the reinforcement insulating film 42b and the wiring 21. The wirings 40, 41 intersect with each other within the same surface and configure a mesh-shaped wiring. On the entire substrate surface on the hard mask film 34 and the wirings 40, 41, for example, a cap film 44 is formed using SiC.

On the cap film 44, there are formed a plurality of reinforcement insulating films 62a respectively overlapping with the wiring 40 when viewed perpendicularly to the substrate surface and extending in substantially parallel with the Y axis, and a plurality of reinforcement insulating films 62b respectively overlapping with the wiring 41 when viewed perpendicularly to the substrate surface and extending in substantially parallel with the X axis. For example, the reinforcement insulating films 62a, 62b are formed using $SiO_2$ or the like and intersect with each other within the same surface. In an area other than formation areas of the reinforcement insulating films 62a, 62b on the cap film 44, for example, a low dielectric constant film 52 is formed using SiOC. The formation material of the reinforcement insulating films 62a, 62b has a higher specific dielectric constant and a larger elastic modulus than the formation material of the low dielectric constant film 52. On the low dielectric constant film 52, for example, a hard mask film 54 is formed using SiC. Immediately above the reinforcement insulating film 62a, a plurality of wiring grooves 56 are respectively formed to overlap with the reinforcement insulating film 62a and extend in substantially parallel with the Y axis. Immediately above the reinforcement insulating film 62b, a plurality of wiring grooves 57 are respectively formed to overlap with the reinforcement insulating film 62b and extend in substantially parallel with the X axis. On the inner wall surfaces of the plurality of wiring grooves 56, 57, for example, barrier metal layers 58, 59 are respectively formed using Ta. Within the wiring groove 56 in which the barrier metal layer 58 is formed, for example, a Cu layer serving as a third layer wiring 60 is embedded. Similarly, within the wiring groove 57 in which the barrier metal layer 59 is formed, for example, a Cu layer serving as a wiring 61 is embedded. The wiring 60 is arranged to overlap with the reinforcement insulating film 62a and the wiring 40 when viewed perpendicularly to the substrate surface and has the substantially same planar shape as the reinforcement insulating film 62a and the wiring 40. Moreover, the wiring 61 is arranged to overlap with the reinforcement insulating film 62b and the wiring 41 when viewed perpendicularly to the substrate surface and has the substantially same planar shape as the reinforcement insulating film 62b and the wiring 41. The wirings 60, 61 intersect with each other within the same surface and configure a mesh-shaped wiring. On the entire substrate surface on the hard mask film 54 and the wirings 60, 61, for example, a cap film 64 is formed using SiC.

On the cap film 64, there are formed a plurality of reinforcement insulating films 82a respectively overlapping with the wiring 60 when viewed perpendicularly to the substrate surface and extending in substantially parallel with the Y axis, and a plurality of reinforcement insulating films 82b respectively overlapping with the wiring 61 when viewed perpendicularly to the substrate surface and extending in substantially parallel with the X axis. For example, the reinforcement insulating films 82a, 82b are formed using $SiO_2$ or the like and intersect with each other within the same surface. In an area other than formation areas of the reinforcement insulating films 82a, 82b on the cap film 64, for example, a low dielectric constant film 72 is formed using SiOC. The formation material of the reinforcement insulating films 82a, 82b has a higher specific dielectric constant and a larger elastic modulus than the formation material of the low dielectric constant film 72. On the low dielectric constant film 72, for example, a hard mask film 74 is formed using SiC. Immediately above the reinforcement insulating film 82a, a plurality of wiring grooves 76 are respectively formed to overlap with the reinforcement insulating film 82a and extend in substantially parallel with the Y axis. Immediately above the reinforcement insulating film 82b, a plurality of wiring grooves 77 are respectively formed to overlap with the reinforcement insulating film 82b and extend in substantially parallel with the X axis. On the inner wall surfaces of the plurality of wiring grooves 76, 77, for example, barrier metal layers 78, 79 are respectively formed using Ta. Within the wiring groove 76 in which the barrier metal layer 78 is formed, for example, a Cu layer serving as a fourth layer wiring 80 is embedded. Similarly, within the wiring groove 77 in which the barrier metal layer 79 is formed, for example, a Cu layer serving as a wiring 81 is embedded. The wiring 80 is arranged to overlap with the reinforcement insulating film 82a and the wiring 60 when viewed perpendicularly to the substrate surface and has the substantially same planar shape as the reinforcement insulating film 82a and the wiring 60. Moreover, the wiring 81 is arranged to overlap with the reinforcement insulating film 82b and the wiring 61 when viewed perpendicularly to the substrate surface and has the substantially same planar shape as the reinforcement insulating film 82b and the wiring 61. The wirings 80, 81 intersect with each other within the same surface and configure a mesh-shaped wiring. On the entire substrate surface on the hard mask film 74 and the wirings 80, 81, for example, a cap film 84 is formed using SiC.

On the cap film 84, there are formed a plurality of reinforcement insulating films 102a respectively overlapping with the wiring 80 when viewed perpendicularly to the substrate surface and extending in substantially parallel with the Y axis, and a plurality of reinforcement insulating films 102b respectively overlapping with the wiring 81 when viewed perpendicularly to the substrate surface and extending in substantially parallel with the X axis. For example, the reinforcement insulating films 102a, 102b are formed using SiO$_2$ or the like and intersect with each other within the same surface. In an area other than formation areas of the reinforcement insulating films 102a, 102b on the cap film 84, for example, a low dielectric constant film 92 is formed.

In the second basic configuration, the reinforcement insulating films 42a, 42b, 62a, 62b, 82a, 82b, 102a, 102b having the substantially same width as the wirings are formed immediately below or substantially immediately above the respective layer wirings 20, 21, 40, 41, 60, 61, 80, 81. These reinforcement insulating films 42a, 62a, 82a, 102a function as a plurality of first walls arranged at predetermined intervals along with the wirings 20, 40, 60, 80 (and FIG. 16B shows a section parallel with a wall surface of the first walls). Moreover, these reinforcement insulating films 42b, 62b, 82b, 102b function as a plurality of second walls, substantially orthogonal to the first walls, arranged at predetermined intervals along with the wirings 21, 41, 61, 81 (and FIG. 15B shows a section parallel with a wall surface of the second walls). The first and second walls do not include the low dielectric constant films 12, 32, 52, 72, 92. SiO$_2$ or the like serving as the formation material of the reinforcement insulating films 42a, 42b, 62a, 62b, 82a, 82b, 102a, 102b and Cu or the like serving as the formation material of the wirings 20, 21, 40, 41, 60, 61, 80, 81 have a lager elastic modulus as compared with SiOC or the like serving as the formation material of the low dielectric constant films 12, 32, 52, 72, 92. Therefore, the mechanical strength of the semiconductor device increases by providing the first and second walls substantially orthogonal to each other in a structure.

Figure 17:
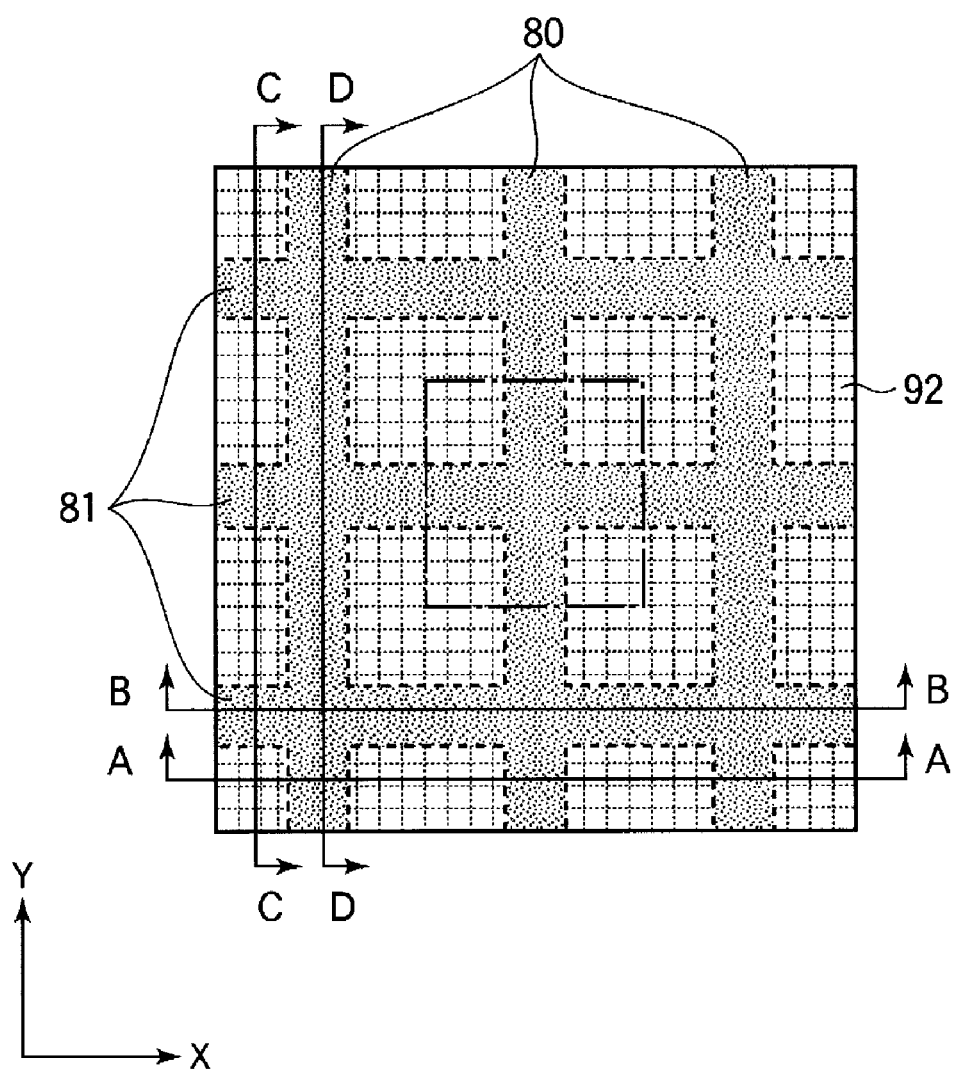
FIG. 17 is a view showing a configuration of a semiconductor device of a comparative example 3.
Figure 18B:
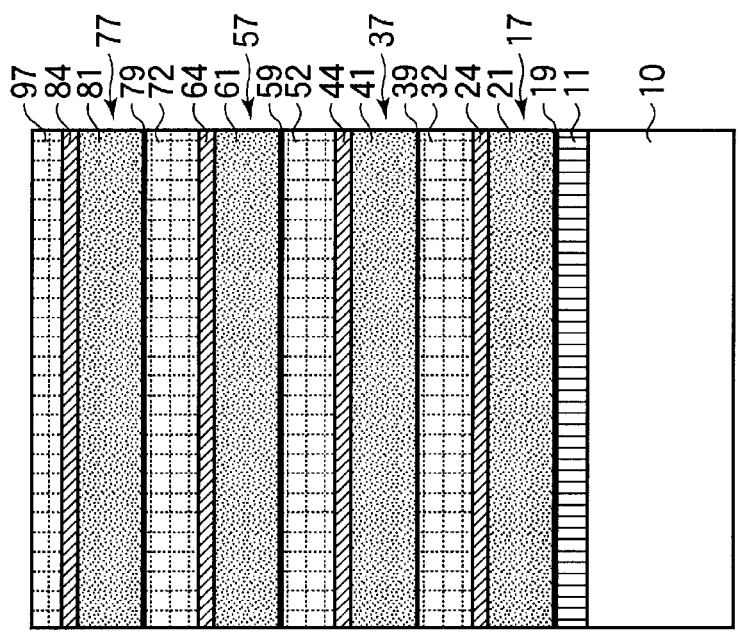
FIGS. 18A and 18B are cross-sectional views showing configuration of the semiconductor device of the comparative example 3.
Figure 18A:
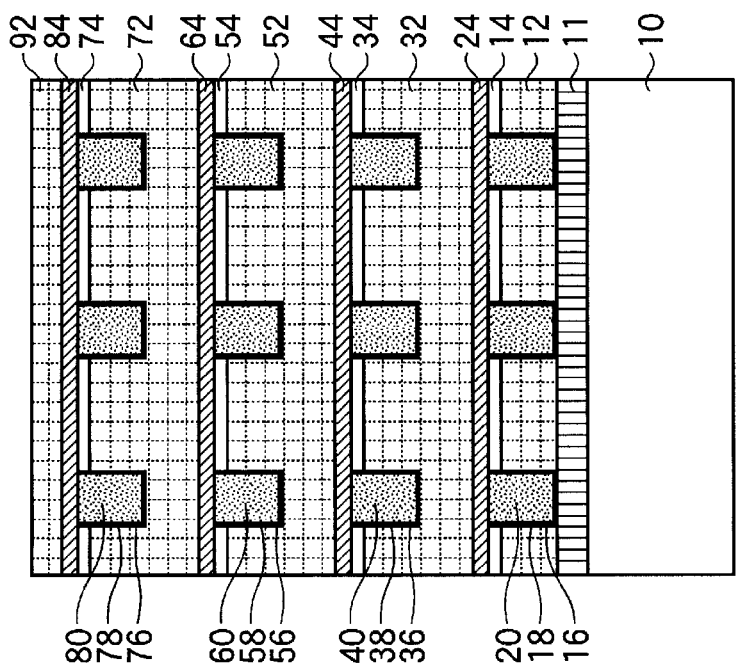

FIG. 17 shows a configuration of a semiconductor device as a comparative example 3 to the second basic configuration. FIG. 18A shows a cross-sectional configuration of the semiconductor device cut along the A-A line of FIG. 17, and FIG. 18B shows a cross-sectional configuration of the semiconductor device cut along the B-B line of FIG. 17. FIG. 19A shows a cross-sectional configuration of the semiconductor device cut along the C-C line of FIG. 17, and FIG. 19B shows a cross-sectional configuration of the semiconductor device cut along the D-D line of FIG. 17. In order to easily make a comparison with this embodiment, a wiring pattern of the comparative example 3 was the same as that of the second basic configuration as shown in FIGS. 14 to 16B. As shown in FIGS. 17 to 19B, the semiconductor device of the comparative example 3 is different from the second basic configuration in that an interlayer insulating film and an insulating film of an uppermost layer are configured with only the low dielectric constant films 12, 32, 52, 72, 92 without providing the reinforcement insulating films 42a, 42b, 62a, 62b, 82a, 82b, 102a, 102b.

Figure 20:
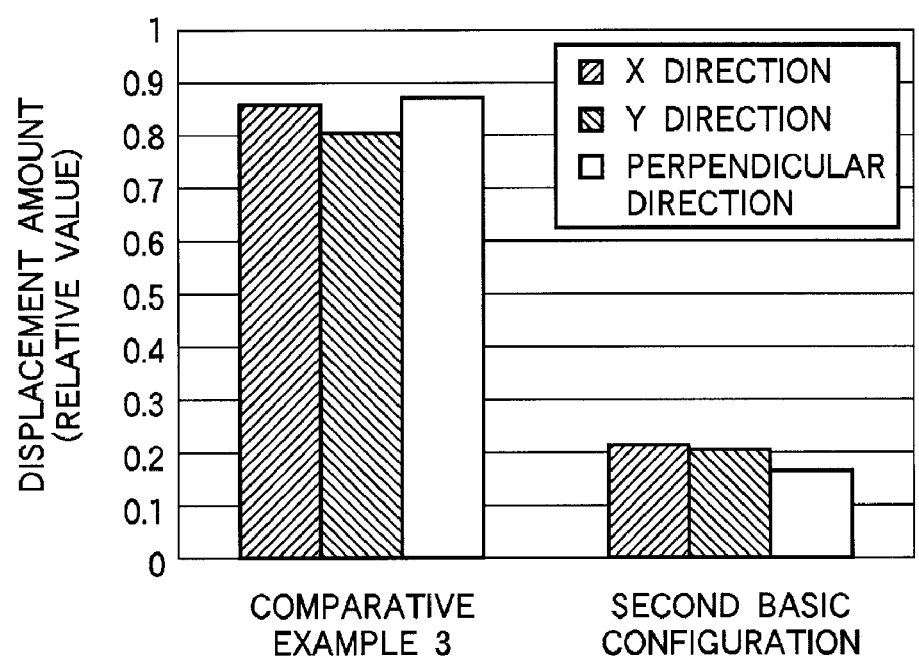
FIG. 20 is a graph showing computational results of displacement amounts when a load is applied in a substrate in-plane direction and a perpendicular direction with respect to the respective computational models.

FIG. 20 is a graph showing computational results of displacement amounts when the unit load is applied to the computational models in the substrate in-plane directions and the perpendicular direction with respect to computational models of the second basic configuration and the comparative example 3. The vertical axis of the graph represents the relative value of the displacement amount, and the displacement amount of the substrate in-plane direction (or the +X direction) of the comparative example 1 and the displacement amount of the perpendicular direction are respectively set to 1 (see FIG. 13). As shown in FIG. 20, it can be seen that the displacement amount of the second basic configuration is remarkably reduced in comparison with those of the comparative example 1 and the comparative example 3 even when the load is applied in any one of the substrate in-plane direction and the perpendicular direction.

Figure 21:
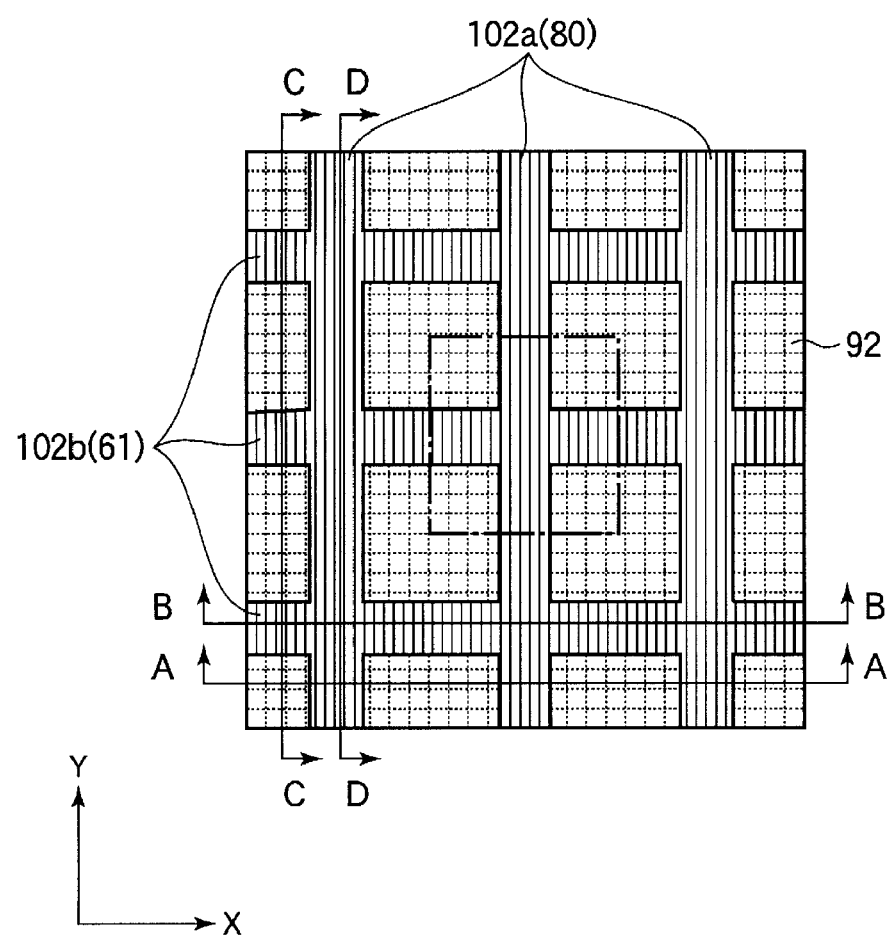
FIG. 21 is a view showing a third basic configuration of a semiconductor device according to an embodiment of the present invention.

FIG. 21 is a view showing a third basic configuration of a semiconductor device according to an embodiment of the present invention. FIG. 22A shows a cross-sectional configuration of the semiconductor device cut along the A-A line of FIG. 21, and FIG. 22B shows a cross-sectional configuration of the semiconductor device cut along the B-B line of FIG. 21. FIG. 23A shows a cross-sectional configuration of the semiconductor device cut along the C-C line of FIG. 21, and FIG. 23B shows a cross-sectional configuration of the semiconductor device cut along the D-D line of FIG. 21. In the third basic configuration, wirings extending substantially perpendicularly to each other are alternately arranged on a layer basis, first and third layer wirings extend in substantially parallel with the X axis, and second and fourth layer wirings extend in substantially parallel with the Y axis. The wirings extending substantially perpendicularly to each other intersect through an insulating film. Moreover, a reinforcement insulating film arranged immediately below each wiring and a reinforcement insulating film substantially orthogonal to a wiring within the same surface are formed in a grid shape.

As shown in FIGS. 21 to 23B, a SiO$_2$ film 11 is formed on the entire surface of a silicon substrate 10. On the SiO$_2$ film 11, a plurality of reinforcement insulating films 22a parallel with each other are formed to extend in substantially parallel with the Y axis. The reinforcement insulating films 22a are formed using, for example, SiO$_2$ or the like. In an area other than formation areas of the reinforcement insulating films 22a on the SiO$_2$ film 11, for example, a low dielectric constant film 12 is formed using SiOC. A formation material of the reinforcement insulating films 22a has a higher specific dielectric constant and a larger elastic modulus than the formation material of the low dielectric constant film 12. On the low dielectric constant film 12 and the reinforcement insulating film 22a, a hard mask film 14 is formed, for example, using SiC. In the hard mask film 14, the low dielectric constant film 12, and the reinforcement insulating film 22a, a plurality of wiring grooves 17 parallel with each other are formed to extend in substantially parallel with the X axis. On inner wall surfaces of the plurality of wiring grooves 17, for example, barrier metal layers 19 are respectively formed using Ta. Within the wiring groove 17 in which the barrier metal layer 19 is formed, for example, a Cu layer serving as a first layer wiring 21 is embedded. On the entire substrate surface on the hard mask film 14 and the wiring 21, for example, a cap film 24 is formed using SiC.

On the cap film 24, there are formed a plurality of reinforcement insulating films 42a respectively overlapping with the plurality of reinforcement insulating films 22a when viewed perpendicularly to the substrate surface and extending in substantially parallel with the Y axis, and a plurality of reinforcement insulating films 42b respectively overlapping with a plurality of wirings 21 when viewed perpendicularly to the substrate surface and extending in substantially parallel with the X axis. For example, the reinforcement insulating films 42a, 42b are formed using $SiO_2$ or the like and intersect with each other within the same surface. In an area other than formation areas of the reinforcement insulating films 42a, 42b on the cap film 24, for example, a low dielectric constant film 32 is formed using SiOC. A formation material of the reinforcement insulating films 42a, 42b has a higher specific dielectric constant and a larger elastic modulus than the formation material of the low dielectric constant film 32. On the low dielectric constant film 32 and the reinforcement insulating film 42b, a hard mask film 34 is formed, for example, using SiC. Immediately above the reinforcement insulating film 42a, a plurality of wiring grooves 36 are respectively formed to overlap with the reinforcement insulating film 42a and extend in substantially parallel with the Y axis. On inner wall surfaces of the plurality of wiring grooves 36, for example, barrier metal layers 38 are respectively formed using Ta. Within the wiring groove 36 in which the barrier metal layer 38 is formed, for example, a Cu layer serving as a second layer wiring 40 is embedded. The wiring 40 is arranged to overlap with the reinforcement insulating film 42a when viewed perpendicularly to the substrate surface and has the substantially same planar shape as the reinforcement insulating film 42a. Moreover, the wiring 40 intersects with the first layer wiring 21 through the reinforcement insulating film 42a and the cap film 24. On the entire substrate surface on the hard mask film 34 and the wiring 40, for example, a cap film 44 is formed using SiC.

On the cap film 44, there are formed a plurality of reinforcement insulating films 62a respectively overlapping with a plurality of wirings 40 when viewed perpendicularly to the substrate surface and extending in substantially parallel with the Y axis, and a plurality of reinforcement insulating films 62b respectively overlapping with the plurality of reinforcement insulating films 42b when viewed perpendicularly to the substrate surface and extending in substantially parallel with the X axis. For example, the reinforcement insulating films 62a, 62b are formed using $SiO_2$ or the like and intersect with each other within the same surface. In an area other than formation areas of the reinforcement insulating films 62a, 62b on the cap film 44, for example, a low dielectric constant film 52 is formed using SiOC. A formation material of the reinforcement insulating films 62a, 62b has a higher specific dielectric constant and a larger elastic modulus than the formation material of the low dielectric constant film 52. On the low dielectric constant film 52 and the reinforcement insulating film 62a, a hard mask film 54 is formed, for example, using SiC. Immediately above the reinforcement insulating film 62b, a plurality of wiring grooves 57 are formed to overlap with the reinforcement insulating film 62b and extend in substantially parallel with the X axis. On inner wall surfaces of the plurality of wiring grooves 57, for example, barrier metal layers 59 are respectively formed using Ta. Within the wiring groove 57 in which the barrier metal layer 59 is formed, for example, a Cu layer serving as a third layer wiring 61 is embedded. The wiring 61 is arranged to overlap with the reinforcement insulating film 62b when viewed perpendicularly to the substrate surface and has the substantially same planar shape as the reinforcement insulating film 62b. Moreover, the wiring 61 intersects with the second layer wiring 40 through the reinforcement insulating film 62b and the cap film 44. On the entire substrate surface on the hard mask film 54 and the wiring 61, for example, a cap film 64 is formed using SiC.

On the cap film 64, there are formed a plurality of reinforcement insulating films 82a respectively overlapping with the plurality of reinforcement insulating films 62a when viewed perpendicularly to the substrate surface and extending in substantially parallel with the Y axis, and a plurality of reinforcement insulating films 82b respectively overlapping with a plurality of wirings 61 when viewed perpendicularly to the substrate surface and extending in substantially parallel with the X axis. For example, the reinforcement insulating films 82a, 82b are formed using $SiO_2$ or the like and intersect with each other within the same surface. In an area other than formation areas of the reinforcement insulating films 82a, 82b on the cap film 64, for example, a low dielectric constant film 72 is formed using SiOC. A formation material of the reinforcement insulating films 82a, 82b has a higher specific dielectric constant and a larger elastic modulus than the formation material of the low dielectric constant film 72. On the low dielectric constant film 72 and the reinforcement insulating film 82b, a hard mask film 74 is formed, for example, using SiC. Immediately above the reinforcement insulating film 82a, a plurality of wiring grooves 76 are respectively formed to overlap with the reinforcement insulating film 82a and extend in substantially parallel with the Y axis. On inner wall surfaces of the plurality of wiring grooves 76, for example, barrier metal layers 78 are respectively formed using Ta. Within the wiring groove 76 in which the barrier metal layer 78 is formed, for example, a Cu layer serving as a fourth layer wiring 80 is embedded. The wiring 80 is arranged to overlap with the reinforcement insulating film 82a when viewed perpendicularly to the substrate surface and has the substantially same planar shape as the reinforcement insulating film 82a. Moreover, the wiring 80 intersects with the third layer wiring 61 through the reinforcement insulating film 82a and the cap film 64. On the entire substrate surface on the hard mask film 74 and the wiring 80, for example, a cap film 84 is formed using SiC.

On the cap film 84, there are formed a plurality of reinforcement insulating films 102a respectively overlapping with a plurality of wirings 80 when viewed perpendicularly to the substrate surface and extending in substantially parallel with the Y axis, and a plurality of reinforcement insulating films 102b respectively overlapping with the plurality of reinforcement insulating films 82b when viewed perpendicularly to the substrate surface and extending in substantially parallel with the X axis. For example, the reinforcement insulating films 102a, 102b are formed using $SiO_2$ or the like and intersect with each other within the same surface. In an area other than formation areas of the reinforcement insulating films 102a, 102b on the cap film 84, for example, a low dielectric constant film 92 is formed.

In the third basic configuration, the reinforcement insulating films 42a, 62b, 82a, 102a having the substantially same width as the wirings are formed immediately below or substantially immediately above the respective layer wirings 40, 61, 80. Moreover, the reinforcement insulating films 22a, 42b, 62a, 82b are formed to be substantially orthogonal to the respective wirings 21, 40, 61, 80 within the same surface. The wirings 21, 61 and the reinforcement insulating films 42b, 82b, 102b function as a plurality of first walls arranged at predetermined intervals (and FIG. 22B shows a section parallel with a wall surface of the first walls). Moreover, the wirings 40, 80 and the reinforcement insulating films 22a, 62a function as a plurality of second walls, substantially orthogonal to the first walls, arranged at predetermined intervals (and FIG. 23B shows a section parallel with a wall surface of the second walls). SiO$_2$ or the like serving as the formation material of the reinforcement insulating films 22a, 42a, 42b, 62a, 62b, 82a, 82b, 102a and Cu or the like serving as the formation material of the wirings 21, 40, 61, 80 have a lager elastic modulus in comparison with SiOC or the like serving as the formation material of the low dielectric constant films 12, 32, 52, 72, 92. Therefore, the mechanical strength of the semiconductor device increases by providing the first and second walls substantially orthogonal to each other in a structure.

Figure 24:
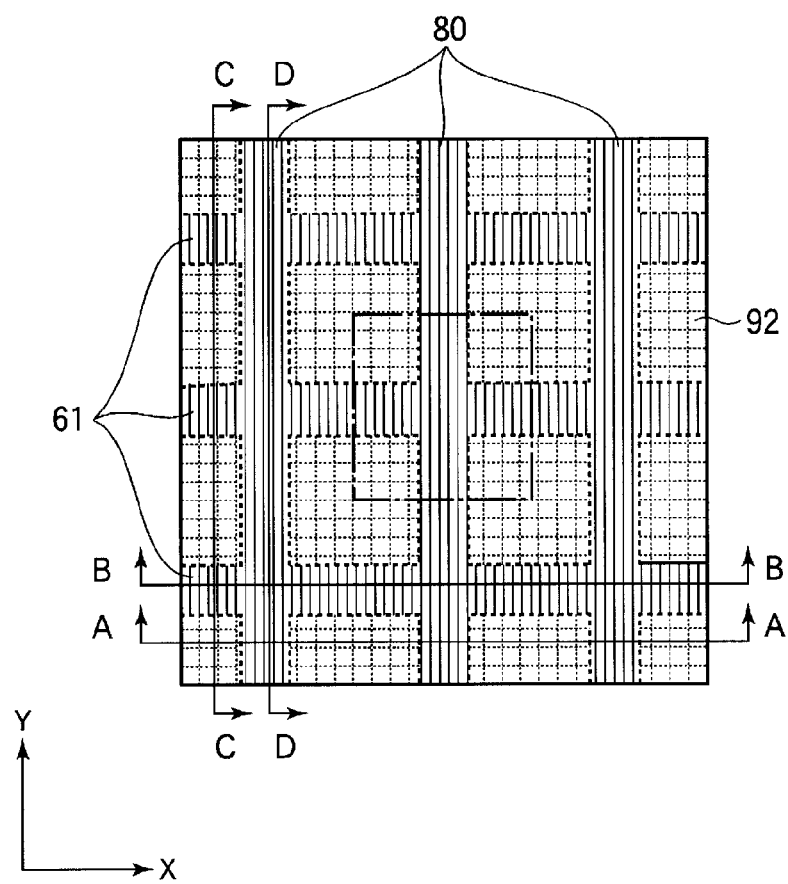
FIG. 24 is a view showing a fourth basic configuration of a semiconductor device according to an embodiment of the present invention.
Figure 26A:
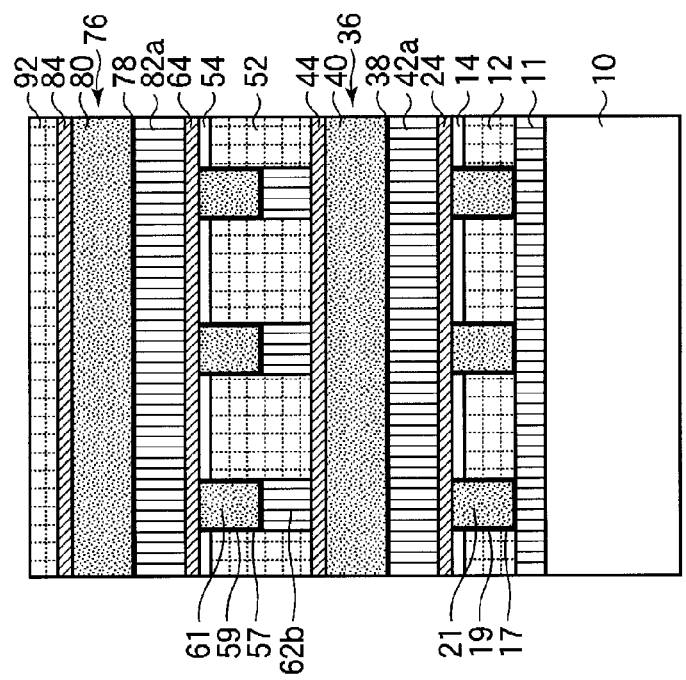
FIGS. 26A and 26B are cross-sectional views showing the fourth basic configuration of the semiconductor device according to the embodiment of the present invention.
Figure 26B:
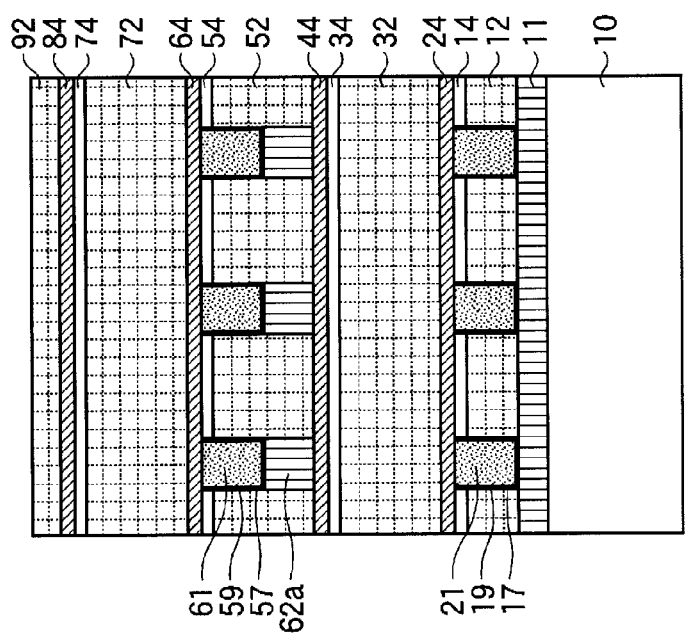

FIG. 24 shows a fourth basic configuration of the semiconductor device according to this embodiment. FIG. 25A shows a cross-sectional configuration of the semiconductor device cut along the A-A line of FIG. 24, and FIG. 25B shows a cross-sectional configuration of the semiconductor device cut along the B-B line of FIG. 24. FIG. 26A shows a cross-sectional configuration of the semiconductor device cut along the C-C line of FIG. 24, and FIG. 26B shows a cross-sectional configuration of the semiconductor device cut along the D-D line of FIG. 24. Like the third basic configuration, the fourth basic configuration has a wiring structure in which wirings extending substantially orthogonally to each other intersect through an insulating film. In this regard, a reinforcement insulating film is only formed immediately below each wiring in the fourth basic configuration.

As shown in FIGS. 24 to 26B, a SiO$_2$ film 11 is formed on the entire surface on a silicon substrate 10. On the SiO$_2$ film 11, for example, a low dielectric constant film 12 is formed using SiOC. On the low dielectric constant film 12, for example, a hard mask film 14 is formed using SiC. In the hard mask film 14 and the low dielectric constant film 12, a plurality of wiring grooves 17 parallel with each other are formed to extend in substantially parallel with the X axis. On inner wall surfaces of the plurality of wiring grooves 17, for example, barrier metal layers 19 are respectively formed using Ta. Within the wiring groove 17 in which the barrier metal layer 19 is formed, for example, a Cu layer serving as a first layer wiring 21 is embedded. On the entire substrate surface on the hard mask film 14 and the wiring 21, for example, a cap film 24 is formed using SiC.

On the cap film 24, a plurality of reinforcement insulating films 42a extending in substantially parallel with the Y axis are formed. For example, the reinforcement insulating films 42a are formed using SiO$_2$ or the like. In an area other than formation areas of the reinforcement insulating films 42a on the cap film 24, for example, a low dielectric constant film 32 is formed using SiOC. The formation material of the reinforcement insulating films 42a has a higher specific dielectric constant and a larger elastic modulus than the formation material of the low dielectric constant film 32. On the low dielectric constant film 32, for example, a hard mask film 34 is formed using SiC. On the reinforcement insulating film 42a, a plurality of wiring grooves 36 are respectively formed to overlap with the reinforcement insulating film 42a and extend in substantially parallel with the Y axis. On the inner wall surfaces of the plurality of wiring grooves 36, for example, barrier metal layers 38 are respectively formed using Ta. Within the wiring groove 36 in which the barrier metal layer 38 is formed, for example, a Cu layer serving as a second layer wiring 40 is embedded. The wiring 40 is arranged to overlap with the reinforcement insulating film 42a when viewed perpendicularly to the substrate surface and has the substantially same planar shape as the reinforcement insulating film 42a. Moreover, the wiring 40 intersects with the first layer wiring 21 through the reinforcement insulating film 42a and the cap film 24. On the entire substrate surface on the hard mask film 34 and the wiring 40, for example, a cap film 44 is formed using SiC.

On the cap film 44, a plurality of reinforcement insulating films 62b extending in substantially parallel with the X axis are formed. For example, the reinforcement insulating films 62b are formed using SiO$_2$ or the like. In an area other than formation areas of the reinforcement insulating films 62b on the cap film 44, for example, a low dielectric constant film 52 is formed using SiOC. The formation material of the reinforcement insulating films 62b has a higher specific dielectric constant and a larger elastic modulus than the formation material of the low dielectric constant film 52. On the low dielectric constant film 52, for example, a hard mask film 54 is formed using SiC. On the reinforcement insulating film 62b, a plurality of wiring grooves 57 are respectively formed to overlap with the reinforcement insulating film 62b and extend in substantially parallel with the X axis. On the inner wall surfaces of the plurality of wiring grooves 57, for example, barrier metal layers 59 are respectively formed using Ta. Within the wiring groove 57 in which the barrier metal layer 59 is formed, for example, a Cu layer serving as a third layer wiring 61 is embedded. The wiring 61 is arranged to overlap with the reinforcement insulating film 62b when viewed perpendicularly to the substrate surface and has the substantially same planar shape as the reinforcement insulating film 62b. Moreover, the wiring 61 intersects with the second layer wiring 40 through the reinforcement insulating film 62b and the cap film 44. On the entire substrate surface on the hard mask film 54 and the wiring 61, for example, a cap film 64 is formed using SiC.

On the cap film 64, a plurality of reinforcement insulating films 82a extending in substantially parallel with the Y axis are formed. For example, the reinforcement insulating films 82a are formed using SiO$_2$ or the like. In an area other than formation areas of the reinforcement insulating films 82a on the cap film 64, for example, a low dielectric constant film 72 is formed using SiOC. The formation material of the reinforcement insulating films 82a has a higher specific dielectric constant and a larger elastic modulus than the formation material of the low dielectric constant film 72. On the low dielectric constant film 72, for example, a hard mask film 74 is formed using SiC. On the reinforcement insulating film 82a, a plurality of wiring grooves 76 are respectively formed to overlap with the reinforcement insulating film 82a and extend in substantially parallel with the Y axis. On the inner wall surfaces of the plurality of wiring grooves 76, for example, barrier metal layers 78 are respectively formed using Ta. Within the wiring groove 76 in which the barrier metal layer 78 is formed, for example, a Cu layer serving as a fourth layer wiring 80 is embedded. The wiring 80 is arranged to overlap with the reinforcement insulating film 82a when viewed perpendicularly to the substrate surface and has the substantially same planar shape as the reinforcement insulating film 82a. Moreover, the wiring 80 intersects with the third layer wiring 61 through the reinforcement insulating film 82a and the cap film 64. On the entire substrate surface on the hard mask film 74 and the wiring 80, for example, a cap film 84 is formed using SiC. A low dielectric constant film 92 is formed on the entire surface of the cap film 84.

Figure 27:
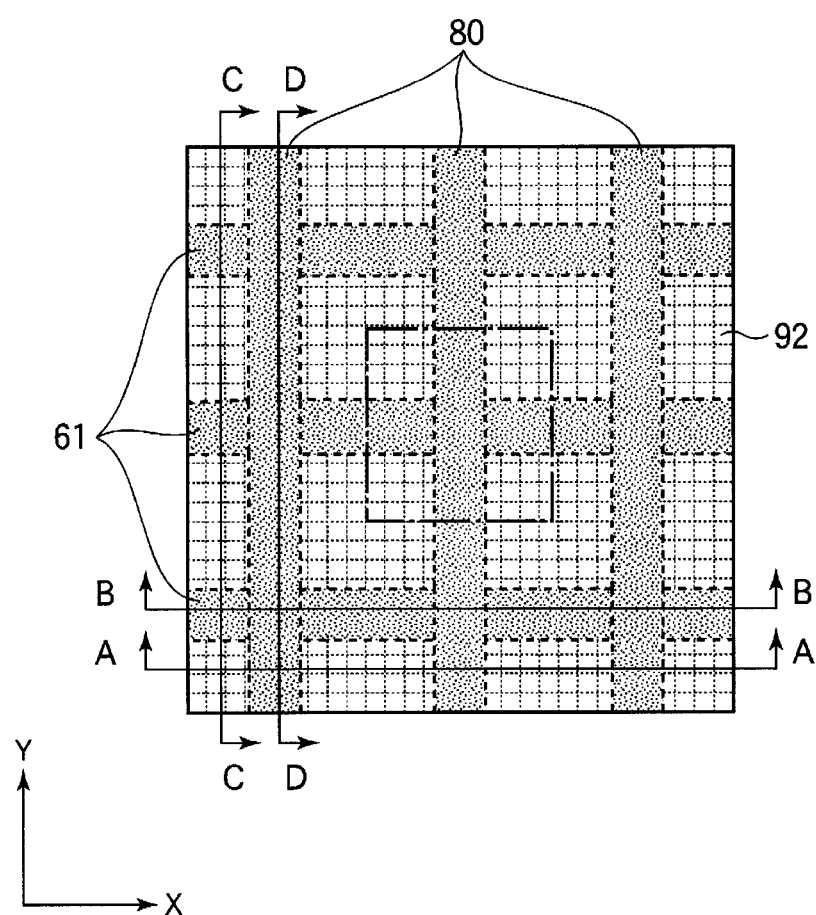
FIG. 27 is a view showing a configuration of a semiconductor device of a comparative example 4.
Figure 28B:
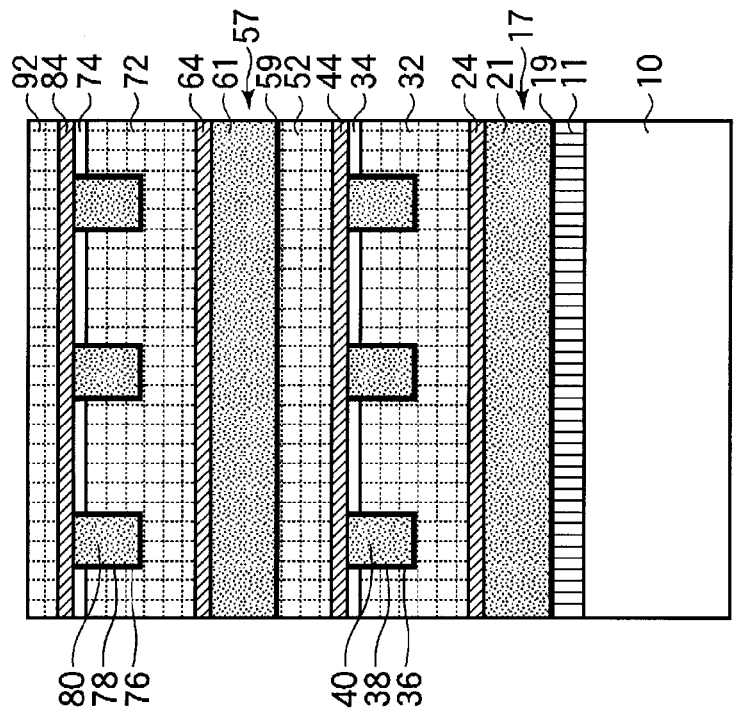
FIGS. 28A and 28B are cross-sectional views showing the configuration of the semiconductor device of the comparative example 4.
Figure 28A:
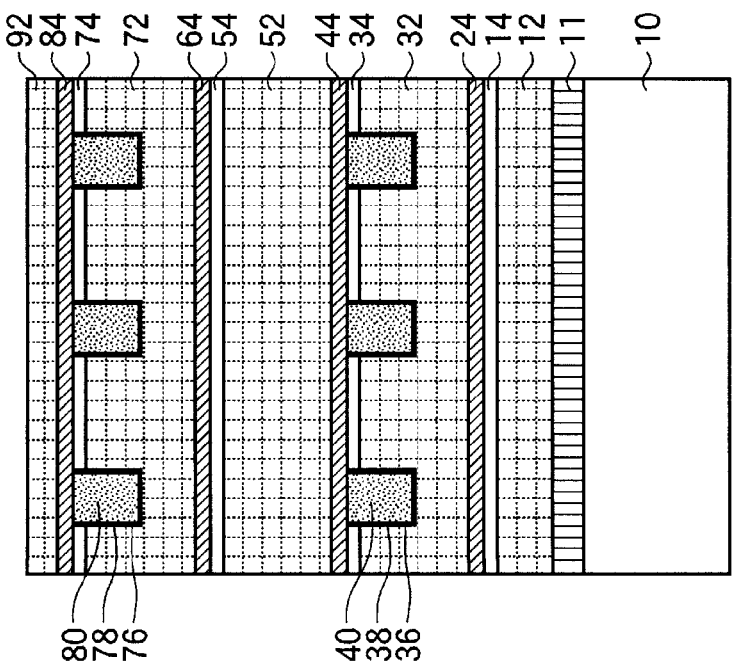

FIG. 27 shows a configuration of a semiconductor device as a comparative example 4 to the third and fourth basic configurations. FIG. 28A shows a cross-sectional configuration of the semiconductor device cut along the A-A line of FIG. 27, and FIG. 28B shows a cross-sectional configuration of the semiconductor device cut along the B-B line of FIG. 27.

Figure 29A:
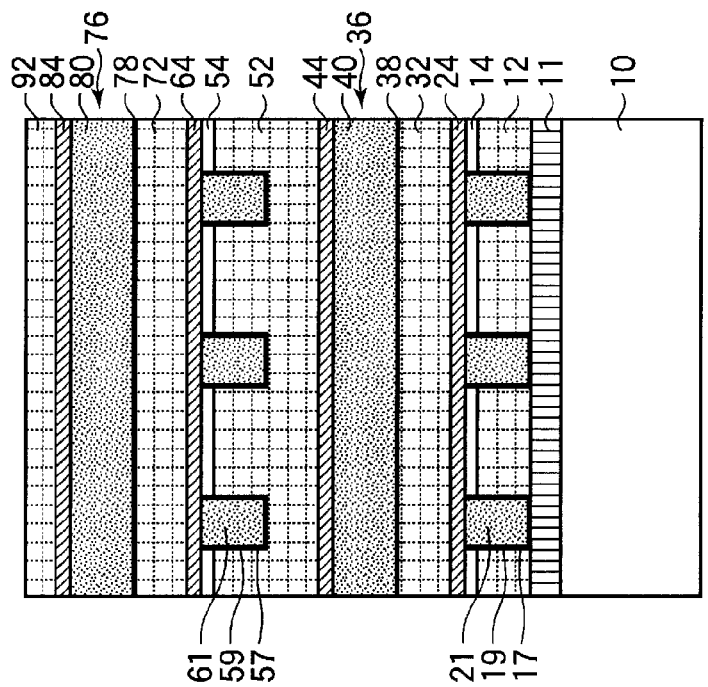
FIGS. 29A and 29B are cross-sectional views showing the configuration of the semiconductor device of the comparative example 4.
Figure 29B:
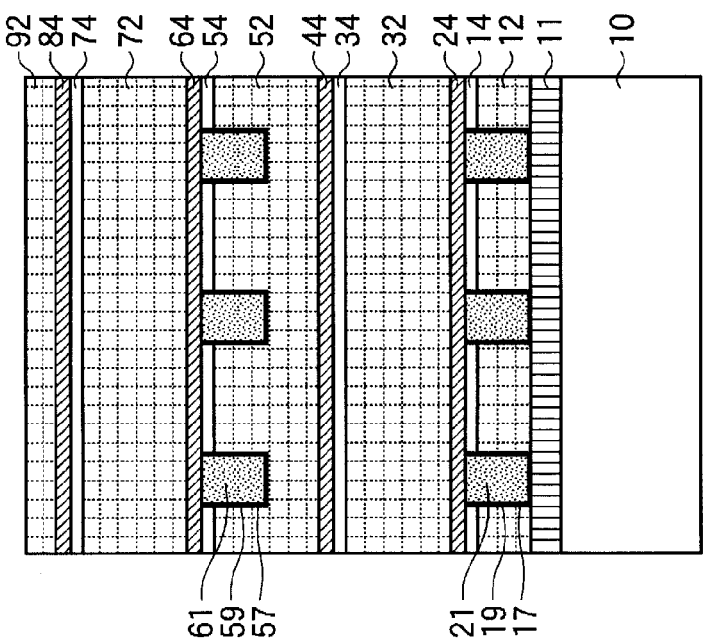

FIG. 29A shows a cross-sectional configuration of the semiconductor device cut along the C-C line of FIG. 27, and FIG. 29B shows a cross-sectional configuration of the semiconductor device cut along the D-D line of FIG. 27. In order to easily make a comparison with this embodiment, a wiring pattern of the comparative example 4 was the same as those of the third and fourth basic configurations. As shown in FIGS. 27 to 29B, the semiconductor device of the comparative example 4 is different from the third and fourth basic configurations in that an interlayer insulating film and an insulating film of an uppermost layer are configured with only the low dielectric constant films 12, 32, 52, 72, 92 without providing the reinforcement insulating films 22a, 42a, 42b, 62a, 62b, 82a, 82b, 102a, 102b.

Figure 30:
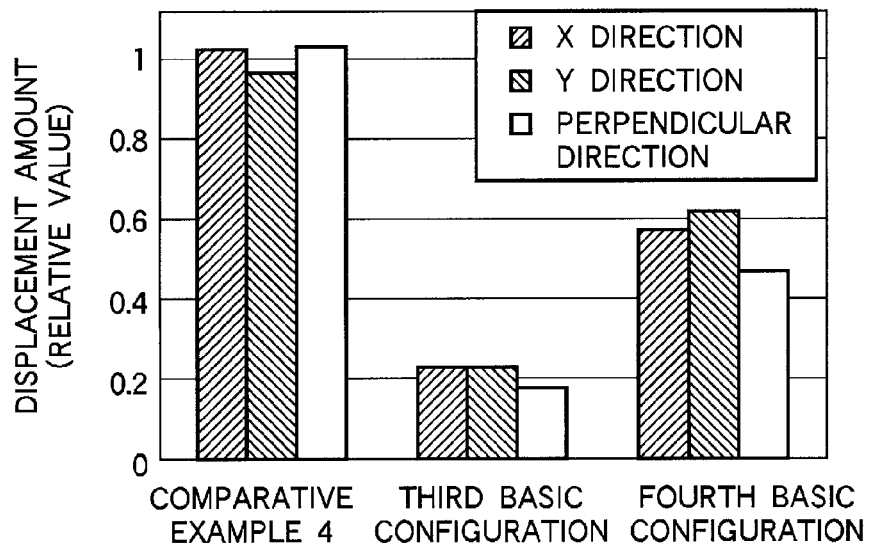
FIG. 30 is a graph showing computational results of displacement amounts when a load is applied in a substrate in-plane direction and a perpendicular direction with respect to the respective computational models.

FIG. 30 is a graph showing computational results of displacement amounts when a load is applied to the computational models in a substrate in-plane direction and a perpendicular direction with respect to computational models of the third and fourth basic configurations and the comparative example 4. The vertical axis of the graph represents the relative value of the displacement amount, and the displacement amount of the substrate in-plane direction (or the +X direction) of the above-described comparative example 1 and the displacement amount of the perpendicular direction are respectively set to 1 (see FIG. 13). Since the first and second walls substantially orthogonal to each other are provided as a structure in the third basic configuration as shown in FIG. 30, it can be seen that the displacement amount is significantly reduced in comparison with that of the comparative example 4 even when the load is applied in any one of the substrate in-plane direction and the perpendicular direction. On the other hand, it can be seen that the fourth basic configuration has a slightly smaller displacement amount than the comparative example 4, but has a smaller reduction effect in comparison with the third basic configuration. This is because, in the fourth basic configuration, the reinforcement insulating films 42a, 62b, 82a are only formed immediately below the wirings 40, 61, 80 without forming the reinforcement insulating films orthogonal to the respective wirings 21, 40, 61, 80 within the same surface, and the structure is not formed in a full wall shape. In this regard, since the wirings 40, 61, 80 (or the wiring grooves 36, 57, 76) and the reinforcement insulating films 42a, 62b, 82a are formed using the same photo mask in the fourth basic configuration as described below, the manufacturing process is further simplified than that of the third basic configuration.

According to the first to fourth basic configurations of this embodiment as described above, the displacement amount is significantly reduced even when a load is applied in any one of the substrate in-plane direction and the perpendicular direction, and the high mechanical strength is achieved. Since a large number of dummy stack vias 86 (of an area ratio of about 15% or more to the total area) need to be arranged so as to secure the mechanical strength to the load of the perpendicular direction in the comparative example 2 as shown in FIGS. 7 and 8, the design freedom degree is not necessarily high. In a general semiconductor device as compared with this, wirings commonly intersect within the same surface as in the second basic configuration, or wirings commonly intersect through an insulating film as in the third and fourth basic configurations in many cases. Consequently, in an area of a high wiring density, the reinforcement insulating films 22b, 42b, 62b, 82b without overlapping with the wirings as in the first basic configuration do not need to be intentionally arranged. Therefore, the design freedom degree is relatively high in this embodiment.

Figure 31:
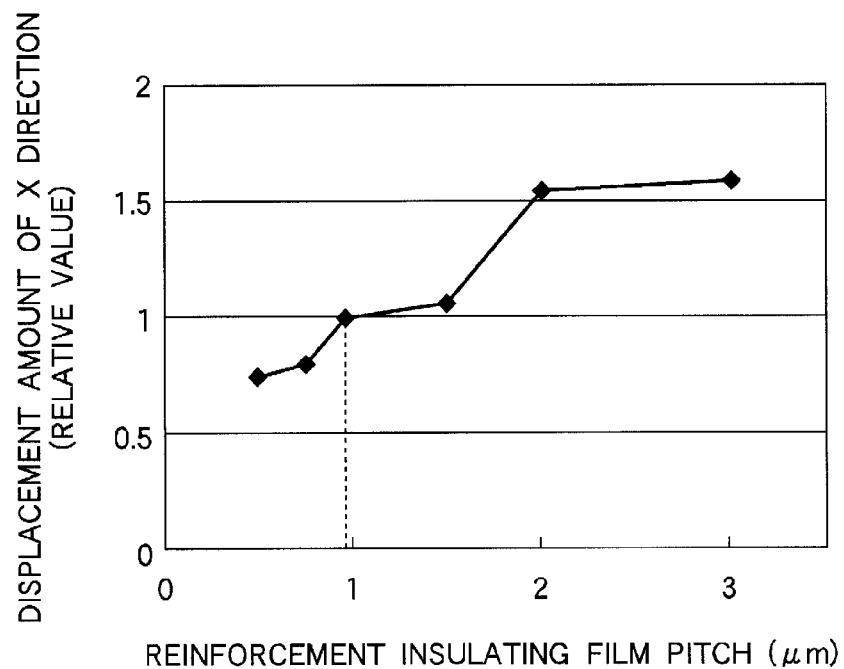
FIG. 31 is a graph showing a variation of a displacement amount to a load when a pitch of a reinforcement insulating film is varied.

When varying an arrangement density of the reinforcement insulating films 22b, 42b, 62b, 82b, 102b arranged to be orthogonal to the wirings 20, 40, 60, 80 within the same surface and to be in parallel to the X axis using the first basic configuration of this embodiment, an examination was made on how the displacement amount to the load of the X direction was varied. FIG. 31 is a graph showing a variation of the displacement amount to the load of the X direction when the pitch of the reinforcement insulating films 22b, 42b, 62b, 82b, 102b is varied from 0.5 μm to 3 μm. The horizontal axis of the graph represents the pitch (μm) of the reinforcement insulating films 22b, 42b, 62b, 82b, 102b. The vertical axis represents the relative value of the displacement amount of the X axis direction and the displacement amount is set to 1 when the pitch is 0.98 μm (in the same condition as that of the computational results shown in FIG. 13). The pitch of the wirings 20, 40, 60, 80 is fixed. As shown in FIG. 31, the reduction effect of the displacement amount is large if the pitch of the reinforcement insulating films 22b, 42b, 62b, 82b, 102b is less than or equal to approximately 1.5 μm, and the reduction effect is relatively small if the pitch exceeds 1.5 μm. These results do not depend upon a scale of the computation model. That is, the computation itself is identical and the displacement amount is also identical, for example, even when the total size increases 10 times. The LSI structure is scaled on the basis of a minimum wiring width in both the perpendicular direction and the substrate in-plane direction even when the generation is changed. This can be seen from that the ITRS is specified in the minimum wiring pitch and the minimum wiring width. For this reason, from the computational results, it can be seen that it is effective that the pitch of the reinforcement insulating film is set to less than or equal to approximately 10 times the minimum wiring pitch (0.14 μm) as a target for the case where the reinforcement insulating film is arranged.

Figure 32:
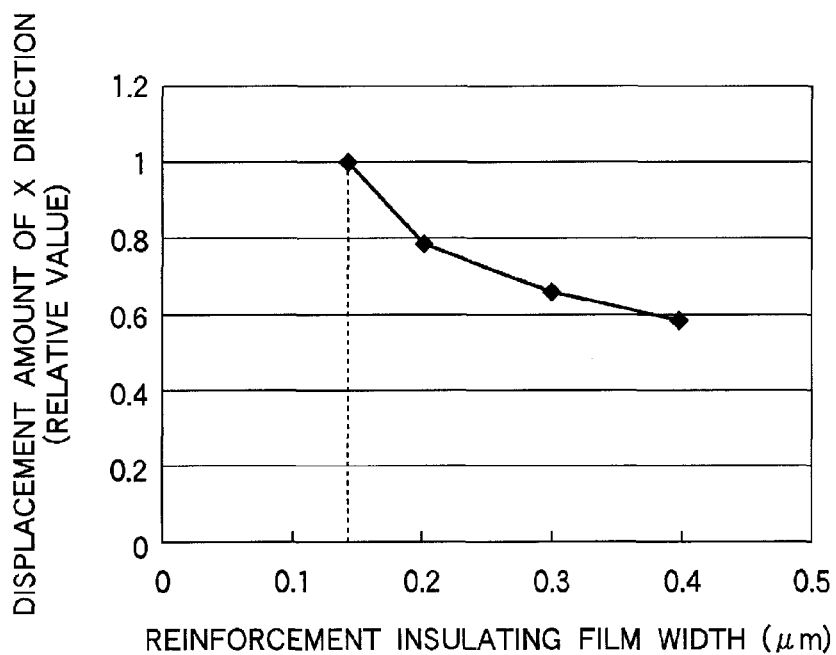
FIG. 32 is a graph showing a variation of a displacement amount to a load when a width of a reinforcement insulating film is varied.

FIG. 32 is a graph showing a variation of the displacement amount to the load of the X direction when the width of the reinforcement insulating films 22b, 42b, 62b, 82b, 102b is varied. The horizontal axis of the graph represents the width (μm) of the reinforcement insulating films 22b, 42b, 62b, 82b, 102b. The vertical axis represents the relative value of the displacement amount of the X axis direction and the displacement amount is set to 1 when the spacing is 0.14 μm (in the same condition as that of the computational results shown in FIG. 13). As shown in FIG. 32, the durability to the load is improved since the structure is mechanically strengthened as the width of the reinforcement insulating films 22b, 42b, 62b, 82b, 102b is large. In this regard, when the width is too large, the design constraint increases and the inter-wiring capacitance increases. As seen from FIG. 32, the reduction effect of the displacement amount significantly increases when the width of the reinforcement insulating films 22b, 42b, 62b, 82b, 102b increases from 0.14 μm to 0.2 μm, but the reduction effect of the displacement amount is slightly reduced when the width is larger than 0.2 μm. Consequently, it can be seen that it is effective to set the width of the reinforcement insulating film to be equal to or more than approximately 1.5 times the minimum wiring width (0.14 μm) and more preferably to be approximately 1.5 times the minimum wiring width.

When an arrangement position of the reinforcement insulating films 22b, 42b, 62b, 82b, 102b is determined on the basis of these, they are first inserted into the substantial center between the adjacent wirings 20, 40, 60, 80 (or between the adjacent reinforcement insulating films 22a, 42a, 62a, 82a, 102a) in substantially parallel with the wirings 20, 40, 60, 80. When the pitch is wide among the inserted reinforcement insulating films 22b, 42b, 62b, 82b, 102b and the wirings 20, 40, 60, 80, the number of insertions increases. On the basis of the above-described rule by repeating this, the reinforcement insulating films 22b, 42b, 62b, 82b, 102b are inserted at an appropriate pitch and width. Similarly, the reinforcement insulating films 22b, 42b, 62b, 82b, 102b orthogonal to the wirings 20, 40, 60, 80 are arranged at an appropriate pitch and width. The wirings 20, 40, 60, 80 and the reinforcement insulating films 42a, 62a, 82a, 102a overlapping therewith are arranged at an appropriate width based on each wiring layer. Since a load applied in a fabrication process is large in an area overlapping with a bonding pad and a ball grid, it is preferable to laminate and arrange the reinforcement insulating films 22b, 42b, 62b, 82b, 102b at a relatively high arrangement density based on the load.

Figure 33:
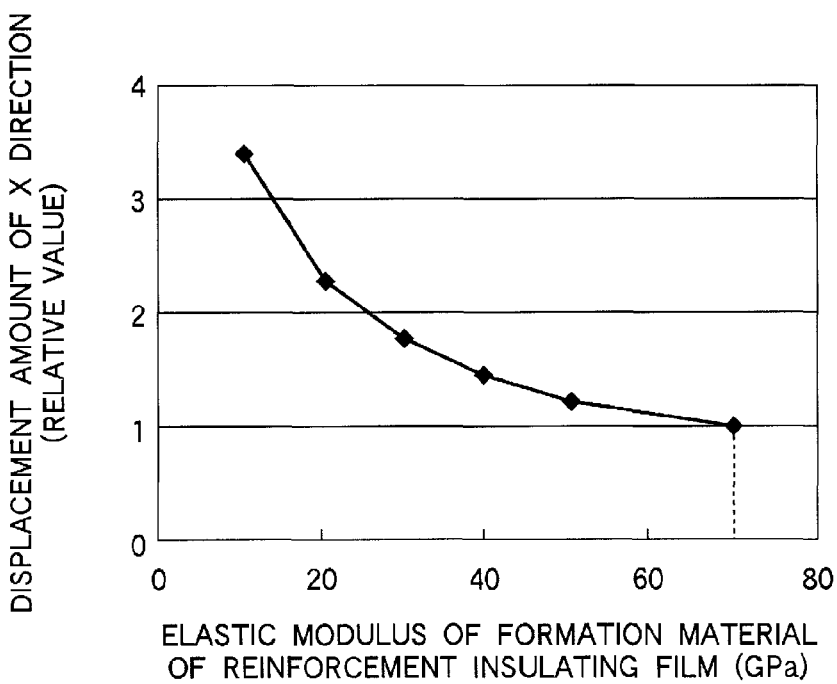
FIG. 33 is a graph showing a variation of a displacement amount to a load when an elastic modulus of a formation material of a reinforcement insulating film is varied.

In the first basic configuration, the reinforcement insulating films 22b, 42b, 62b, 82b, 102b formed using $SiO_2$ are used as a second reinforcement layer without overlapping with the wirings 20, 40, 60, 80. However, if the second reinforcement layer is more mechanically strengthened than the low dielectric constant films 12, 32, 52, 72, 92, the $SiO_2$ film does not need to be necessarily used. When varying an elastic modulus of a formation material of the reinforcement insulating films 22b, 42b, 62b, 82b, 102b, a computation was made on how the displacement amount was varied with respect to the load. FIG. 33 is a graph showing a variation of the displacement amount to the load of the X direction when the elastic modulus of the formation material of the reinforcement insulating films 22b, 42b, 62b, 82b, 102b is varied. The horizontal axis of the graph represents the elastic modulus (GPa) of the formation material of the reinforcement insulating films 22b, 42b, 62b, 82b, 102b. The vertical axis represents the relative value of the displacement amount of the X direction and the displacement amount is set to 1 when the $SiO_2$ film (of the elastic modulus of 70 GPa) is used. As shown in FIG. 33, it can be seen that a distortion to the load increases and the reduction effect of the displacement amount decreases as the elastic modulus of the formation material of the reinforcement insulating films 22b, 42b, 62b, 82b, 102b decreases. It can be considered that the elastic modulus of the formation material of the reinforcement insulating films 22b, 42b, 62b, 82b, 102b should be equal to or greater than 30 GPa since it is preferable to set the relative value of the displacement amount to be less than or equal to approximately 2 when the displacement amount is suppressed to about half the displacement amount of the comparative example 1 shown in FIG. 13.

Figure 34:
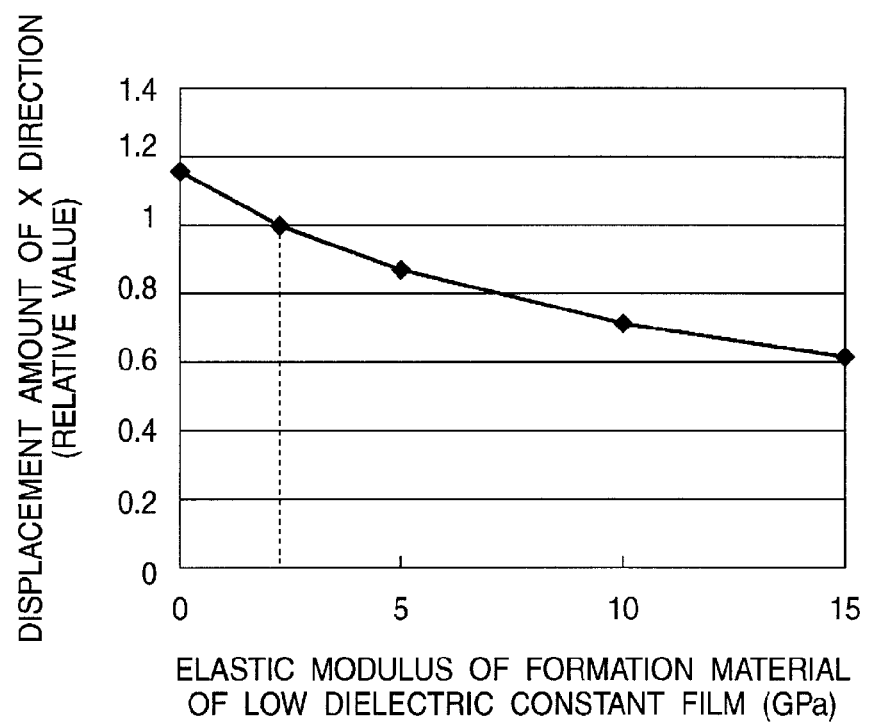
FIG. 34 is a graph showing a variation of a displacement amount to a load when an elastic modulus of a formation material of a low dielectric constant film is varied.

In the first basic configuration, the elastic modulus of the formation material of the low dielectric constant films 12, 32, 52, 72, 92 was set to 2.25 GPa. When varying an elastic modulus of the formation material of the low dielectric constant films 12, 32, 52, 72, 92, a computation was made on how the displacement amount was varied with respect to the load. FIG. 34 is a graph showing a variation of the displacement amount to the load of the X direction when the elastic modulus of the formation material of the low dielectric constant films 12, 32, 52, 72, 92 is varied. The horizontal axis of the graph represents the elastic modulus (GPa) of the formation material of the low dielectric constant films 12, 32, 52, 72, 92. The vertical axis represents the relative value of the displacement amount of the X direction and the displacement amount is set to 1 when the typical low dielectric constant film (of the elastic modulus of 2.25 GPa) is used. Herein, the $SiO_2$ film is used as the reinforcement insulating film and the wiring structure or the like is the same as the configuration shown in FIGS. 1 to 3B.

As shown in FIG. 34, the displacement amount is apt to increase as the elastic modulus of the formation material of the low dielectric constant films 12, 32, 52, 72, 92 decreases, but the dependency of the displacement amount to the elastic modulus is not very large. This is because the external load is mainly supported by the wirings 20, 40, 60, 80 and the reinforcement insulating films 22b, 42a, 42b, 62a, 62b, 82a, 82b, 102a, 102b. Therefore, in this embodiment, the formation material of the low dielectric constant films 12, 32, 52, 72, 92 can be relatively freely selected irrespective of the elastic modulus thereof. This point is one of largest advantages of this embodiment. Moreover, even when the elastic modulus of the formation material of the low dielectric constant films 12, 32, 52, 72, 92 approaches 0 GPa, the displacement amount is only less than 1.2 times the case where the typical low dielectric constant film is used. Consequently, it can be seen that the influence to the mechanical strength is significantly small even when an air gap structure is used in a configuration from which the low dielectric constant films 12, 32, 52, 72, 92 are removed in this embodiment.

Hereinafter, a semiconductor device and a manufacturing method thereof according to this embodiment will be described with reference to specific examples.

EXAMPLE 1

First, the method of manufacturing the semiconductor device according to an example 1 of this embodiment will be described. In this example, for example, the semiconductor device of the first basic configuration having the reinforcement insulating films 22b, 42b, 62b, 82b without overlapping with the wirings cannot be manufactured, but the semiconductor device of the fourth basic configuration can be manufactured at low cost.

Figure 35A:
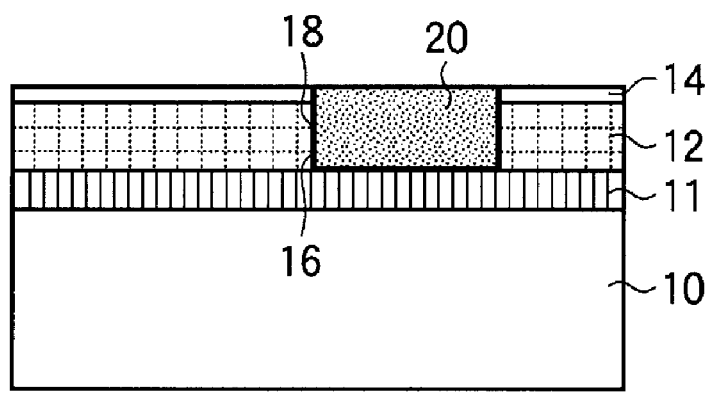
FIGS. 35A and 35B are process cross-sectional views showing a method of manufacturing a semiconductor device according to an example 1 of the embodiment of the present invention.

FIGS. 35A to 39 are process cross-sectional views showing the method of manufacturing the semiconductor device according to this example. The illustration and description of a manufacturing process for a transistor and the like in a lower portion than the wiring are omitted. First, as shown in FIG. 35A, a $SiO_2$ film 11 serving as an underlying insulating film is film-formed on the entire surface on a silicon substrate 10. Next, on the entire surface on the $SiO_2$ film 11, for example, a SiOC film of a film thickness 250 nm is film-formed by a CVD method and a low dielectric constant film 12 is formed. A material other than SiOC can be used for the low dielectric constant film 12, and an SOD method can be used when the low dielectric constant film 12 is formed. Next, for example, a SiC film of a film thickness 50 nm is film-formed on the entire surface on the low dielectric constant film 12, and a hard mask film 14 is formed. Next, a wiring groove 16 is formed on the hard mask film 14 and the low dielectric constant film 12 using a photolithography method. Next, a barrier metal layer 18 and a Cu film serving as a seed are film-formed in this order on the entire surface. Next, the Cu film is further deposited using a plating method and the Cu film is embedded within the wiring groove 16. Next, the surface is flattened by polishing until the hard mask film 14 is exposed using a CMP method, and the Cu film additionally deposited above an upper end of the wiring groove 16 and the barrier metal layer 18 are removed. Accordingly, a first layer wiring 20 is formed within the wiring groove 16. As described above, the wiring 20 is formed using a damascene method serving as a general formation method of the Cu wiring.

Figure 35B:
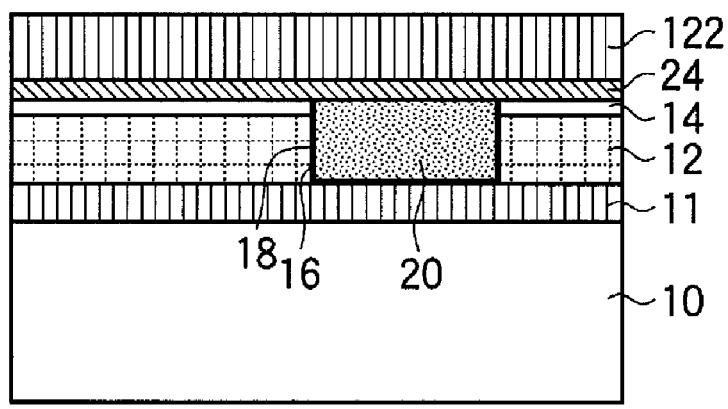

Next, as shown in FIG. 35B, the SiC film of a film thickness 50 nm is film-formed using the CVD method, and a cap film 24 is formed. So far, this is the same as a process of manufacturing a general Cu/low-k wiring. Next, in this example, for example, a SiO$_2$ film 122 of a film thickness 300 nm serving as the reinforcement insulating film is film-formed by the CVD method.

Figure 36A:
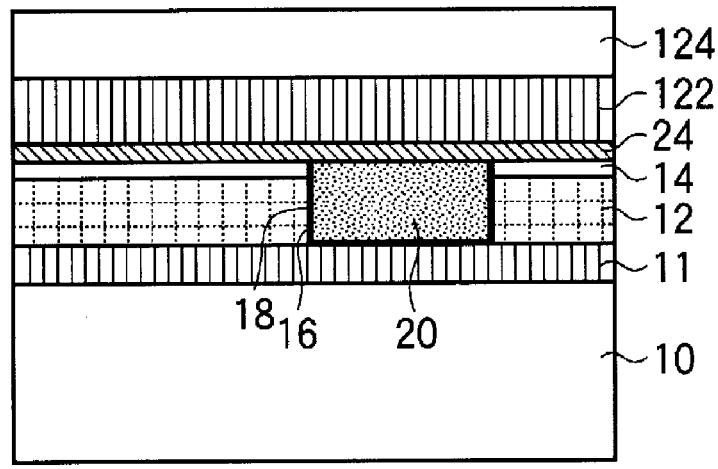
FIGS. 36A and 36B are process cross-sectional views showing the method of manufacturing the semiconductor device according to the example 1 of the embodiment of the present invention.

Next, as shown in FIG. 36A, a negative resist is coated on the entire surface on the SiO$_2$ film 122 by a spin coat method and a negative resist layer 124 is formed.

Figure 36B:
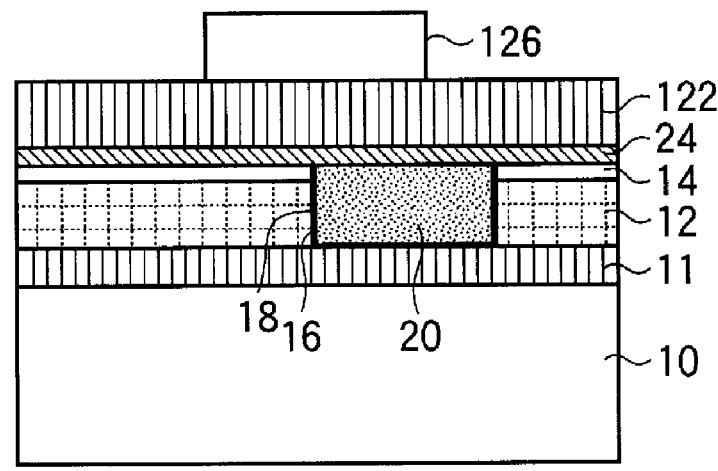

Next, as shown in FIG. 36B, exposure and development are made using a predetermined photo mask and a resist layer 126 is formed in a formation area of a second layer wiring.

Figure 37A:
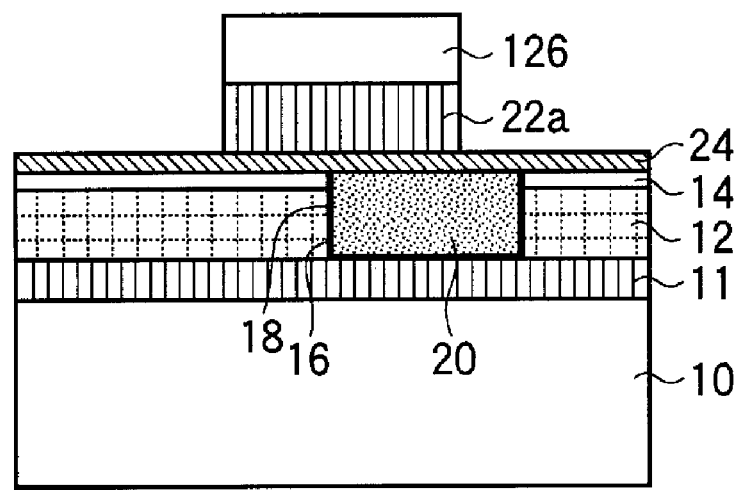
FIGS. 37A and 37B are process cross-sectional views showing the method of manufacturing the semiconductor device according to the example 1 of the embodiment of the present invention.

Next, as shown in FIG. 37A, dry etching or wet etching is performed using the resist layer 126 as an etching mask, and a reinforcement insulating film 22a is formed by removing the SiO$_2$ film 122 out of the formation area of the second layer wiring. In this example, the SiO$_2$ film 122 was removed by dry etching using fluoride gas.

Figure 37B:
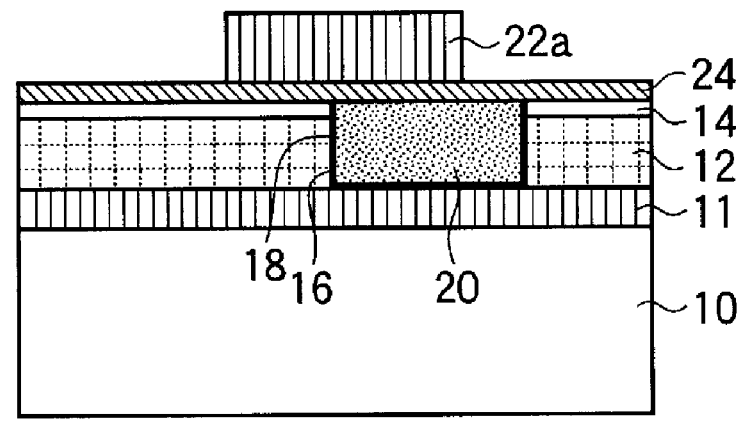

Next, as shown in FIG. 37B, the resist layer 126 is removed by a wet treatment.

Figure 38A:
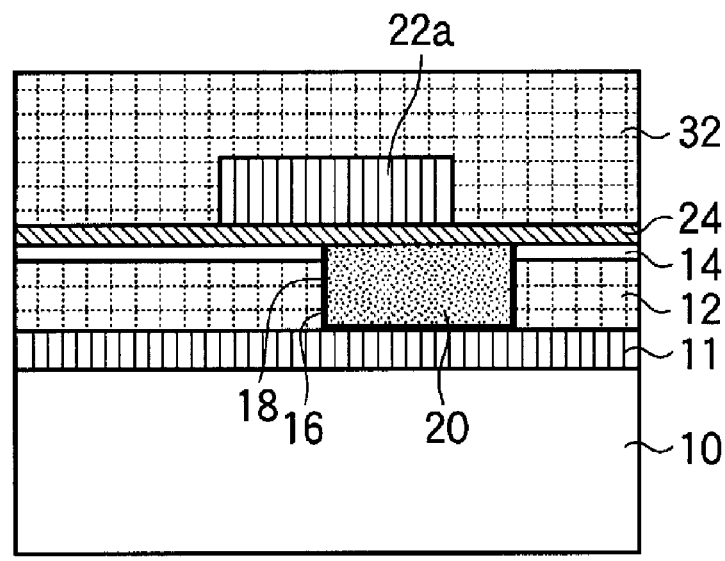
FIGS. 38A and 38B are process cross-sectional views showing the method of manufacturing the semiconductor device according to the example 1 of the embodiment of the present invention.

Next, as shown in FIG. 38A, a low dielectric constant film 32 is film-formed on the entire surface of the substrate such that the surface is flattened using the CVD method. The thickness of the low dielectric constant film 32 was set to approximately 550 nm from an upper end of the first layer wiring 20.

Figure 38B:
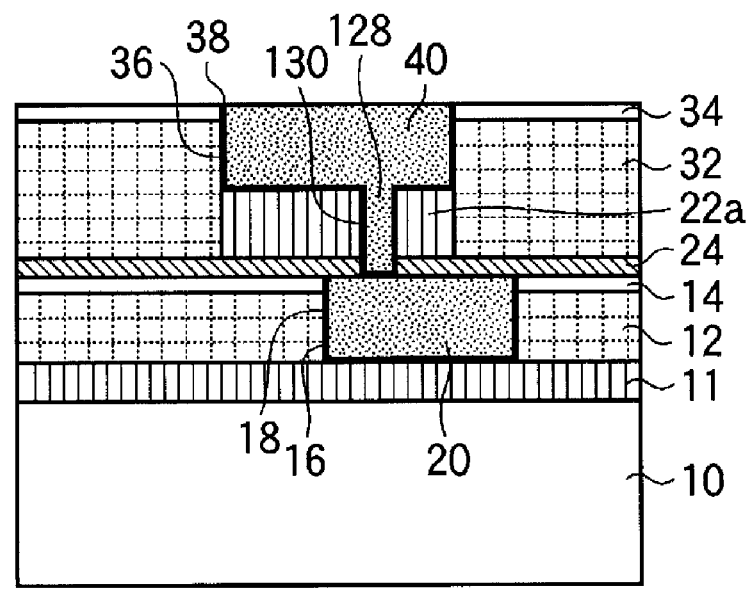

Next, as shown in FIG. 38B, the SiC film of a thickness 50 nm is film-formed on the entire surface and a hard mask film 34 is formed. From here, a second layer wiring 40 and a via portion 128 are formed using a dual damascene method. That is, for example, a low dielectric constant film 32, a reinforcement insulating film 22a and a cap film 24 on the wiring 20 are removed using the photolithography method, and a via hole 130 connected to the wiring 20 is formed. Next, a positive resist layer is formed by coating a positive resist on the entire surface on the hard mask 34. Subsequently, exposure and development are made using the same photo mask as that used to form the reinforcement insulating film 22a. Accordingly, the resist layer is formed out of the formation area of the wiring 40. The hard mask film 34 and the low dielectric constant film 32 on the reinforcement insulating film 22a are etched and removed using this resist layer as an etching mask and a wiring groove 36 is formed immediately above the reinforcement insulating film 22a. Next, a barrier metal layer 38 and a Cu film serving as a seed are film-formed in this order on the entire surface. Next, the Cu film is further deposited using a plating method, and the Cu film is embedded within the wiring groove 36 and the via hole 130. Next, the surface is flattened by polishing until the hard mask 34 is exposed using a CMP method, and the Cu film additionally deposited above an upper end of the wiring groove 36 and the barrier metal layer 38 are removed. Accordingly, the second layer wiring 40 is formed within the wiring groove 36, and the via portion 128 for connecting the wirings 20, 40 is formed within the via hole 130.

Figure 39:
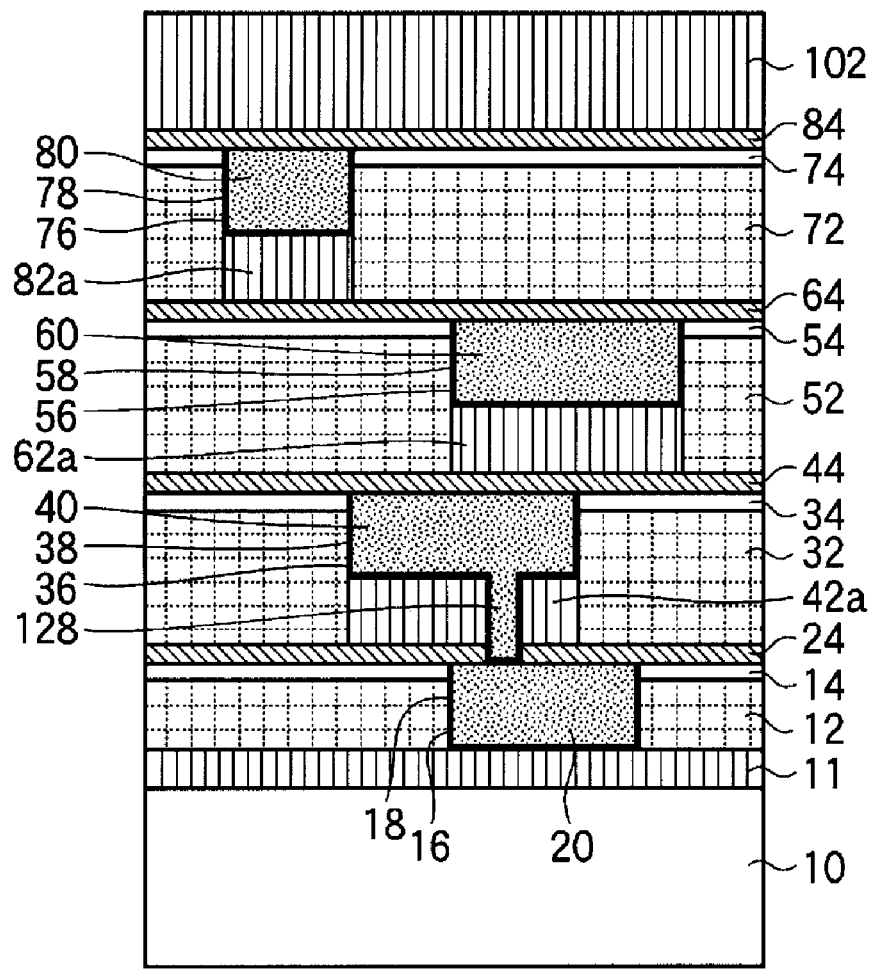
FIG. 39 is a process cross-sectional view showing the method of manufacturing the semiconductor device according to the example 1 of the embodiment of the present invention.

Thereafter, a process shown in FIGS. 35B to 38B is repeated and a semiconductor device having a four-layer wiring structure as shown in FIG. 39 is manufactured. The semiconductor device manufactured by this example is mainly characterized in that it includes reinforcement insulating films 22a, 42a, 62a, 82a formed using a SiO$_2$ film immediately below respective wirings 20, 40, 60, 80 and low dielectric constant films 12, 32, 52, 72 formed in a surrounding area other than immediately below the wirings 20, 40, 60, 80.

The manufacturing yield of the semiconductor device was higher approximately 20% than the conventional yield by applying this example. The cause of the manufacturing yield improvement was examined. The cause was because a pattern defect occurring in a polishing process using a CMP method was remarkably reduced. The main cause is determined to be due to an improvement of the mechanical strength (particularly, the strength to the force of the substrate in-plane direction) in the semiconductor device by providing the reinforcement insulating films 22a, 42a, 62a, 82a. Moreover, the wiring layer in a bonding process was not deteriorated in the semiconductor device manufactured by this example.

In the method of manufacturing the semiconductor device according to this example, the wirings 40, 60, 80 (or the wiring grooves 36, 56, 76) and the reinforcement insulating films 42a, 62a, 82a immediately therebelow can be respectively formed with the same photo mask by separately employing the positive resist and the negative resist. That is, in this example, the mechanical strength of the semiconductor device can increase without increasing the number of masks. In the method of manufacturing the semiconductor device according to this example, the reinforcement insulating films 22b, 42b, 62b, 82b of the first basic configuration or the reinforcement insulating films absent immediately below or above the wirings of the reinforcement insulating films 22a, 42a, 62a, 82b and the like of the third basic configuration cannot be further formed. Therefore, this example is suitable to achieve a certain level of reinforcement effect while suppressing an increase in the manufacturing cost.

EXAMPLE 2

Next, a method of manufacturing the semiconductor device according to an example 2 of this embodiment will be described. In this example, the reinforcement insulating films 22b, 42b, 62b, 82b of the first basic configuration or the reinforcement insulating films absent immediately below or above the wirings of the reinforcement insulating films 22a, 42b, 62a, 82b and the like of the third basic configuration can be formed by adding a photo mask.

Figure 40A:
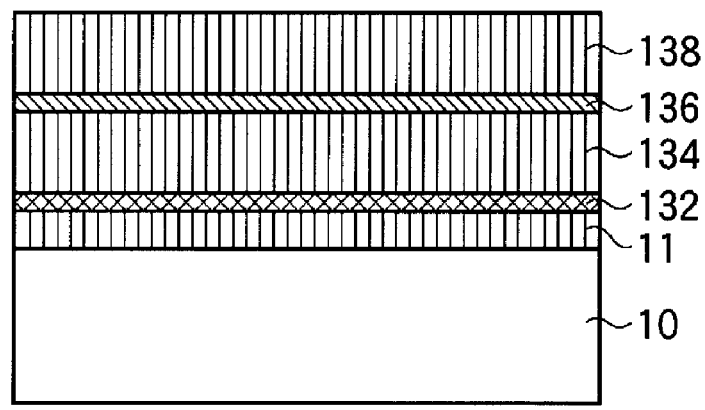
FIGS. 40A and 40B are process cross-sectional views showing a method of manufacturing a semiconductor device according to an example 2 of the embodiment of the present invention.

FIGS. 40A to 43 are process cross-sectional views showing the method of manufacturing the semiconductor device according to this example. First, on the entire surface of a silicon substrate 10 as shown in FIG. 40A, a SiO$_2$ film 11 of a film thickness 150 nm, a silicon nitride film (SiN film) 132 of a film thickness 50 nm, a SiO$_2$ film 134 of a film thickness 250 nm serving as a reinforcement insulating film, a SiC film 136 of a film thickness 50 nm serving as a middle etch stopper (MES) film, and a SiO$_2$ film 138 of a film thickness 250 nm all are film-formed in this order, for example, using a CVD method.

Figure 40B:
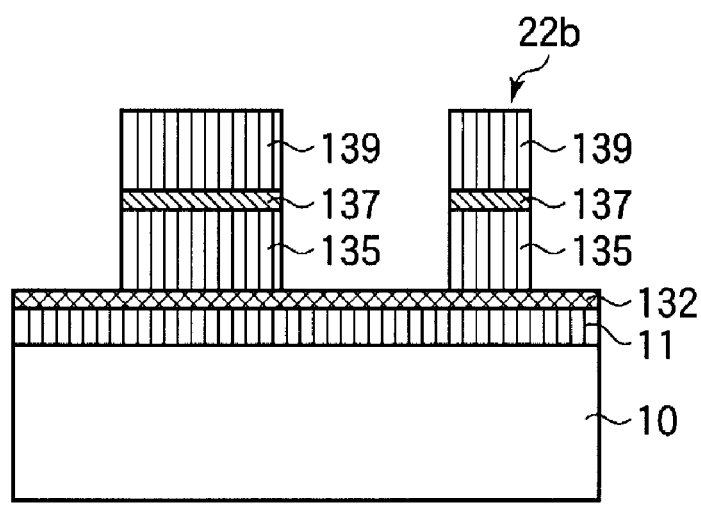

Next, in a photolithography process using a photo mask to form a wiring and a reinforcement insulating film, a resist layer is formed in a wiring formation area and a reinforcement insulating film formation area. Dry etching is performed using the resist layer as an etching mask. As shown in FIG. 40B, a SiO$_2$ film 139, an MES film 137, and a SiO$_2$ film 135 are formed in the wiring formation area and the reinforcement insulating film formation area. Accordingly, a reinforcement insulating film 22b having a laminated structure of a SiO$_2$ film, a SiC film, and a SiO$_2$ film is formed.

Figure 41A:
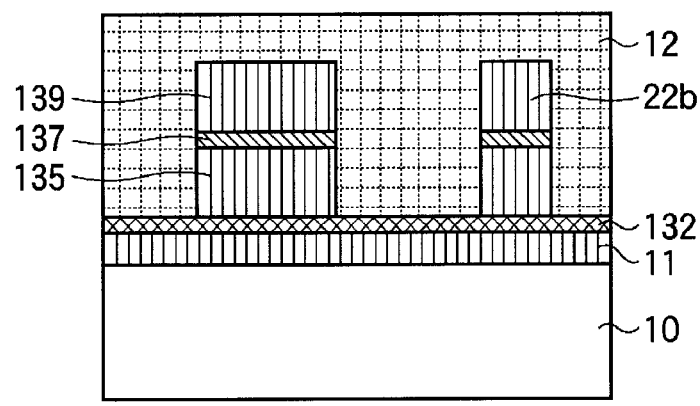
FIGS. 41A and 41B are process cross-sectional views showing the method of manufacturing the semiconductor device according to the example 2 of the embodiment of the present invention.

Next, as shown in FIG. 41A, a low dielectric constant film 12 is formed on the entire surface of the substrate on the SiO$_2$ film 139. Herein, a porous film coated by a spin coat method was used as the low dielectric constant film 12.

Figure 41B:
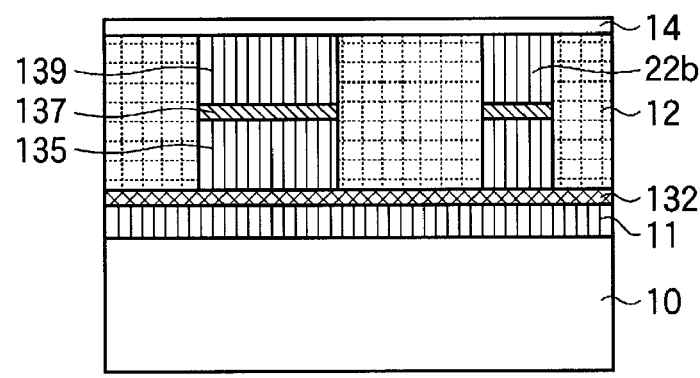

Next, as shown in FIG. 41B, the low dielectric constant film 12 additionally formed above an upper end of the reinforcement insulating film 22b is removed using an etch-back method or a CMP method. Accordingly, the low dielectric constant film 12 is formed in an area other than the wiring formation area and the reinforcement insulating film area.

Next, a SiC film of a film thickness 50 nm is film-formed on the entire surface of the substrate and a hard mask film 14 is formed.

Figure 42A:
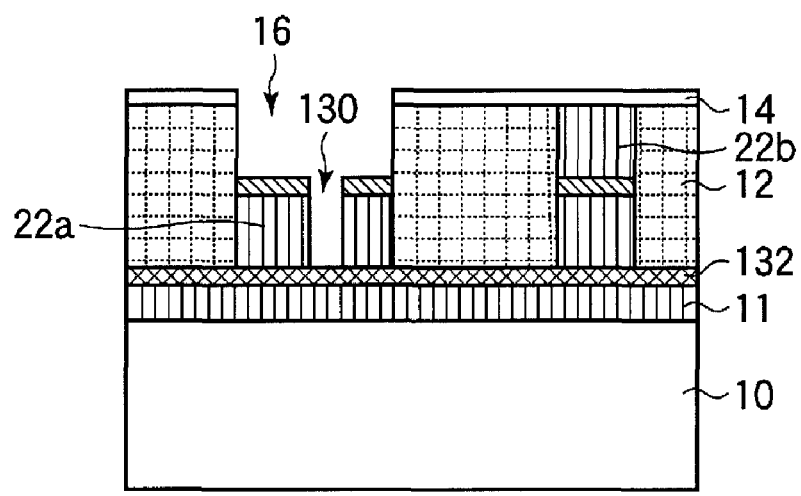
FIGS. 42A and 42B are process cross-sectional views showing the method of manufacturing the semiconductor device according to the example 2 of the embodiment of the present invention.

Next, as shown in FIG. 42A, a via hole 130 is formed by a photolithography process and an etching process using a photo mask for forming a via portion like a process by a conventional dual damascene method. Subsequently, the hard mask film 14 and the SiO$_2$ film 139 are removed by a photolithography process and an etching process using a photo mask for forming a wiring, and a wiring groove 16 is formed. Accordingly, immediately below the wiring groove 16, a reinforcement insulating film 22a using the SiO$_2$ film 135 (and the SiC film 136) is formed.

Figure 42B:
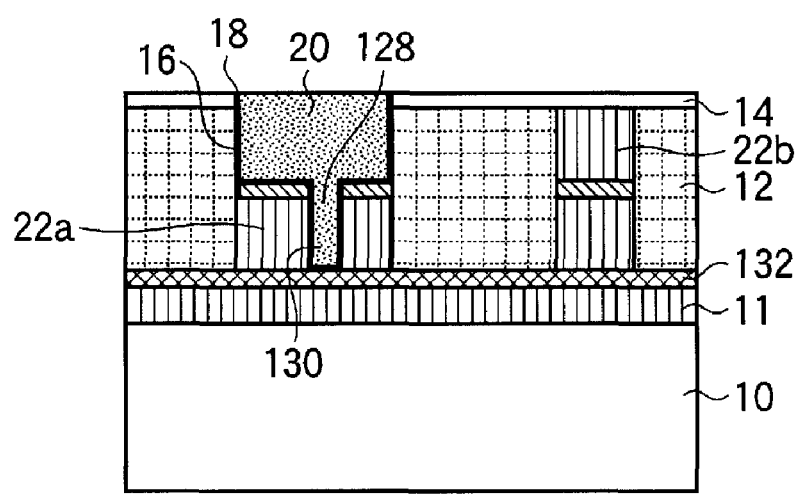

Next, a barrier metal layer 18 and a Cu film serving as a seed are film-formed in this order on the entire surface. Next, the Cu film is further deposited using a plating method, and the Cu film is embedded within the wiring groove 16 and the via hole 130. Next, the surface is flattened by polishing until the hard mask film 14 is exposed using a CMP method, and the Cu film additionally deposited above an upper end of the wiring groove 16 and the barrier metal layer 18 are removed. Accordingly, as shown in FIG. 42B, the wiring 20 is formed within the wiring groove 16, and a via portion 128 making a connection between the wiring 20 and a wiring of its lower layer (of which an illustration and description are omitted in this example) is formed within the via hole 130.

Figure 43:
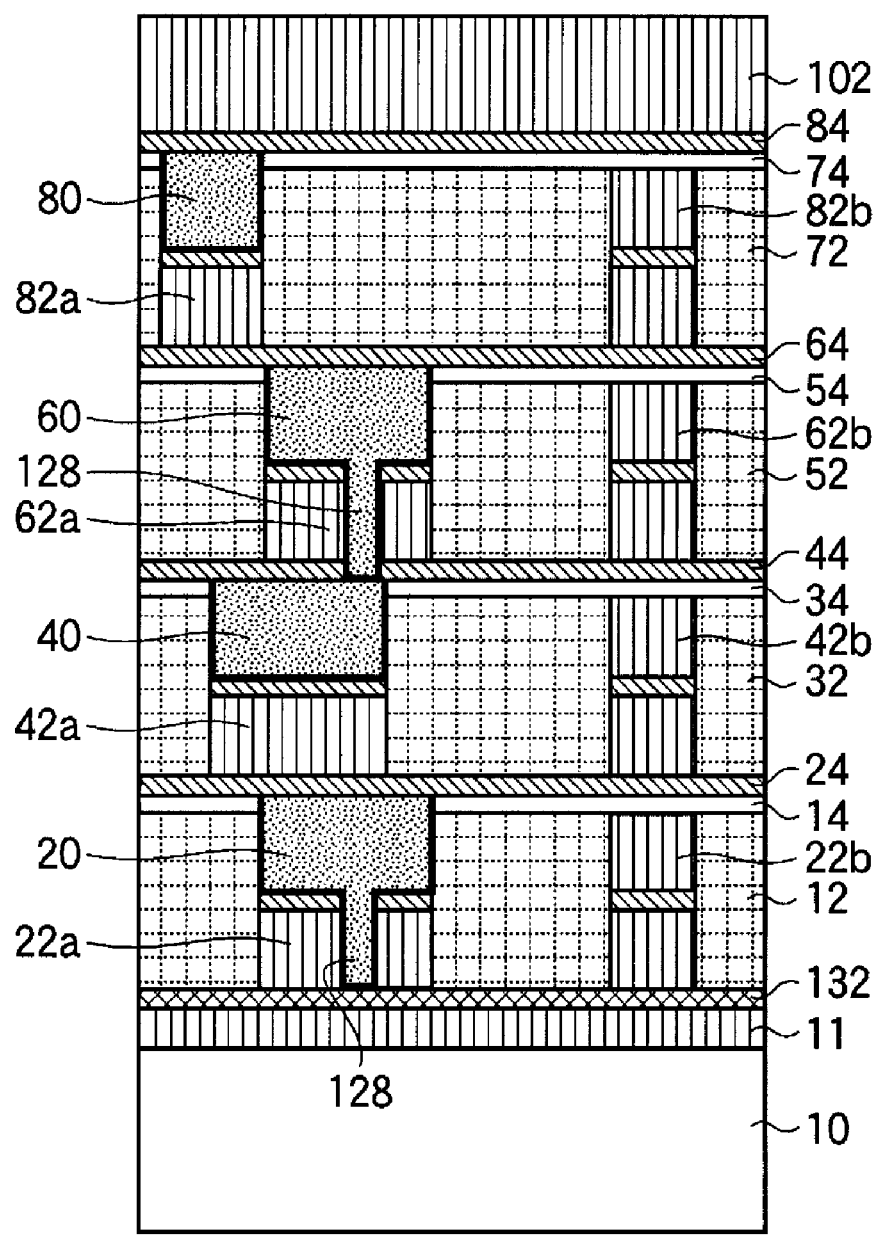
FIG. 43 is a process cross-sectional view showing the method of manufacturing the semiconductor device according to the example 2 of the embodiment of the present invention.

Thereafter, a semiconductor device having a multilayer wiring structure as shown in FIG. 43 is manufactured by repeating the process shown in FIGS. 40A to 42B. The semiconductor device manufactured by this example is mainly characterized in that it includes reinforcement insulating films 22a, 42a, 62a, 82a formed using a SiO$_2$ film (and a SiC film) immediately below respective wirings 20, 40, 60, 80, reinforcement insulating films 22b, 42b, 62b, 82b having a laminated structure of a SiO$_2$ film, a SiC film, and a SiO$_2$ film absent immediately below the wirings, and low dielectric constant films 12, 32, 52, 72 formed in a surrounding area other than immediately below the wirings 20, 40, 60, 80.

Since this example requires a photo mask for forming the reinforcement insulating films 22b, 42b, 62b, 82b absent immediately below the wirings separate from a photo mask for forming the wirings 20, 40, 60, 80, the manufacturing cost slightly increases in comparison with that of the example 1. However, since first and second walls orthogonal to each other can be formed in this example as in the above-described first and third basic configuration, the semiconductor device of a high mechanical strength can be achieved. Moreover, according to this example, a pillar structure serving as a reinforcement portion using the SiO$_2$ film (and the SiC film) can be formed by arranging the reinforcement insulating films 22b, 42b, 62b, 82b absent immediately below the wirings like the via portion 88 of the above-described comparative example 2.

EXAMPLE 3

Next, a method of manufacturing a semiconductor device according to an example 3 of this embodiment will be described. The wiring 20 is formed after the low dielectric constant film 12 is formed in the example 2, whereas the low dielectric constant film 12 is formed after the wiring 20 is formed in this example.

Figure 44A:
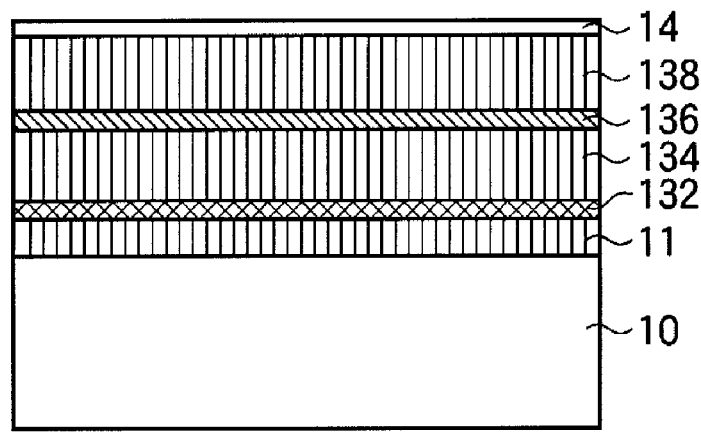
FIGS. 44A and 44B are process cross-sectional views showing a method of manufacturing a semiconductor device according to an example 3 of the embodiment of the present invention.

FIGS. 44A to 46 are process cross-sectional views showing the method of manufacturing the semiconductor device according to this example. First, on the entire surface of a silicon substrate 10 as shown in FIG. 44A, a SiO$_2$ film 11 of a film thickness 500 nm, a SiN film 132 of a film thickness 50 nm, a SiO$_2$ film 134 of a film thickness 250 nm, a SiC film 136 of a film thickness 50 nm serving as an MES film, a SiO$_2$ film 138 of a film thickness 250 nm, and a SiC film of a film thickness 50 nm serving as a hard mask film 14 all are film-formed in this order, for example, using a CVD method.

Figure 44B:
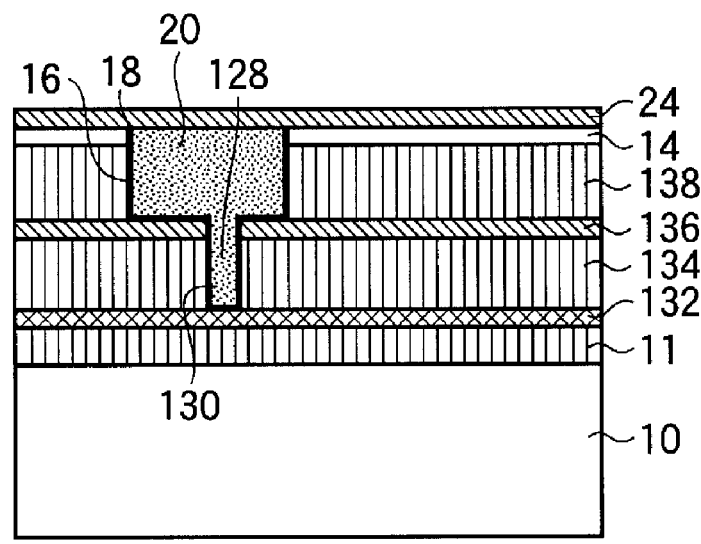

Next, as shown in FIG. 44B, a via hole 130 is formed by a photolithography process and an etching process using a photo mask for forming a via portion like a process by a conventional dual damascene method. Subsequently, a hard mask film 14 and a SiO$_2$ film 138 are removed by a photolithography process and an etching process using a photo mask for forming a wiring, and a wiring groove 16 is formed. Next, using a sputter method, a Ta film of a film thickness 25 nm serving as a barrier metal layer 18 and a Cu film of a film thickness 50 nm serving as a seed are film-formed in this order on the entire surface. Next, the Cu film is further deposited using a plating method, and the Cu film is embedded within the wiring groove 16 and the via hole 130. Next, flattened by polishing until the hard mask film 14 is exposed using a CMP method, and the Cu film additionally deposited above an upper end of the wiring groove 16 and the barrier metal layer 18 are removed. Accordingly, the wiring 20 is formed within the wiring groove 16, and a via portion 128 making a connection between the wiring 20 and a wiring of its lower layer (of which an illustration and description are omitted in this example) is formed within the via hole 130. Next, a SiC film of a film thickness 50 nm is film-formed on the entire surface and a cap film 24 responsible for preventing Cu diffusion is formed.

Figure 45A:
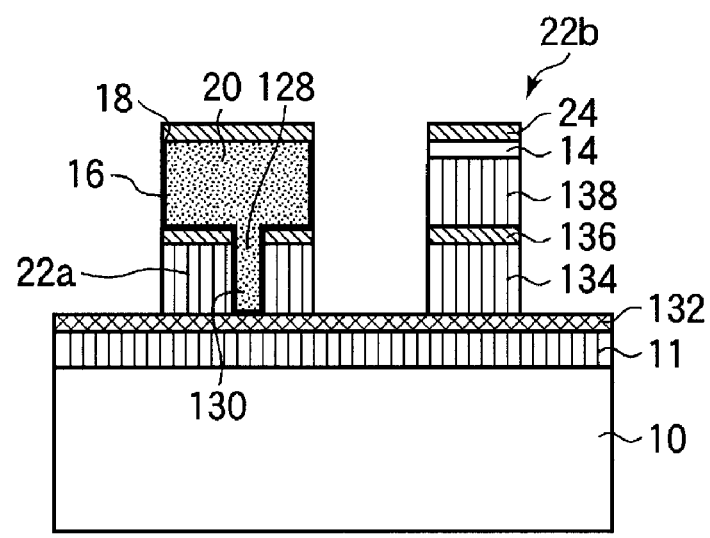
FIGS. 45A and 45B are process cross-sectional views showing the method of manufacturing the semiconductor device according to the example 3 of the embodiment of the present invention.

Next, a resist layer is formed in a wiring formation area and a reinforcement insulating film formation area by a photolithography process using a photo mask for forming a wiring and a reinforcement insulating film. Dry etching is performed using the resist layer as an etching mask, and the cap film 24 out of the wiring formation area and the reinforcement insulating film formation area, the hard mask film 14, the SiO$_2$ film 138, the SiC film 136, and the SiO$_2$ film 134 are removed as shown in FIG. 45A. Accordingly, immediately below the wiring 20, a reinforcement insulating film 22a using the SiO$_2$ film 134 (and the SiC film 136) is formed. Moreover, a reinforcement insulating film 22b absent immediately below the wiring is formed with the laminated structure of the SiO$_2$ film 134, the SiC film 136, and the SiO$_2$ film 138.

Figure 45B:
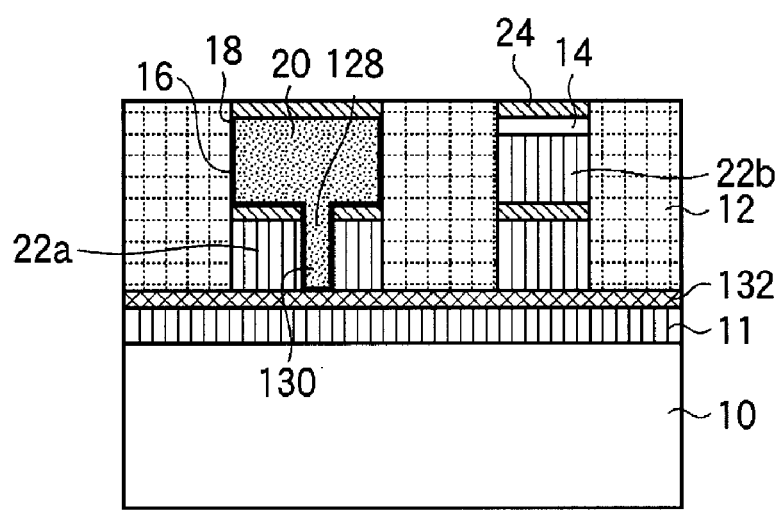

Next, as shown in FIG. 45B, a low dielectric constant film 12 equal to that of the example 2 is formed on the entire surface of the substrate. Thereafter, the low electric constant film 12 additionally deposited above an upper end of the cap film 24 is removed by polishing using a CMP method. Accordingly, the low dielectric constant film 12 is formed in an area other than formation areas of the reinforcement insulating films 22a, 22b.

Figure 46:
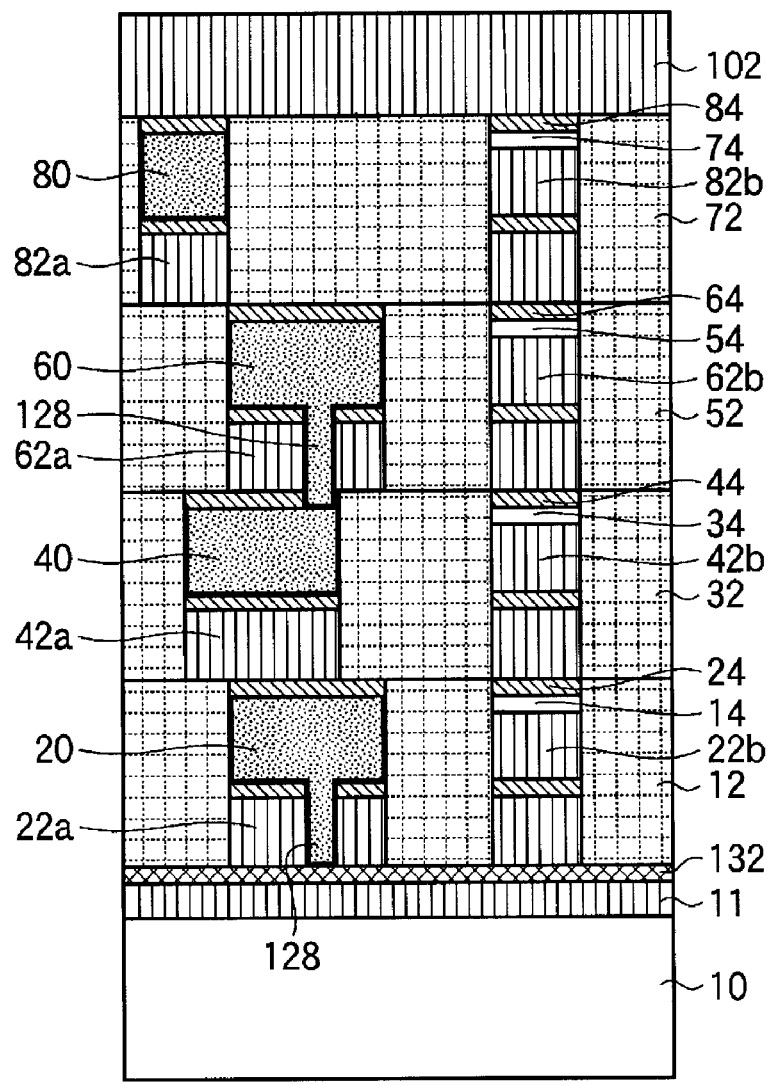
FIG. 46 is a process cross-sectional view showing the method of manufacturing the semiconductor device according to the example 3 of the embodiment of the present invention.

A semiconductor device having a multilayer wiring structure as shown in FIG. 46 is manufactured by repeating the process shown in FIGS. 44A to 45B. Like the semiconductor device manufactured by the example 2, the semiconductor device manufactured by this example includes reinforcement insulating film films 22a, 42a, 62a, 82a formed using a SiO$_2$ film (and a SiC film) immediately below respective wirings 20, 40, 60, 80, reinforcement insulating films 22b, 42b, 62b, 82b having a laminated structure of a SiO$_2$ film, a SiC film, and SiO$_2$ film absent immediately below the wirings, and low dielectric constant films 12, 32, 52, 72 formed in a surrounding area other than immediately below the wirings 20, 40, 60, 80. The semiconductor device manufactured by this example is different from the semiconductor device manufactured by the example 2 in that hard mask films 14, 34, 54, 74 are formed on only the reinforcement insulating films 22b, 42b, 62b, 82b, and cap films 24, 44, 64, 84 are formed on only the wirings 20, 40, 60, 80 and the reinforcement insulating films 22b, 42b, 62b, 82b.

Next, a modified example of the method of manufacturing the semiconductor device according to this example will be described. A low dielectric constant film is formed after a wiring and a reinforcement insulating film is formed in the method of manufacturing the semiconductor device shown in FIGS. 44A to 46, whereas the formation of the low dielectric constant film is performed before the formation of the wiring and the reinforcement insulating film in this modified example. Moreover, in this modified example, the case where the MES film is not formed is considered.

Figure 47A:
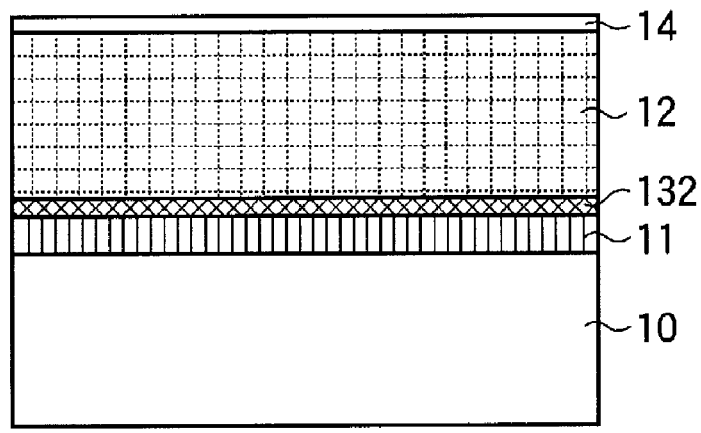
FIGS. 47A and 47B are process cross-sectional views showing a modified example of the method of manufacturing the semiconductor device according to the example 3 of the embodiment of the present invention.

FIGS. 47A to 50 are process cross-sectional views showing a modified example of the method of manufacturing the semiconductor device according to this example. First, as shown in FIG. 47A, a low dielectric constant film 12 and a hard mask film 14 are formed in this order after a $SiO_2$ film 11 of a film thickness 500 nm and a SiN film 132 of a film thickness 50 nm are film-formed on the entire surface of a silicon substrate 10.

Figure 47B:
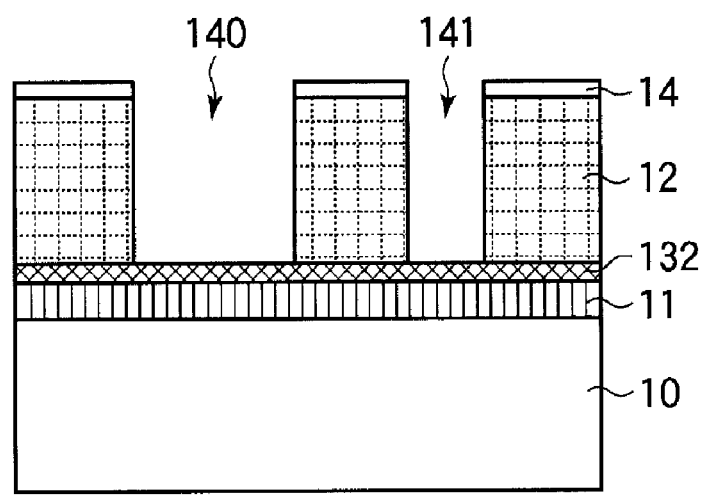

Next, as shown in FIG. 47B, the hard mask film 14 of the wiring formation area and the reinforcement insulating film formation area and the low dielectric constant film 12 are removed by a photolithography process and an etching process using a photo mask for forming a wiring and a reinforcement insulating film, and reinforcement portion grooves 140, 141 are formed.

Figure 48A:
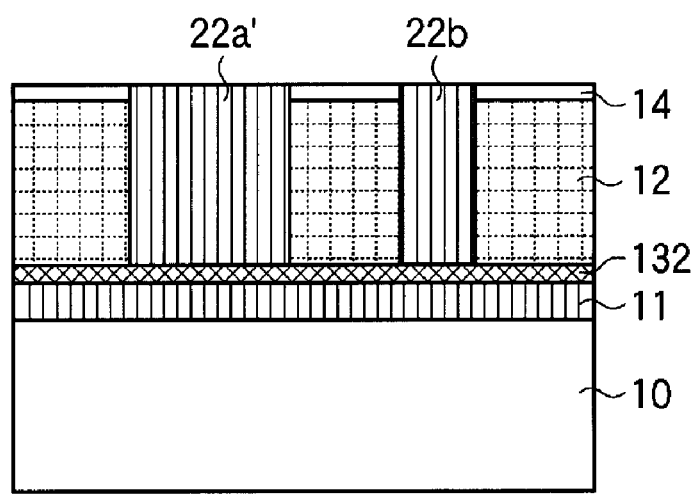
FIGS. 48A and 48B are process cross-sectional views showing the modified example of the method of manufacturing the semiconductor device according to the example 3 of the embodiment of the present invention.

Next, the $SiO_2$ film serving as the reinforcement insulating film is film-formed on the entire surface of the substrate, and the $SiO_2$ film is embedded within the reinforcement portion grooves 140, 141. Thereafter, the $SiO_2$ film additionally formed above an upper end of the reinforcement portion grooves 140, 141 is removed by polishing using a CMP method, and reinforcement insulating films 22a', 22b are formed as shown in FIG. 48A.

Figure 48B:
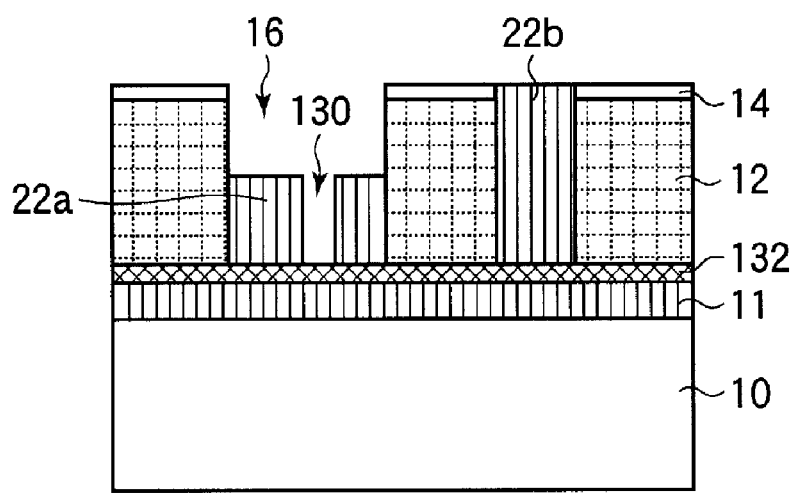

Next, as shown in FIG. 48B, a via hole 130 is formed by a photolithography process and an etching process using a photo mask for forming a via portion. Subsequently, an upper layer portion of the reinforcement insulating film 22a' is removed by a photolithography process and an etching process using a photo mask for forming a wiring, and a wiring groove 16 is formed. Accordingly, the reinforcement insulating film 22a is formed immediately below the wiring groove 16.

Figure 49A:
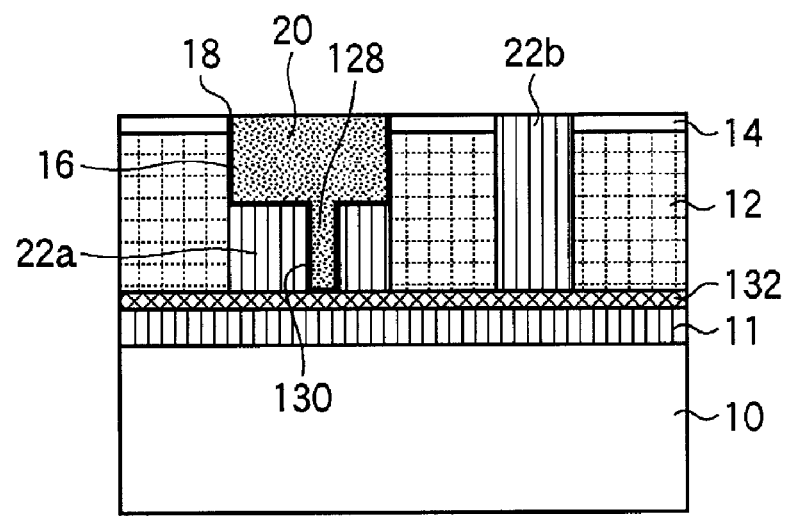
FIGS. 49A and 49B are process cross-sectional views showing the modified example of the method of manufacturing the semiconductor device according to the example 3 of the embodiment of the present invention.

Next, a barrier metal layer 18 and a Cu film serving as a seed are film-formed in this order on the entire surface. Next, the Cu film is further deposited using a plating method, and the Cu film is embedded within the wiring groove 16 and the via hole 130. Next, flattened by polishing until the hard mask film 14 is exposed using a CMP method, and the Cu film additionally deposited above an upper end of the wiring groove 16 and the barrier metal layer 18 are removed. Accordingly, as shown in FIG. 49A, the wiring 20 is formed within the wiring groove 16, and a via portion 128 making a connection between the wiring 20 and a wiring of its lower layer (of which an illustration and description are omitted in this example) is formed within the via hole 130.

Figure 49B:
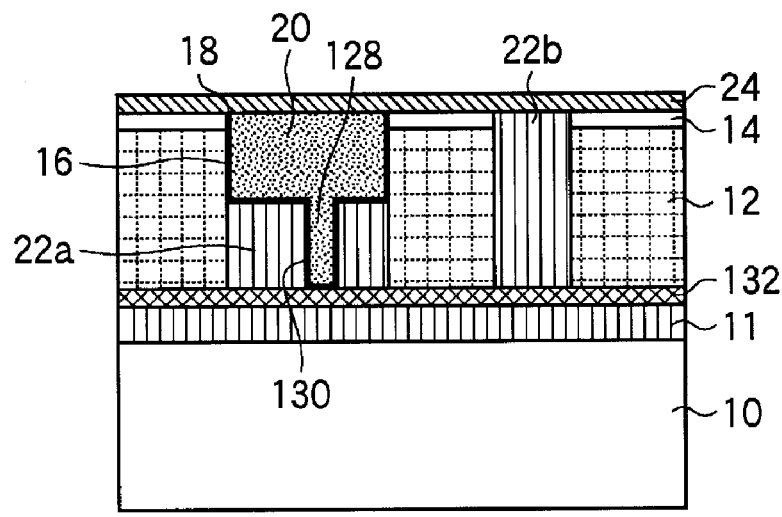

Next, a cap film 24 is formed by film-forming the SiC film on the entire surface of the substrate as shown in FIG. 49B.

Figure 50:
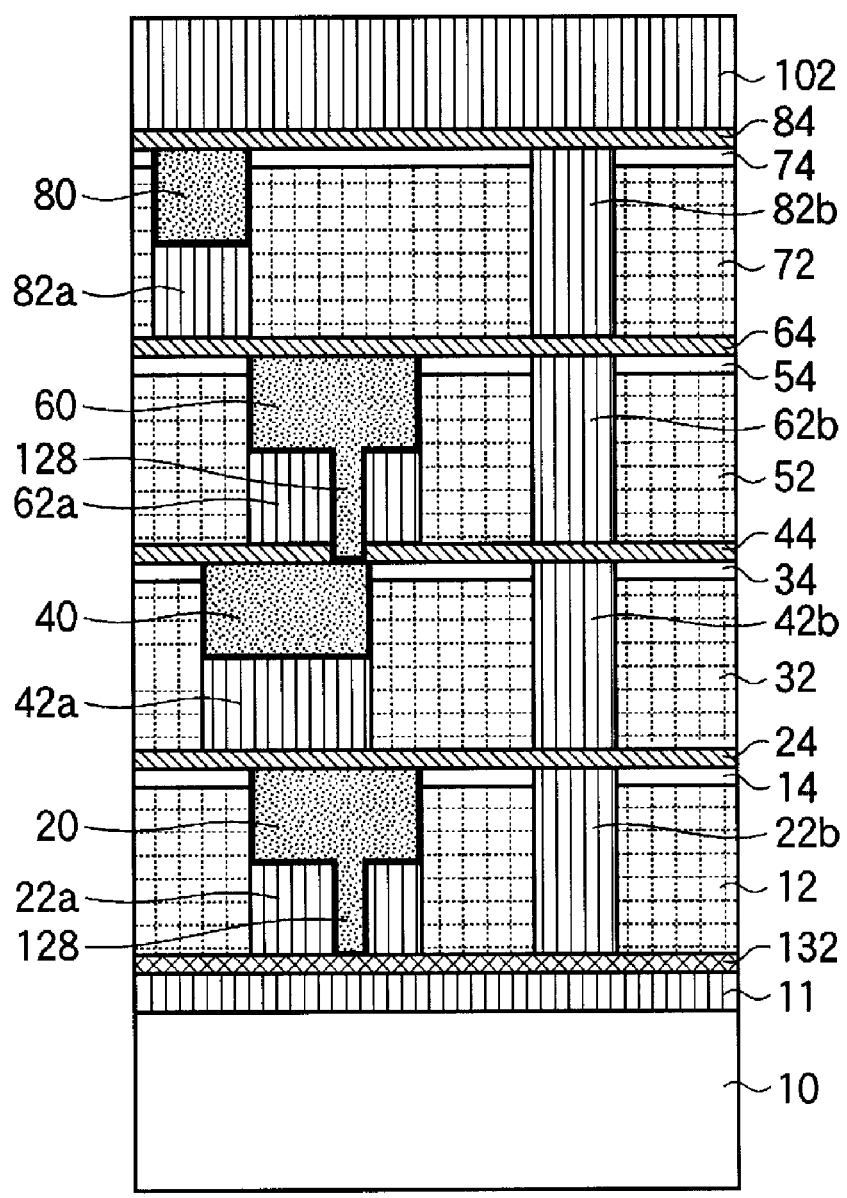
FIG. 50 is a process cross-sectional view showing the modified example of the method of manufacturing the semiconductor device according to the example 3 of the embodiment of the present invention.

A semiconductor device having a multilayer wiring structure as shown in FIG. 50 is manufactured by repeating the process shown in FIGS. 47A to 49B. The semiconductor device manufactured by this example includes reinforcement insulating films 22a, 42a, 62a, 82a formed using a $SiO_2$ film immediately below respective wirings 20, 40, 60, 80, reinforcement insulating films 22b, 42b, 62b, 82b formed using a single layer $SiO_2$ film absent immediately below the wirings, and low dielectric constant films 12, 32, 52, 72 formed in a surrounding area other than immediately below the wirings 20, 40, 60, 80. The semiconductor device manufactured by this modified example is different from the semiconductor device shown in FIG. 46 in that hard mask films 14, 34, 54, 74 are formed on only low dielectric constant films 12, 32, 52, 72, and cap films 24, 44, 64, 84 are formed on the entire surface. Moreover, since an MES film is not formed in this modified example, the reinforcement insulating films 22a, 22b, 42a, 42b, 62a, 62b, 82a, 82b are respectively formed using the single layer $SiO_2$ film.

EXAMPLE 4

Next, a method of manufacturing a semiconductor device according to an example 4 of this embodiment will be described. In this example, a semiconductor device of an air gap structure is manufactured. The most processes of this example are the same as those of the modified example of the example 3 shown in FIGS. 47A to 50, except that an air gap sacrificial film is used as an insulating layer in place of a low dielectric constant film. A material removable by oxidation, dissolution, decomposition or a combination thereof is used as the air gap sacrificial film.

Figure 51A:
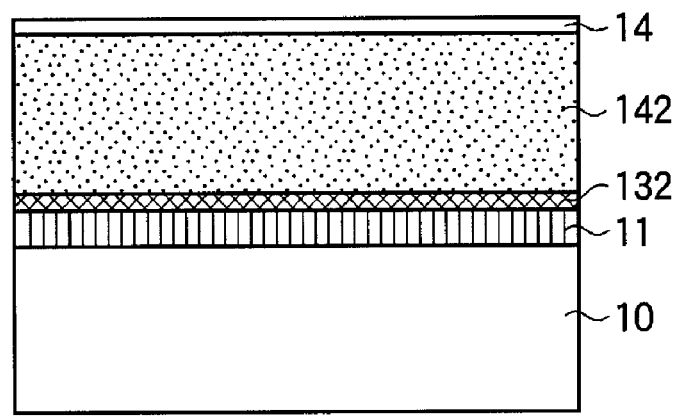
FIGS. 51A and 51B are process cross-sectional views showing a method of manufacturing a semiconductor device according to an example 4 of the embodiment of the present invention.

FIGS. 51A to 58 are process cross-sectional views showing the method of manufacturing the semiconductor device according to this example. First, as shown in FIG. 51A, an air gap sacrificial film 142 is formed on the entire surface using, for example, an easily decomposable resin after a $SiO_2$ film 11 of a film thickness 500 nm and a SiN film 132 of a film thickness 50 nm are film-formed on the entire surface of a silicon substrate 10. Subsequently, a SiC film of a film thickness 50 nm is film-formed on the entire surface on the air gap sacrificial film 142, for example, using a CVD method, and a hard mask film 14 is formed.

The easily decomposable resin usable as the air gap sacrificial film 142 includes a polystyrene resin, a cellulose based resin, a polyester based resin, an acrylic resin, an epoxy based resin, or the like. It is preferable that the average molecular weight of these resins is about 10,000~70,000. One reason is because a decomposition temperature of the resin needs to be higher than about 350° C. when considering a process temperature in a wiring process, and another reason is because coating properties are deteriorated when the molecular weight is large. In this example, the polystyrene resin of these resins was used. A procedure of forming the air gap sacrificial film 142 using the polystyrene resin is as follows. First, the polystyrene resin was dissolved in cyclohexane serving as an organic solvent. A ratio was organic solvent 5 weight to polystyrene resin 1 weight. Next, the polystyrene resin dissolved in the organic solvent was coated on the substrate surface. Thereafter, the organic solvent was evaporated by performing a heating treatment for 10 minutes in a nitride atmosphere at 120° C., and the air gap sacrificial film 142 was formed. Moreover, ketones, ethers, esters, and the like can be used as the organic solvent for dissolving resins.

In place of the easily decomposable resin, there can be used an organic template material of a quaternary ammonium based surfactant for gasification through dissolving by heating, a nonionic surfactant, or the like, or a mixture of the easily decomposable resin and the organic template material. When the mixture is used, it is preferable that a mixture amount of the organic template material is about 0.1~30 wt %. It is known that the organic template material is expressed by a structure expression $[R_1R_2R_3R_4N]^+Y^-$ (see Patent Document 2). Herein, $R_i$ represents the hydrocarbon radical and Y represents the halogen atom or the OH radical.

Figure 51B:
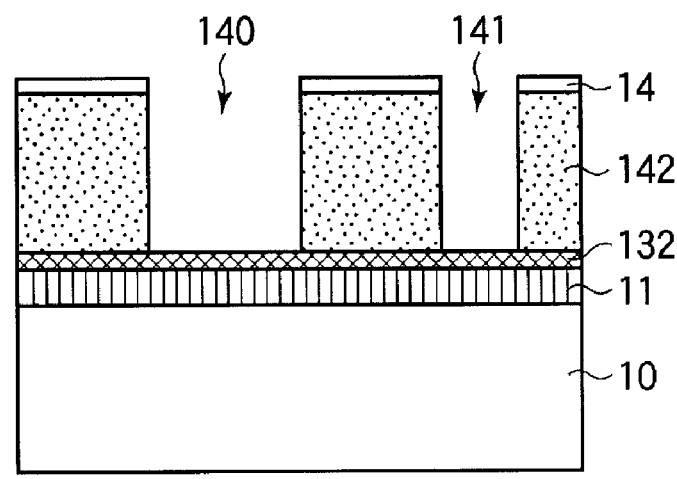

Next, as shown in FIG. 51B, the hard mask film 14 of the wiring formation area and the reinforcement insulating film formation area and the air gap sacrificial film 142 are removed by a photolithography process and an etching process using a photo mask for forming a wiring and a reinforcement insulating film, and reinforcement portion grooves 140, 141 are formed.

Figure 52A:
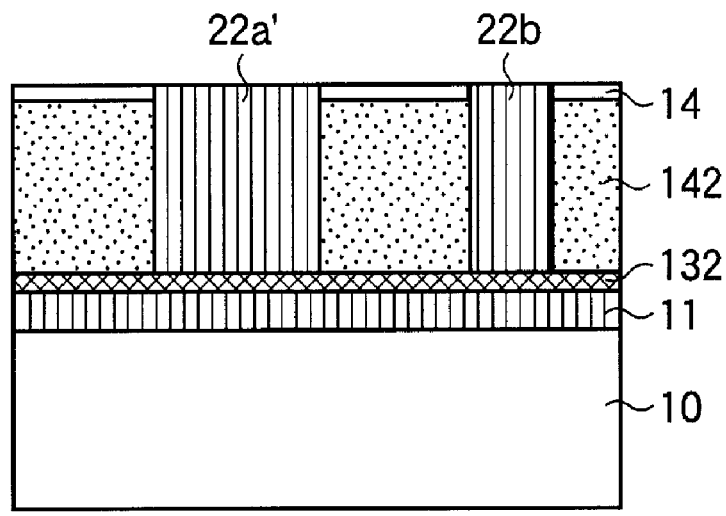
FIGS. 52A and 52B are process cross-sectional views showing the method of manufacturing the semiconductor device according to the example 4 of the embodiment of the present invention.

Next, the $SiO_2$ film serving as the reinforcement insulating film is film-formed on the entire surface of the substrate using a CVD method, and the $SiO_2$ film is embedded within the reinforcement portion grooves 140, 141. Thereafter, the $SiO_2$ film additionally formed above an upper end of the reinforcement portion grooves 140, 141 is removed by polishing using a CMP method, and reinforcement insulating films 22a', 22b are formed as shown in FIG. 52A.

Figure 52B:
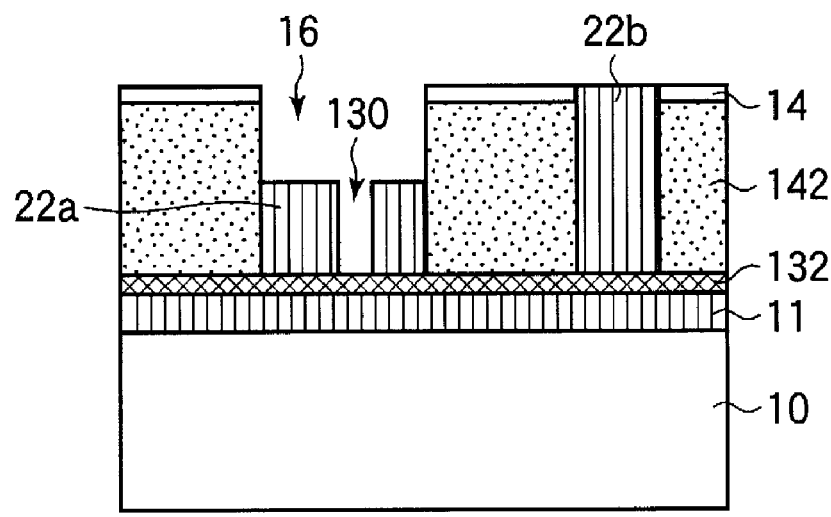

Next, as shown in FIG. 52B, a via hole 130 is formed by a photolithography process and an etching process using a photo mask for forming a via portion. Subsequently, an upper layer portion of the reinforcement insulating film 22a' is removed by a photolithography process and an etching process using a photo mask for forming a wiring, and a wiring groove 16 is formed. Accordingly, the reinforcement insulating film 22a is formed immediately below the wiring groove 16.

Figure 53A:
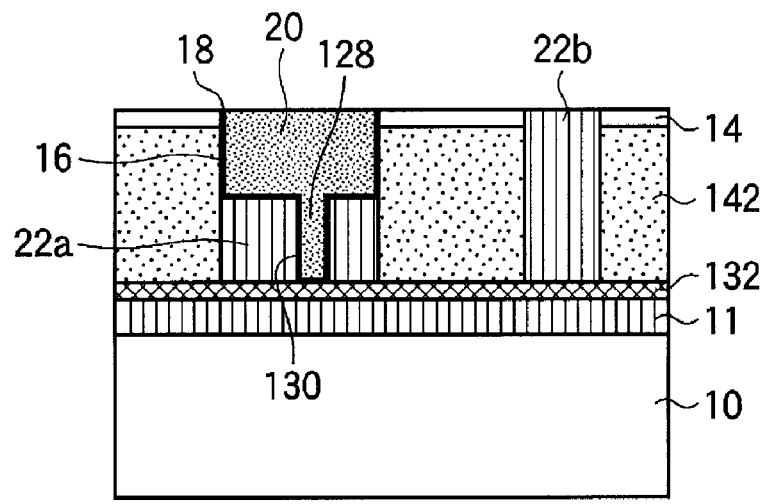
FIGS. 53A and 53B are process cross-sectional views showing the method of manufacturing the semiconductor device according to the example 4 of the embodiment of the present invention.

Next, a Ta film of a film thickness 25 nm serving as a barrier metal layer 18 and a Cu film of a film thickness 50 nm serving as a seed are film-formed in this order on the entire surface. Next, the Cu film is further deposited using a plating method, and the Cu film is embedded within the wiring groove 16 and the via hole 130. Next, the surface is flattened by polishing until the hard mask film 14 is exposed using a CMP method, and the Cu film additionally deposited above an upper end of the wiring groove 16 and the barrier metal layer 18 are removed. Accordingly, as shown in FIG. 53A, a wiring 20 is formed within the wiring groove 16, and a via portion 128 making a connection between the wiring 20 and a wiring of its lower layer (of which an illustration and description are omitted in this example) is formed within the via hole 130.

Figure 53B:
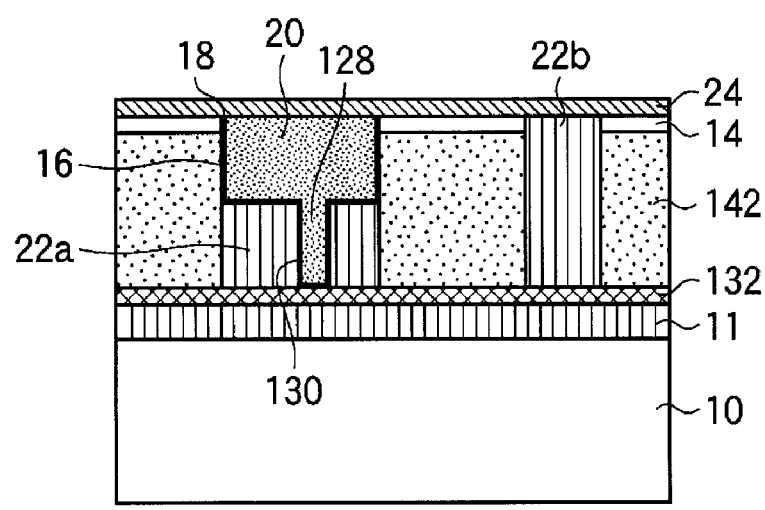

Next, as shown in FIG. 53B, a SiC film of a film thickness 50 nm is film-formed on the entire surface of the substrate using a CVD method and a cap film 24 is formed.

Figure 54:
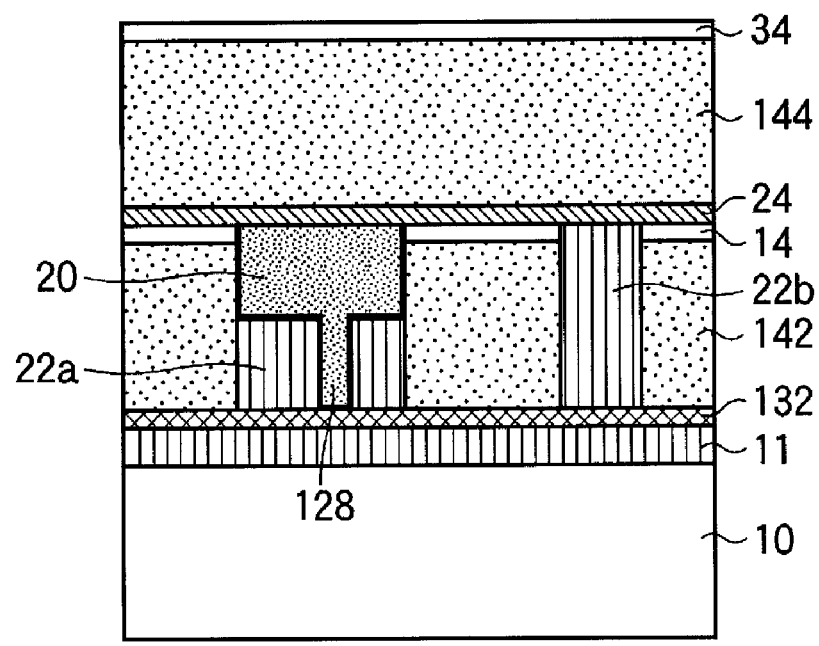
FIG. 54 is a process cross-sectional view showing the method of manufacturing the semiconductor device according to the example 4 of the embodiment of the present invention.

Next, as shown in FIG. 54, an air gap sacrificial film 144 is formed on the entire surface of the substrate. Subsequently, a SiC film of a film thickness 50 nm is formed on the entire surface on the air gap sacrificial film 144, for example, using a CVD method, and a hard mask film 34 is formed.

Figure 55:
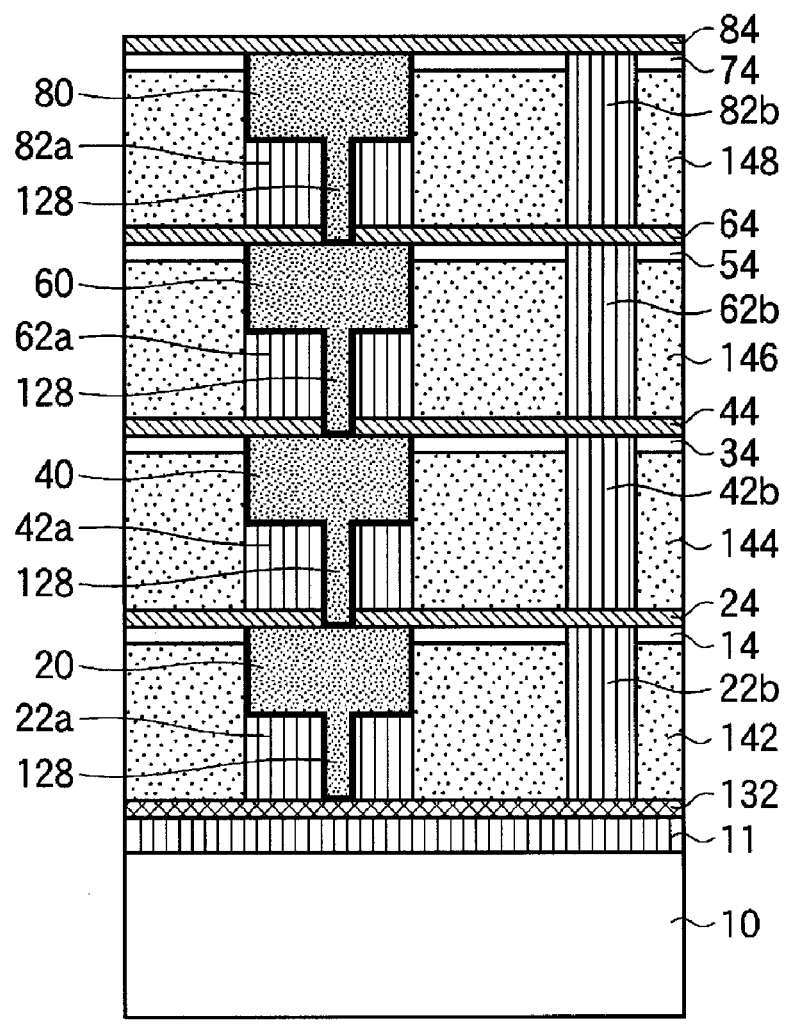
FIG. 55 is a process cross-sectional view showing the method of manufacturing the semiconductor device according to the example 4 of the embodiment of the present invention.

Thereafter, a semiconductor device of a multilayer wiring structure as shown in FIG. 55 is manufactured by repeating the process shown in FIGS. 51B to 54.

Figure 56:
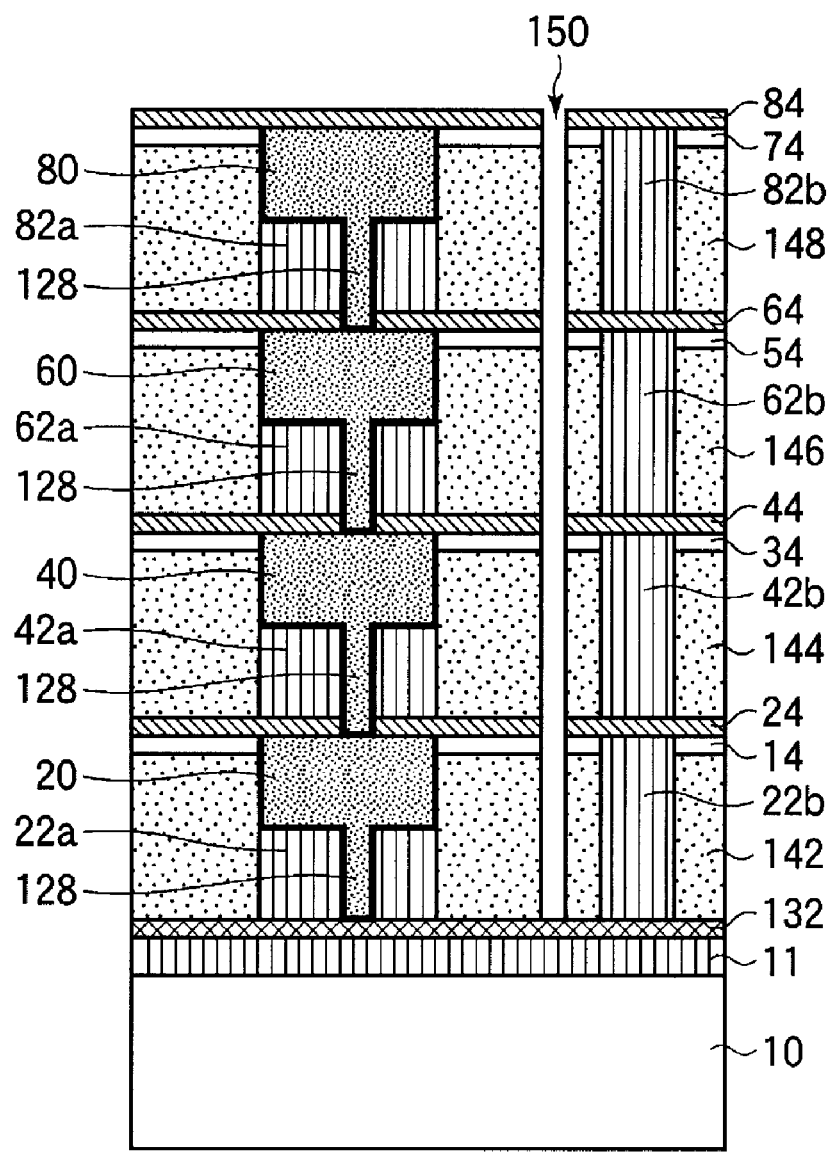
FIG. 56 is a process cross-sectional view showing the method of manufacturing the semiconductor device according to the example 4 of the embodiment of the present invention.

Next, as shown in FIG. 56, cap films 84, 64, 44, 24, hard mask films 74, 54, 34, 14, and air gap sacrificial films 148, 146, 144, 142 are opened by a photolithography process and an etching process, and for example, a degassing hole 150 is formed to pass through a wiring layer of a lowest layer.

Figure 57:
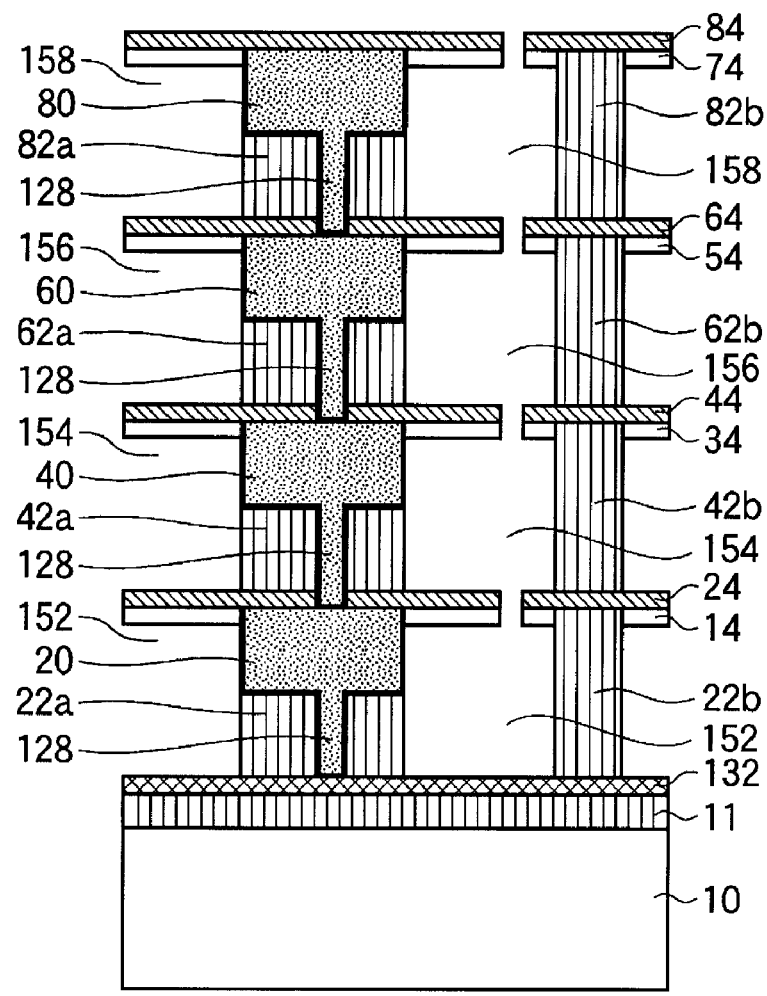
FIG. 57 is a process cross-sectional view showing the method of manufacturing the semiconductor device according to the example 4 of the embodiment of the present invention.

Next, at least a part of the air gap sacrificial films 142, 144, 146, 148 is degassed by performing a heat treatment of 30 minutes in an oxygen-containing atmosphere at 400° C., and gaps 152, 154, 156, 158 are formed as shown in FIG. 57.

Figure 58:
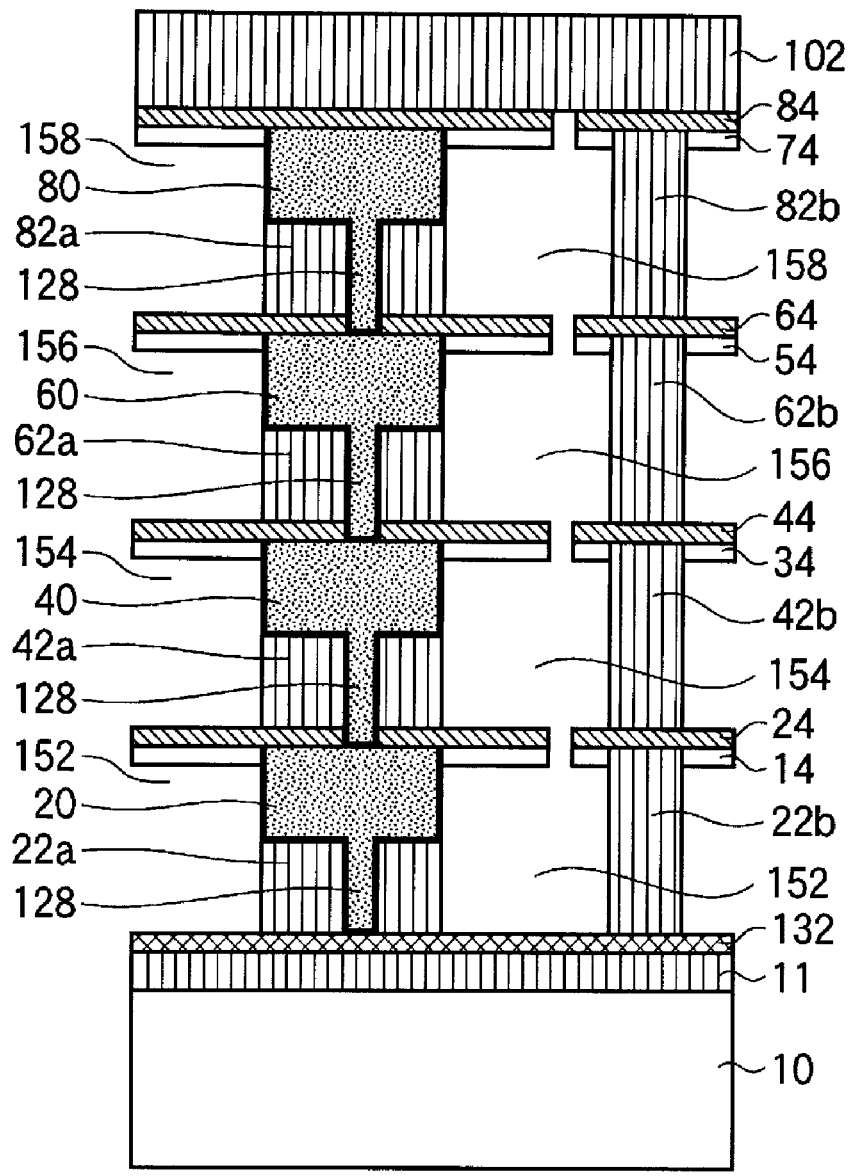
FIG. 58 is a process cross-sectional view showing the method of manufacturing the semiconductor device according to the example 4 of the embodiment of the present invention.
Figure 59:
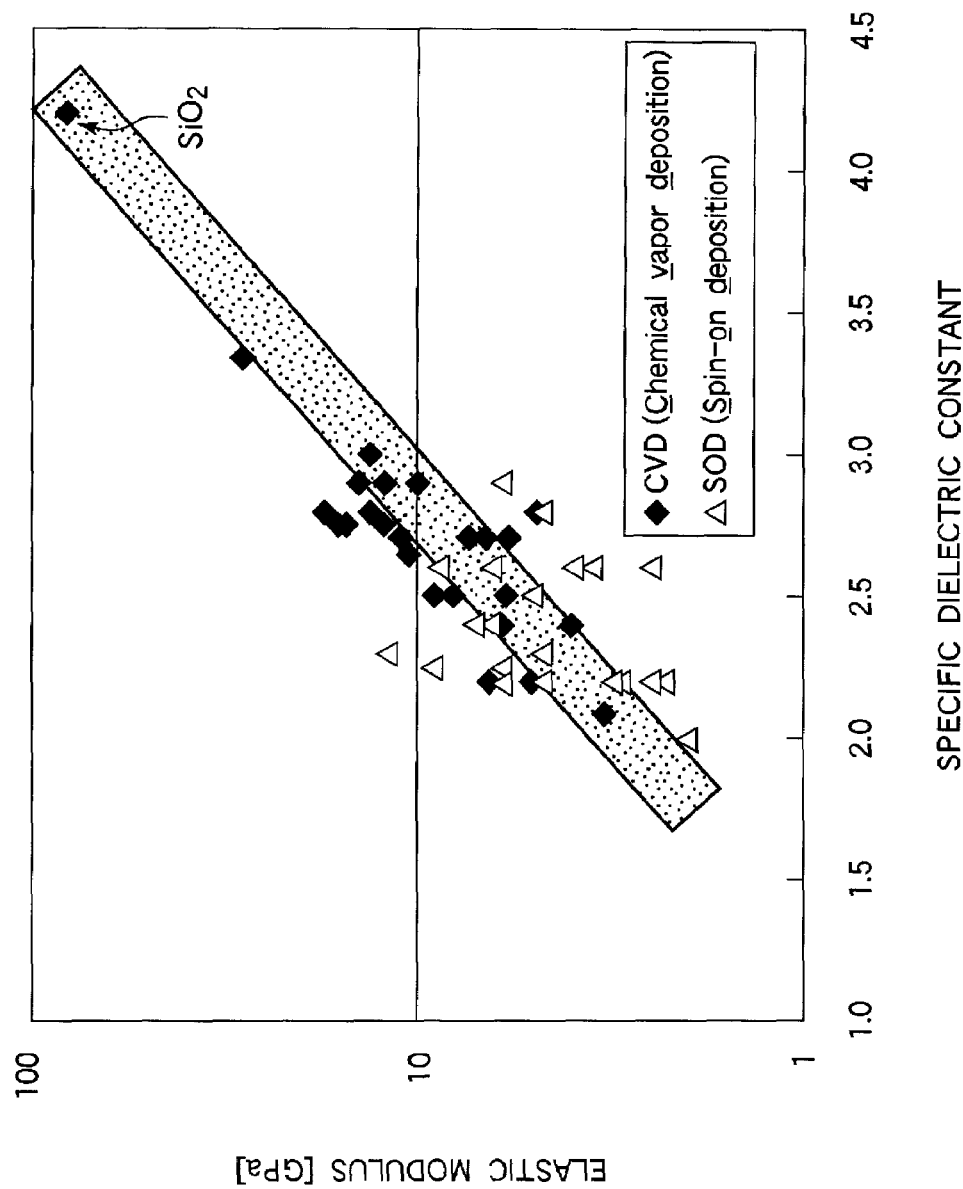
FIG. 59 is a graph showing the relationship of a specific dielectric constant and an elastic modulus of various low dielectric constant films and $SiO_2$ films.

Next, as shown in FIG. 58, a $SiO_2$ film 102 serving as a passivation layer is formed on the entire surface of the substrate on the cap film 84. Through the above processes, a semiconductor device of an air gap structure is manufactured.

In this example, the Sic films including the hard mask films 14, 34, 54, 74 and the cap films 24, 44, 64, 84 are film-formed using a CVD method. A film formation temperature of the SiC film according to the CVD method is conventionally about 400° C., but is set to a lower temperature of 300~350° C. in this example. This is because the easily decomposable resin used as the air gap sacrificial films 142, 144, 146, 148 in this example is a polymer material having a wide molecular weight distribution and starts to be decomposed from a low temperature. This is the same as the case where other resin materials are used for the air gap sacrificial films 142, 144, 146, 148.

Moreover, the easily decomposable resin is used as the air gap sacrificial films 142, 144, 146, 148 in this example, but a carbon thin film deposited by a sputtering method can be used as the air gap sacrificial films 142, 144, 146, 148. In this case, the air gap sacrificial films 142, 144, 146, 148 are oxidized and removed by performing a heat treatment for 60 minutes in an oxidizing atmosphere at 450° C., such that gaps 152, 154, 156, 158 can be formed. It is known that another material usable for the air gap sacrificial films 142, 144, 146, 148 is $GeO_2$ (see Patent Document 3). When $GeO_2$ is used, the air gap sacrificial films 142, 144, 146, 148 can be removed by dissolving in an alkali aqueous solution. Moreover, a method for decomposing and removing the air gap sacrificial films 142, 144, 146, 148 is a UV irradiation, an oxygen plasma treatment, or the like as well as the heat treatment of this example. The heat treatment, the UV irradiation, the plasma treatment, and the like can be used together. When the UV irradiation, the oxygen plasma treatment, or the like is used, the processing time can be shortened. Both the heat treatment and UV irradiation are performed in the oxidizing atmosphere.

In this example, the air gap sacrificial films 142, 144, 146, 148 are formed using the single material. However, when the wirings are formed using a dual damascene method, it can be considered to form the air gap sacrificial films 142, 144, 146, 148 in a two-layer structure using different materials. A process for processing the wiring groove and the via hole is facilitated by forming the air gap sacrificial films 142, 144, 146, 148 in the two-layer structure. In this case, a removal method (of oxidation removal, dissolution removal, decomposition removal, or the like) can be separately used according to the material of each layer of the air gap sacrificial films 142, 144, 146, 148.

Since the mechanical strength of the semiconductor device is reinforced in this embodiment as described above, a mechanically strengthened reinforcement portion formed using a material having a large elastic modulus of $SiO_2$ or the like is provided. The reinforcement portion functions as the structure along with the wiring. Accordingly, the overall mechanical strength of the chip can increase even in the semiconductor device using the low dielectric constant film or the semiconductor device of the air gap structure. Therefore, according to this embodiment, a high performance semiconductor device having a small wiring delay due to the reduction of inter-wiring capacitance can be achieved, and a semiconductor device having the high reliability and the high manufacturing yield in which the occurrence of deformation and wiring disconnection is difficult can be achieved.

Moreover, a large elastic modulus material used in the reinforcement portion of this embodiment generally has the higher thermal conductivity than the low dielectric constant film, and the heat from the Cu wiring is easy to come out of the substrate or chip. For this reason, this embodiment is also advantageous in terms of heat dissipation.

Since the design constraint for applying this embodiment is relatively small, this embodiment can be applied without nearly changing the conventional wiring design.

The present invention is not limited to the above-described embodiment and may be variously modified.

For example, this embodiment includes an example of the semiconductor device of the multilayer wiring structure, but the present invention is not limited thereto and can be applied to a semiconductor device of a single wiring structure.

What is claimed is:

1. A semiconductor device comprising:
   a wiring formed on a substrate;
   an insulating layer formed around the wiring; and
   a reinforcement portion of which at least a part is made of a dielectric material having a larger elastic modulus than that of a formation material of the insulating layer,
   wherein the reinforcement portion includes a first reinforcement layer arranged to overlap with the wiring when viewed perpendicularly to a substrate surface and having the substantially same planar shape as the wiring;
   the first reinforcement layer is formed in an area in which the insulating layer is partially removed and has a thickness smaller than that of the insulating layer; and
   the wiring is formed within a wiring groove formed on the first reinforcement layer by a difference in the thickness between the first reinforcement layer and the insulating layer.

2. The semiconductor device according to claim 1, wherein the first reinforcement layer is arranged substantially immediately below the wiring.

3. The semiconductor device according to claim 1, wherein the first reinforcement layer is arranged substantially immediately above the wiring.

4. The semiconductor device according to claim 1, wherein the reinforcement portion includes a second reinforcement layer arranged without overlapping with the wiring when viewed perpendicularly to a substrate surface.

5. The semiconductor device according to claim 4, wherein at least a part of the second reinforcement layer is formed on the same layer as the first reinforcement layer.

6. The semiconductor device according to claim 4, wherein a part of the second reinforcement layer is formed on the same layer as that of the wiring.

7. The semiconductor device according to claim 4, wherein the second reinforcement layer extends to intersect with the first reinforcement layer within the same surface.

8. The semiconductor device according to claim 4, wherein the second reinforcement layer is arranged to overlap with a bonding pad or a ball grid when viewed perpendicularly to a substrate surface.

9. The semiconductor device according to claim 1, wherein a formation material of the reinforcement portion includes $SiO_2$, $SiO_xC_y$, $SiC_x$, $SiN_x$, or a combination thereof.

10. The semiconductor device according to claim 1, wherein the insulating layer is a low dielectric constant film or an air gap.

* * * * *